(12) United States Patent
Huang et al.

(10) Patent No.: US 11,862,654 B2
(45) Date of Patent: Jan. 2, 2024

(54) TRENCH ISOLATION STRUCTURE FOR IMAGE SENSORS

(71) Applicant: Taiwan Semiconductor Manufacturing Co., Ltd., Hsin-Chu (TW)

(72) Inventors: Cheng Yu Huang, Hsinchu (TW); Chun-Hao Chuang, Hsinchu (TW); Keng-Yu Chou, Kaohsiung (TW); Wei-Chieh Chiang, Yuanlin Township (TW); Chin-Chia Kuo, Tainan (TW); Wen-Hau Wu, New Taipei (TW); Hua-Mao Chen, Tainan (TW); Chih-Kung Chang, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 85 days.

(21) Appl. No.: 17/150,014

(22) Filed: Jan. 15, 2021

(65) Prior Publication Data
US 2022/0231066 A1  Jul. 21, 2022

(51) Int. Cl.
*H01L 27/146* (2006.01)

(52) U.S. Cl.
CPC .. *H01L 27/14632* (2013.01); *H01L 27/14687* (2013.01); *H01L 27/14643* (2013.01)

(58) Field of Classification Search
CPC ......... H01L 27/14632; H01L 27/14687; H01L 27/14643; H01L 27/14603; H01L 27/1463; H01L 27/14634; H01L 27/1464
See application file for complete search history.

(56) References Cited

U.S. PATENT DOCUMENTS

2009/0200625 A1  8/2009 Venezia et al.
2013/0323875 A1*  12/2013 Park ............... H01L 31/022408
                                                          438/70

(Continued)

FOREIGN PATENT DOCUMENTS

KR        20200019832 A      2/2020

*Primary Examiner* — Kenneth Parker
*Assistant Examiner* — John Lin
(74) *Attorney, Agent, or Firm* — Eschweiler & Potashnik, LLC

(57) ABSTRACT

Various embodiments of the present disclosure are directed towards an image sensor, and a method for forming the image sensor, in which an inter-pixel trench isolation structure is defined by a low-transmission layer. In some embodiments, the image sensor comprises an array of pixels and the inter-pixel trench isolation structure. The array of pixels is on a substrate, and the pixels of the array comprise individual photodetectors in the substrate. The inter-pixel trench isolation structure is in the substrate. Further, the inter-pixel trench isolation structure extends along boundaries of the pixels, and individually surrounds the photodetectors, to separate the photodetectors from each other. The inter-pixel trench isolation structure is defined by a low-transmission layer with low transmission for incident radiation, such that the inter-pixel trench isolation structure has low transmission for incident radiation. The low-transmission layer may, for example, be or comprise metal and/or some other suitable material(s).

20 Claims, 39 Drawing Sheets

(56) References Cited

U.S. PATENT DOCUMENTS

| | | |
|---|---|---|
| 2014/0054662 A1 | 2/2014 | Yanagita et al. |
| 2017/0078539 A1* | 3/2017 | Madurawe ........ H01L 27/14629 |
| 2019/0067357 A1 | 2/2019 | Cheng et al. |
| 2019/0131339 A1* | 5/2019 | Chiang ............. H01L 27/14621 |
| 2020/0058684 A1* | 2/2020 | Wu ................... H01L 27/14607 |
| 2020/0075653 A1* | 3/2020 | Seki .................. H01L 27/14627 |
| 2020/0111821 A1 | 4/2020 | Hong et al. |
| 2020/0219910 A1* | 7/2020 | Shim ................. H01L 27/14609 |
| 2021/0366956 A1 | 11/2021 | Wu et al. |

* cited by examiner

TRENCH ISOLATION STRUCTURE FOR IMAGE SENSORS

BACKGROUND

Integrated circuits (IC) with image sensors are used in a wide range of modern-day electronic devices, such as, for example, cameras and cell phones. In recent years, complementary metal-oxide-semiconductor (CMOS) image sensors have begun to see widespread use, largely replacing charge-coupled devices (CCD) image sensors. Compared to CCD image sensors, CMOS image sensors are increasingly favored due to low power consumption, small size, fast data processing, direct output of data, and low manufacturing cost. Some types of CMOS image sensors include front side illuminated (FSI) image sensors and back side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
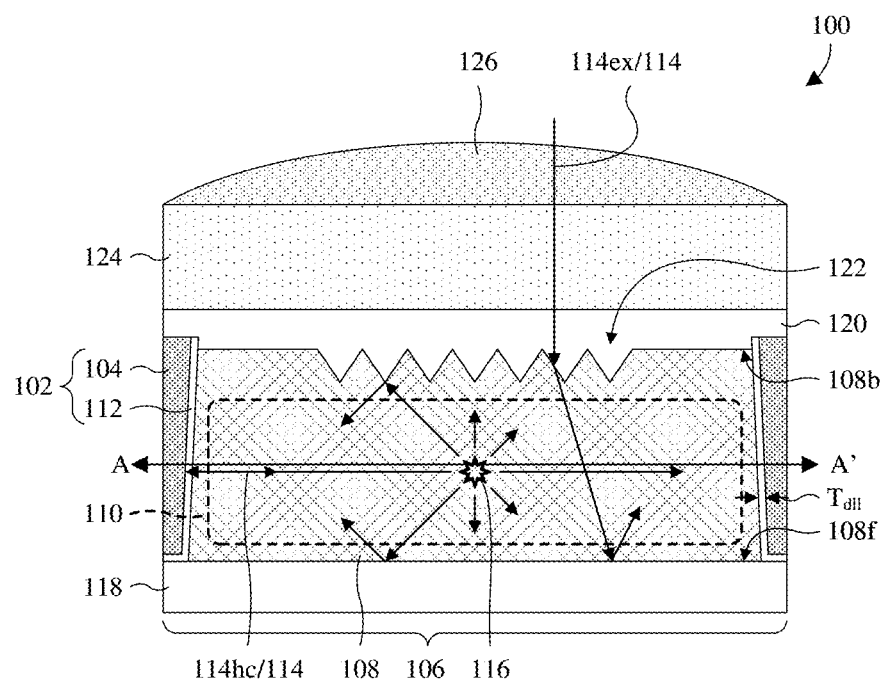
FIG. 1 illustrates a cross-sectional view of some embodiments of an image sensor comprising an inter-pixel trench isolation structure defined in part by a low-transmission layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors comprise an array of pixels and an inter-pixel trench isolation structure. The array is on a substrate, and the pixels comprise individual photodetectors in the substrate. The inter-pixel trench isolation structure extends into the substrate and individually surrounds the photodetectors along boundaries of the pixels to separate the photodetectors from each other. Often, the inter-pixel trench isolation structure is a dielectric material with a refractive index less than that of the substrate to promote total internal reflection (TIR) at sidewall interfaces at which the inter-pixel trench isolation structure and the substrate directly contact. For example, the inter-pixel trench isolation structure may be silicon dioxide, whereas the substrate may be silicon. Other suitable materials are, however, amenable.

TIR at the sidewall interfaces reflects incident radiation that would otherwise pass between the photodetectors. Hence, the inter-pixel trench isolation structure may reduce crosstalk and may improve performance of the photodetectors by TIR. Further, TIR at the sidewall interfaces may reflect incident radiation back towards photodetectors at which the radiation was received. Hence, the inter-pixel trench isolation structure may provide the photodetectors additional opportunities for absorption of the radiation and may further improve performance of the photodetectors. However, TIR depends upon radiation impinging on the sidewall interfaces at angles greater than the so-called critical angle. For example, the critical angle may be about 20 degrees when the inter-pixel trench isolation structure and the substrate are respectively silicon dioxide and silicon. Hence, radiation imping on the sidewall interfaces at angles less than the critical angle may pass between the photodetectors and increase crosstalk.

Some photodetectors operate in a reverse biased state with a high bias voltage and hence have a strong electric field across corresponding depletion regions. Such photodetectors may, for example, include avalanche photodiodes (APDs), single-photon avalanche diodes (SPADs), and other suitable types of photodetectors. Because of the strong electric field, hot-carrier luminescence may occur. Hot-carrier luminescence is non-directional and emits radiation in any direction. As a result, radiation from hot-carrier luminescence may impinge on the sidewall interfaces at angles less than the critical angle and may hence pass between photodetectors. This may increase crosstalk and may hence degrade performance of the photodetectors.

Various embodiments of the present disclosure are directed towards an image sensor, and a method for forming the image sensor, in which an inter-pixel trench isolation structure is defined wholly or partially by a low-transmission layer. In some embodiments, an image sensor comprises an array of pixels and the inter-pixel trench isolation structure. The array of pixels is on a substrate, and the pixels of the array comprise individual photodetectors in the substrate. The inter-pixel trench isolation structure is in the substrate and, as noted above, is defined wholly or partially by the low-transmission layer. Further, the inter-pixel trench isolation structure extends along boundaries of the pixels, and individually surrounds the photodetectors, to separate the photodetectors from each other. The low-transmission layer has low transmission for incident radiation, such that the inter-pixel trench isolation structure has low transmission for incident radiation. Further, the low-transmission layer has low transmission due to intrinsic properties of material making up the low-transmission layer and does not depend upon TR for low transmission. Hence, the low-transmission layer blocks radiation regardless of the angle of incidence. The low-transmission layer may, for example, be or comprise metal, a conductive ceramic, some other suitable material(s), or any combination of the foregoing.

Because the inter-pixel trench isolation structure individually surrounds the photodetectors to separate the photodetectors from each other, the inter-pixel trench isolation structure receives radiation traveling between photodetectors. Because the inter-pixel trench isolation structure has low transmission, the inter-pixel trench isolation structure blocks the radiation from traveling between the photodetectors and hence reduces crosstalk. The reduced crosstalk, in turn, increases signal-to-noise ratios (SNRs) of the photodetectors and other suitable performance metrics of the photodetectors. Because the low-transmission layer has low transmission due to intrinsic properties of the material making up the low-transmission layer and does not depend upon TIR, the low-transmission layer is able to efficiency block radiation from hot carrier luminescence regardless of angle of incidence.

With reference to FIG. 1, a cross-sectional view 100 of some embodiments of an image sensor is provided in which an inter-pixel trench isolation structure 102 is defined in part by a low-transmission layer 104 and separates a pixel 106 from neighboring pixels (not shown) in a substrate 108. The substrate 108 accommodates a photodetector 110 individual to the pixel 106 and is a semiconductor. The substrate 108 may, for example, be or comprise monocrystalline silicon and/or some other suitable semiconductor material(s).

The inter-pixel trench isolation structure 102 extends into a back side 108b of the substrate 108 at a boundary of the pixel 106. Further, the inter-pixel trench isolation structure 102 comprises a pair of inter-pixel isolation segments respectively on opposite sides of the pixel 106. In some embodiments, the inter-pixel trench isolation structure 102 extends in a closed path along the boundary of the pixel 106 when viewed top down. In some embodiments, the inter-pixel trench isolation structure 102 is also known as an outer trench isolation structure.

The low-transmission layer 104 is separated from the substrate 108 by a dielectric liner layer 112 and, in some embodiments, defines a bulk of the inter-pixel trench isolation structure 102. The dielectric liner layer 112 further defines the inter-pixel trench isolation structure 102 and electrically isolates the low-transmission layer 104 from the substrate 108. The dielectric liner layer 112 may, for example, be or comprise silicon oxide and/or some other suitable dielectric(s).

The low-transmission layer 104 has a low transmission for radiation 114, such that the inter-pixel trench isolation structure 102 also has a low transmission for radiation 114. Because of the low transmission, the inter-pixel trench isolation structure 102 blocks radiation 114 passing from the pixel 106 to the neighboring pixels, or vice versa, and hence reduces crosstalk between the pixel 106 and the neighboring pixels. By reducing crosstalk, SNR and other suitable performance metrics of the photodetector 110 may be enhanced. Because the low transmission layer 104 blocks radiation 114 from passing between pixels, the low-transmission layer 104 may also be known as an optical barrier layer.

In some embodiments, the low transmission is transmission less than about 1%, 5%, 10%, or some other suitable percentage of radiation 114. In some embodiments, the low-transmission layer 104 is opaque to radiation 114. In some embodiments, the low transmission is low compared to that of the dielectric liner layer 112 and/or that of silicon oxide. If transmission is too high (e.g., greater than about 10% or some other suitable percentage), crosstalk may be high and performance of the photodetector 110 may be low.

The low-transmission layer 104 further has a high reflectance for radiation 114, such that the inter-pixel trench isolation structure 102 has a high reflectance for radiation 114. Because of the high reflectance, the inter-pixel trench isolation structure 102 may reflect radiation 114 back towards the photodetector 110. This provides the photodetector 110 with another opportunity to absorb the radiation 114, which improves quantum efficiency (QE), SNR, and other suitable performance metrics of the photodetector 110.

The high reflectance may, for example, be reflectance greater than about 80%, 90%, 95%, or some other suitable percentage of radiation 114. If reflectance is too low (e.g., less than about 80% or some other suitable percentage), QE, SNR, and other suitable performance metrics of the photodetector 110 may be low.

The low transmission of the low-transmission layer 104 and the high reflectance of the low-transmission layer 104 are due to intrinsic properties of material making up the low-transmission layer 104 and do not depend upon TIR. In some embodiments, the low-transmission layer 104 is metal and/or some other suitable conductive material(s). The metal may, for example, be or include copper, aluminum, silver, some other suitable metal(s), or any combination of the foregoing. In alternative embodiments, the low-transmission layer 104 is a dielectric and/or some other suitable material(s). In at least some embodiments in which the low-transmission layer 104 is dielectric, the dielectric liner layer 112 may be omitted.

In some embodiments, the photodetector 110 operates in a reverse biased state at a high voltage. For example, the photodetector 110 may be an APD, a SPAD, or some other suitable type of photodetector. The high voltage may, for example, be a voltage greater than about 100 volts, 200 volts, 1000 volts, 1500 volts, or some other suitable value. Further, the high voltage may, for example, be a voltage of about 100-200 volts, about 200-1000 volts, about 1000-1500 volts, about 1500-2000 volts, or some other suitable value.

Because the photodetector 110 may operate at the high voltage, the photodetector 110 may be prone to hot carrier luminescence 116 (schematically illustrated by a star). Hot carrier luminescence 116 may emit hot carrier radiation 114hc in any direction, which makes it difficult to efficiently block the hot carrier radiation 114hc by TIR. As noted above, TIR depends upon the angle of incidence exceeding a so-called critical angle. In some embodiments, the hot carrier radiation 114hc has a wavelength of about 900-1000 nanometers, about 900-950 nanometers, about 950-1000 nanometers, or some other suitable wavelength.

Because the inter-pixel trench isolation structure 102 has the low transmission and does not depend upon TIR for the low transmission, the inter-pixel trench isolation structure 102 may block the hot carrier radiation 114hc regardless of the angle of incidence. As a result, the inter-pixel trench isolation structure 102 may efficiently reduce crosstalk from hot carrier luminescence 116. Further, because the inter-pixel trench isolation structure 102 has the high reflectance and does not depend upon TIR for the high reflectance, the inter-pixel trench isolation structure 102 may reflect the hot carrier radiation 114hc regardless of angle of incidence.

In some embodiments, the dielectric liner layer 112 has a high transmission. The high transmission may, for example, be transmission greater than 90%, 95%, 99%, or some other suitable percentage of incident radiation. In some embodiments, the dielectric liner layer 112 is transparent to radiation 114. If transmission is too low (e.g., less than about 90% or some other suitable percentage), the dielectric liner layer 112 may prevent too much radiation 114 from impinging on the low-transmission layer 104 and being reflected. As a result, QE and other suitable performance metrics of the photodetector 110 may be low.

In some embodiments, a thickness $T_{dll}$ of the dielectric liner layer 112 is small so the dielectric liner layer 112 has the high transmission. The thickness $T_{dll}$ may, for example, be small when less than about 100 nanometers, about 50 nanometers, about 10 nanometers, or some other suitable value. Further, the thickness $T_{dll}$ may, for example, be small when about 10-100 nanometers, about 10-55 nanometers, about 55-100 nanometers, about 20 nanometers, or some other suitable value. If the thickness $T_{dll}$ is too large (e.g., greater than about 100 nanometers or some other suitable value), the dielectric liner layer 112 may prevent too much radiation 114 from impinging on the low-transmission layer 104. If the thickness $T_{dll}$ is too small (e.g., less than about 10 nanometers or some other suitable value), the dielectric liner layer 112 may fail to provide electrical isolation between the low-transmission layer 104 and the substrate 108.

In some embodiments, the dielectric liner layer 112 has a higher refractive index than the substrate 108. This may promote TIR at sidewall interfaces at which the dielectric liner layer 112 and the substrate 108 directly contact. However, TIR may be redundant because the low-transmission layer 108 has the high reflectance.

In some embodiments, the dielectric liner layer 112 further serves as a diffusion barrier for material of the low-transmission layer 104 to prevent diffusion into the substrate 108. For example, the low-transmission layer 104 may be or comprise copper and the dielectric liner layer 112 may be or comprise aluminum oxide (e.g., $Al_2O_3$) or some other suitable material. Depending upon the material of the low-transmission layer 104, the material may shift operating parameters of the photodetector 110 out of specification if allowed to diffuse to the substrate 108.

With continued reference to FIG. 1, a front side dielectric structure 118 underlies the substrate 108 and covers a front side 108f of the substrate 108. The front side dielectric layer 118 has a higher refractive index than the substrate 108 at the front side 108f of the substrate 108 to promote TIR at the front side 108f. As a result, radiation 114 that passes through the photodetector 110 may be reflected back to the photodetector 110, thereby giving the photodetector 110 another opportunity to absorb the radiation 114. This may, in turn, improve QE and other suitable performance metrics of the photodetector 110. The front side dielectric structure 118 may, for example, be or comprise silicon oxide and/or some other suitable dielectric(s).

As seen hereafter, the front side dielectric structure 118 may wholly or partially accommodate an interconnect structure (not shown) in some embodiments. The interconnect structure comprises a plurality of wires, a plurality of vias, and a plurality of contacts that are alternatingly stacked and define conductive paths leading from the photodetector 110. The conductive paths may, for example, electrically coupling the photodetector 110 to readout circuitry and/or other suitable imaging circuitry.

A back side dielectric structure 120 covers the back side 108b of the substrate 108 and defines a diffuser 122 with the substrate 108. The diffuser 122 overlies the photodetector 110 and has a periodic pattern at the back side 108b of the substrate 108. The periodic pattern of the diffuser 122 serves to scatter external radiation 114ex received at the back side 108b of the substrate 108. For example, the diffuser 122 may scatter external radiation 114ex to increase an angle of incidence of the external radiation 114ex at the front side 108f of the substrate 108 to increase TIR at the front side 108f. This may, in turn, further improve QE and other suitable performance metrics of the photodetector 110. The back side dielectric structure 120 may, for example, be or comprise silicon oxide and/or some other suitable dielectric(s).

In some embodiments, the back side dielectric structure 120 is the same material as the dielectric liner layer 112 and/or is integrated with the dielectric liner layer 112. Further, in some embodiments, the back side dielectric layer 120 has a higher refractive index than the substrate 108 at the back side 108b of the substrate 108 to promote TIR at the back side 108b. As a result, radiation 114 may be reflected back to the photodetector 110 by TIR, thereby giving the photodetector 110 another opportunity to absorb the radiation 114. This may, in turn, improve QE and other suitable performance metrics of the photodetector 110.

A spacer layer 124 overlies the back side dielectric structure 120, and a micro lens 126 overlies the spacer layer 124. In alternative embodiments, the spacer layer 124 is replaced with a color filter. The spacer layer 124 spaces the micro lens 126 from the photodetector 110 and may, for example, be or comprise silicon oxide and/or some other suitable dielectrics. The micro lens 126 focuses external radiation 114ex on the photodetector 110.

Figure 2:
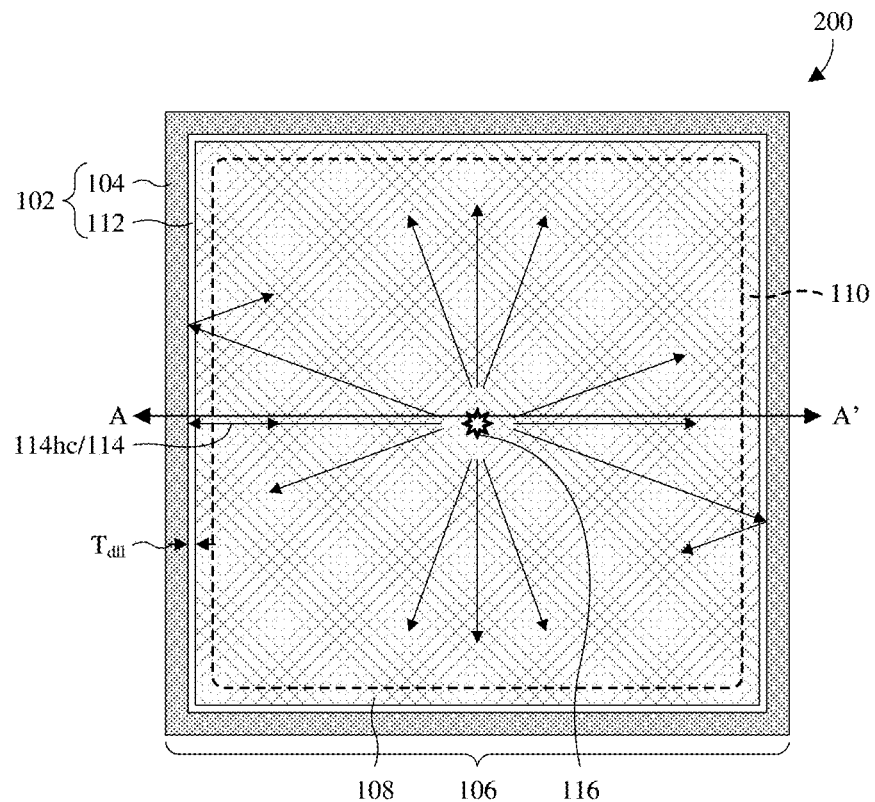
FIG. 2 illustrates a top layout view of some embodiments of the image sensor of FIG. 1.

With reference to FIG. 2, a top layout view 200 of some embodiments of the image sensor of FIG. 1 is provided. FIG. 2 may, for example, be taken along line A-A' in FIG. 1 and/or FIG. 1 may, for example, be taken along line A-A' in FIG. 2. The dielectric liner layer 112 and the low-transmission layer 104 each extend along the boundary of the pixel in closed paths to surround the photodetector 110. The low-transmission layer 104 has low transmission so as to reduce crosstalk. Further, the low-transmission layer 104 has high reflectance so as to reflect radiation 114 back to the photodetector 110. The reduced crosstalk increases SNR and other suitable performance metrics of the photodetector 110, whereas the high reflectance increases QE and other suitable performance metrics of the photodetector 110.

Figure 3A:
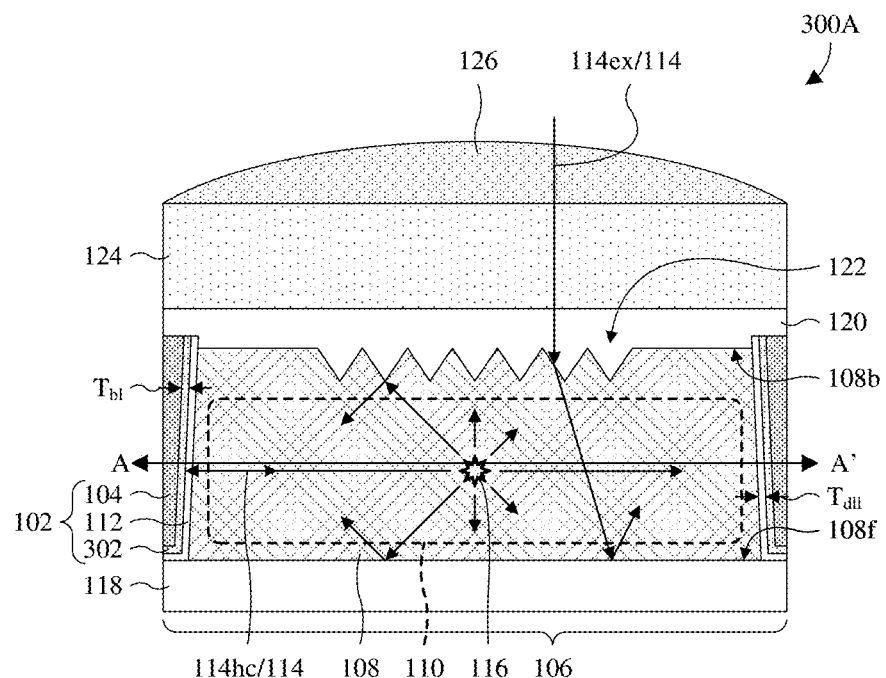
FIGS. 3A and 3B illustrate cross-sectional views of some alternative embodiments of the image sensor of FIG. 1 in which the image sensor comprises additional features.

With reference to FIG. 3A, a cross-sectional view 300A of some alternative embodiments of the image sensor of FIG. 1 is provided in which the inter-pixel trench isolation structure 102 is further defined by a barrier layer 302. The barrier layer 302 is a different material than the dielectric liner layer 112 and is a diffusion barrier for material of the low-transmission layer 104 to prevent the material from diffusing into the substrate 108. For example, the low-transmission layer 104 may be or comprise copper, the barrier layer 302 may be or comprise aluminum oxide (e.g., $Al_2O_3$), and the dielectric liner layer 112 may be or comprise silicon oxide. Other suitable materials are, however, amenable. Depending upon the material of the low-transmission layer 104, the material may shift operating parameters of the photodetector 110 out of specification and/or degrade performance of the photodetector 110 if allowed to diffuse.

In some embodiments, the barrier layer 302 is dielectric and hence provides additional electrical isolation between the low-transmission layer 104 and the substrate 108. In alternative embodiments, the barrier layer 302 is conductive.

In some embodiments, the barrier layer 302 has a high transmission. The high transmission may, for example, be transmission greater than 90%, 95%, 99%, or some other suitable percentage of radiation 114. In some embodiments, the barrier layer 302 is transparent to radiation 114. If transmission is too low (e.g., less than about 90% or some other suitable percentage), the barrier layer 302 may prevent too much radiation 114 from impinging on the low-transmission layer 104 and being reflected. As a result, QE and other suitable performance metrics of the photodetector 110 may be low.

In some embodiments, a thickness $T_{bl}$ of the barrier layer 302 is small so the barrier layer 302 has the high transmission. The thickness $T_{bl}$ may, for example, be small when less than about 100 nanometers, about 50 nanometers, about 10 nanometers, or some other suitable value. Further, the thickness $T_{bl}$ may, for example, be small when about 10-100 nanometers, about 10-55 nanometers, about 55-100 nanometers, about 20 nanometers, or some other suitable value. If the thickness $T_{bl}$ is too large (e.g., greater than about 100 nanometers or some other suitable value), the thickness $T_{bl}$ may prevent too much radiation 114 from impinging on the low-transmission layer 104 and being reflected by the low-transmission layer 104. If the thickness $T_{bl}$ is too small (e.g., less than about 10 nanometers or some other suitable value), the barrier layer 302 may fail to serve as a diffusion barrier for material of the low-transmission layer 104.

Figure 3B:
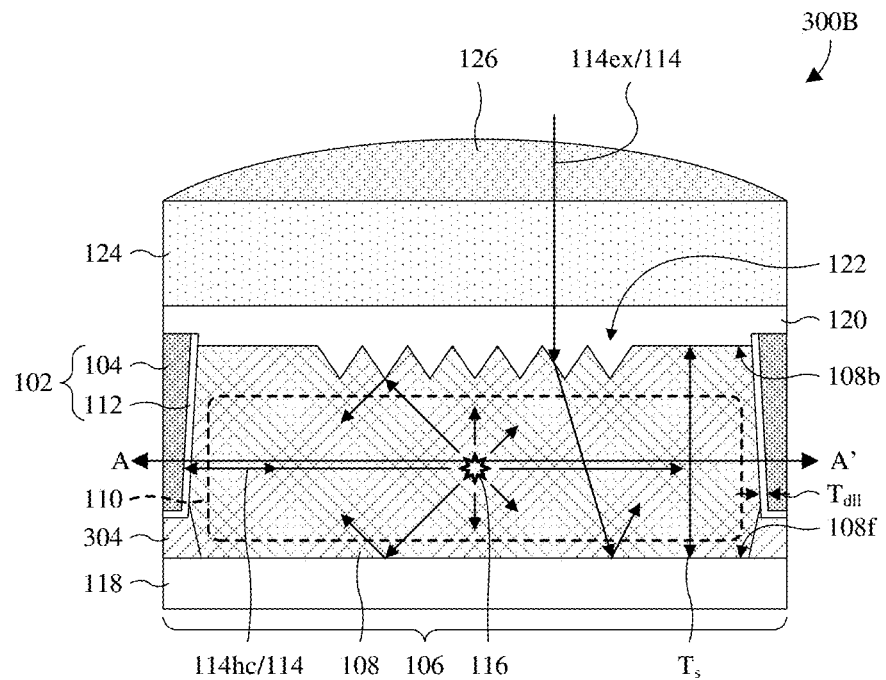

With reference to FIG. 3B, a cross-sectional view 300B of some alternative embodiments of the image sensor of FIG. 1 is provided in which an additional inter-pixel trench isolation structure 304 separates the pixel 106 from neighboring pixels (not shown). The additional inter-pixel trench isolation structure 304 extends into the front side 108f of the substrate 108 at the boundary of the pixel 106 and directly contacts the inter-pixel trench isolation structure 102 within the substrate 108. Further, the additional inter-pixel trench isolation structure 304 comprises a pair of additional inter-pixel isolation segments respectively on opposite sides of the pixel 106. In some embodiments, the additional inter-pixel trench isolation structure 304 extends in a closed path along the boundary of the pixel 106 when viewed top down.

The additional inter-pixel trench isolation structure 304 comprises a dielectric material having a higher refractive index than the substrate 108 so as to promote TIR at sidewall interfaces at which the additional inter-pixel trench isolation structure 304 and the substrate 108 directly contact. By promoting TIR at the sidewall interfaces, radiation 114 may be reflected back towards the photodetector 110 to reduce crosstalk and improve QE, SNR, and other suitable performance metrics. The additional inter-pixel trench isolation structure 304 may, for example, be or comprise silicon oxide and/or some other suitable dielectric(s).

Because the additional inter-pixel trench isolation structure 304 and the inter-pixel trench isolation structure 102 extend into opposite sides of the substrate 108 and directly contact within the substrate 108, the additional inter-pixel trench isolation structure 304 define a composite structure extending through the substrate 108. The composite structure may provide enhanced inter-pixel isolation and crosstalk reduction when a thickness $T_s$ of the substrate 108 is too great for the additional inter-pixel trench isolation structure 304 and the inter-pixel trench isolation structure 102 to individually extend through the substrate 108.

Figure 4A:
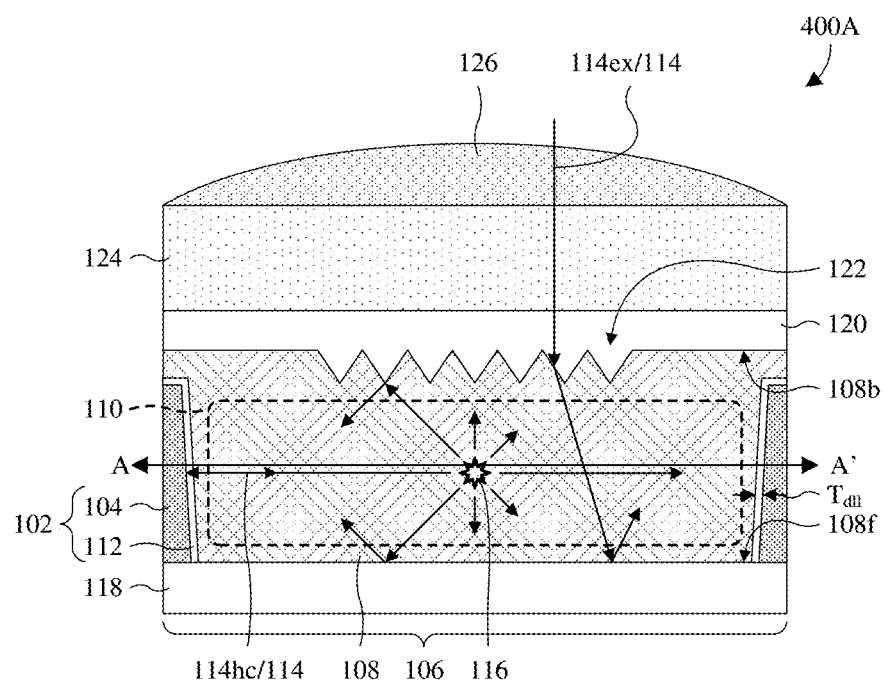
FIGS. 4A and 4B illustrate cross-sectional views of some alternative embodiments of the image sensor of FIG. 1 in which constituents of the image sensor are varied.
Figure 4B:
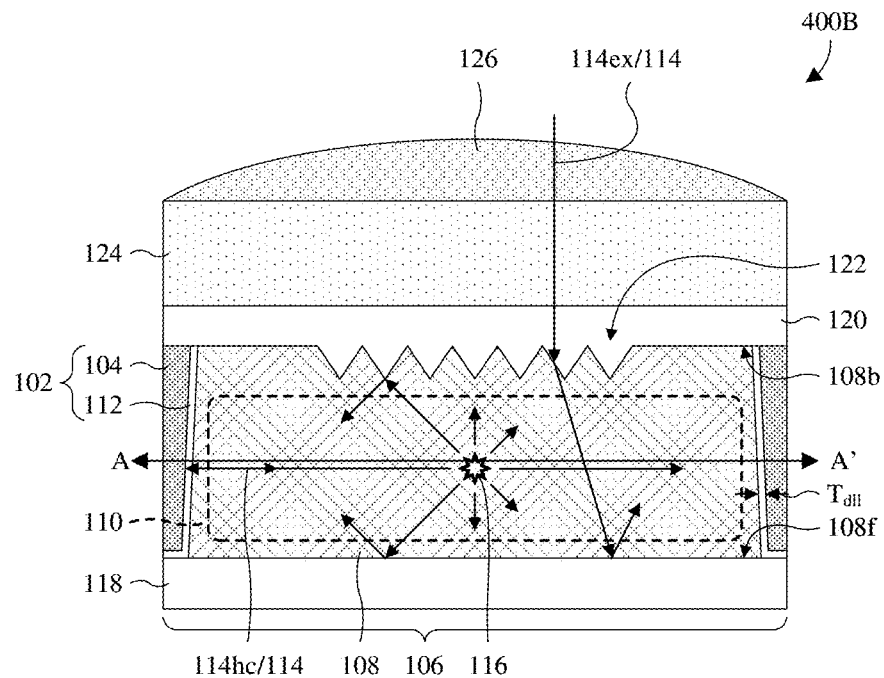

With reference to FIGS. 4A and 4B, cross-sectional views 400A, 400B of some alternative embodiments of the image sensor of FIG. 1 are provided in which constituents of the image sensor are varied. In FIG. 4A, the inter-pixel trench isolation structure 102 extends partially through the substrate 108 from the front side 108f of the substrate 108. In alternative embodiments, the inter-pixel trench isolation structure 102 extends fully through the substrate 108. In FIG. 4B, a top surface of the low-transmission layer 104 is about even with that of the substrate 108.

Figure 5A:
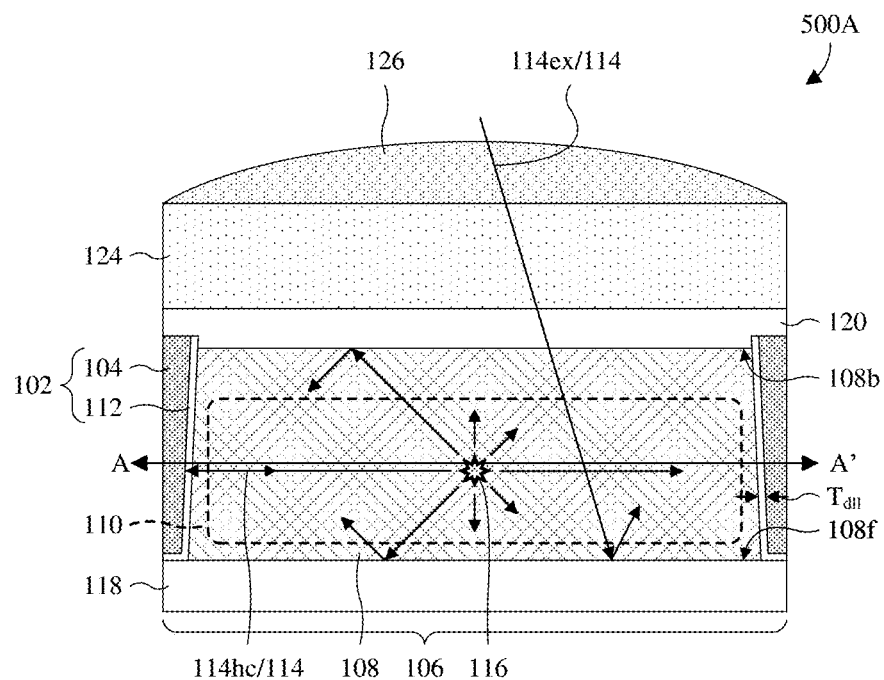
FIGS. 5A and 5B illustrate cross-sectional views of some alternative embodiments of the image sensor of FIG. 1 in which constituents of the image sensor are omitted.
Figure 5B:
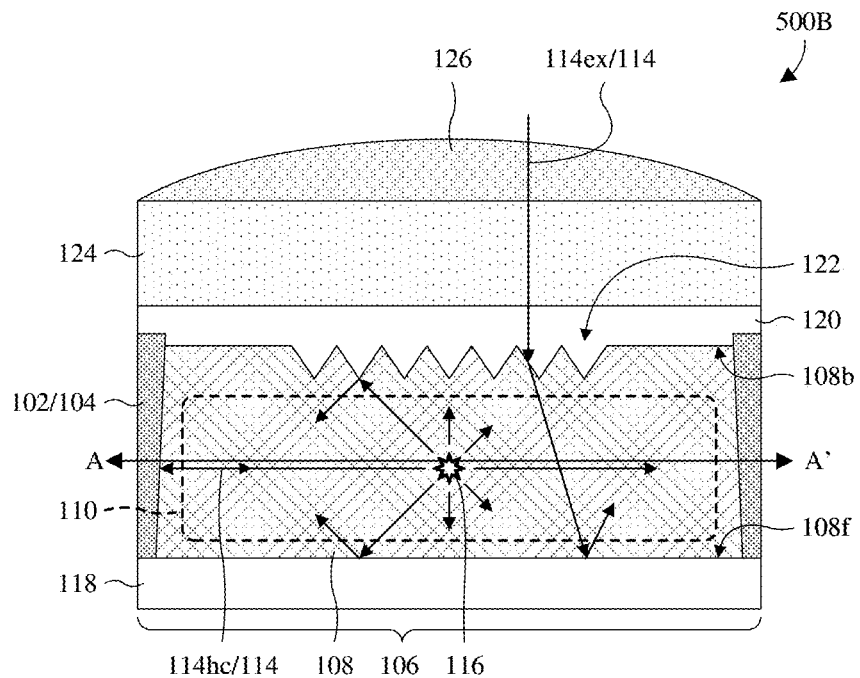

With reference to FIGS. 5A and 5B, cross-sectional views 500A and 500B of some alternative embodiments of the image sensor of FIG. 1 are provided in which constituents of the image sensor are omitted. In FIG. 5A, the diffuser 122 is omitted. As such, an interface between the substrate 108 and the back side dielectric structure 120 is flat from a first side of the pixel 106 to a second side of the pixel 106 opposite the first side. In FIG. 5B, the dielectric liner layer 112 is omitted. The dielectric liner layer 112 may, for example, be omitted at least when the low-transmission layer 104 is a dielectric having low transmission.

While FIG. 2 is described with regard to FIG. 1, it is to be appreciated that FIG. 2 is applicable to any of FIGS. 3A, 3B, 4A, 4B, and 5 in alternative embodiments. Hence, any of FIGS. 3A, 3B, 4A, 4B, and 5 may be taken along line A-A' in FIG. 2. Further, FIG. 2 may be taken along line A-A' in any of FIGS. 3A, 3B, 4A, 4B, and 5. In alternative embodiments in which FIG. 2 is applied to FIG. 3A, FIG. 2 further comprises the barrier layer 302 extending in a closed path around the photodetector 110 along a boundary of the pixel 106.

Figure 6:
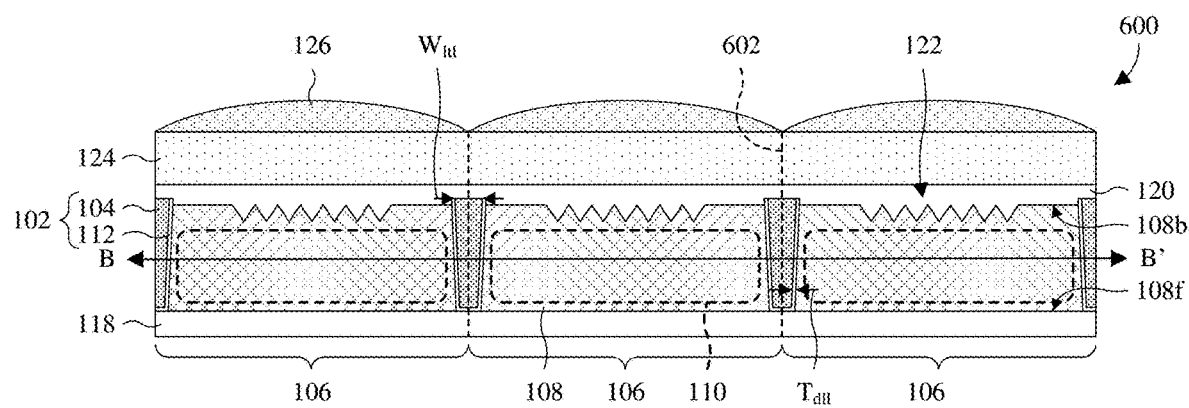
FIG. 6 illustrates a cross-sectional view of some embodiments of the image sensor of FIG. 1 in which the image sensor comprises multiple pixels.

With reference to FIG. 6, a cross-sectional view 600 of some embodiments of the image sensor of FIG. 1 is provided in which the image sensor comprises multiple pixels 106. The pixels 106 are each as their counterpart is illustrated and described at FIG. 1. Further, the pixels 106 share the inter-pixel trench isolation structure 102. For clarity, boundaries 602 between the pixels 106 are demarcated by dashed lines.

In some embodiments, a width $W_{ltl}$ of the low-transmission layer 104 is greater than about 100 nanometers, about 200 nanometers, about 500 nanometers, or some other suitable value. Further, in some embodiments, the width $W_{ltl}$ is about 100-200 nanometers, about 200-500 nanometers, or some other suitable value. If the width $W_{ltl}$ is too small (e.g., less than about 100 nanometers or some other suitable value), the low-transmission layer 104 and the inter-pixel trench isolation structure 102 may have high transmission and hence crosstalk may be high. If the width $W_{ltl}$ is too large (e.g., greater than about 500 nanometers or some other suitable value), the size of the photodetectors 110 may be small and/or the pixels 106 may be large. The former leads to low QE of the photodetectors 110, whereas the latter leads to low pixel density.

In some embodiments, a ratio between the width $W_{ltl}$ and the thickness $T_{dll}$ is about 5:1 to 20:1, about 5:1 to 10:1, about 10:1 to 15:1, about 15:1 to 20:1, or some other suitable values. If the ratio is too high (e.g., greater than about 20:1 or some other suitable value), the thickness $T_{dll}$ may be too small and/or the width $W_{ltl}$ may be too large. If the thickness $T_{dll}$ is too small, the dielectric liner layer 112 may provide poor electrical isolation between the low-transmission layer 104 and the substrate 108. If the ratio is too low (e.g., less than about 5:1 or some other suitable value), the thickness $T_{dll}$ may be too large and/or the width Wits may be too small. If the thickness $T_{dll}$ is too small, the dielectric liner layer 112 may prevent too much radiation 114 from impinging on the low-transmission layer 104.

While FIG. 6 illustrates an image sensor comprising multiple pixels 106 each configured as the pixel 106 in FIG. 1, the pixels 106 of FIG. 6 may each be configured as the pixel 106 in any of FIGS. 3A, 3B, 4A, 4B, and 5 in alternative embodiments.

Figure 7:
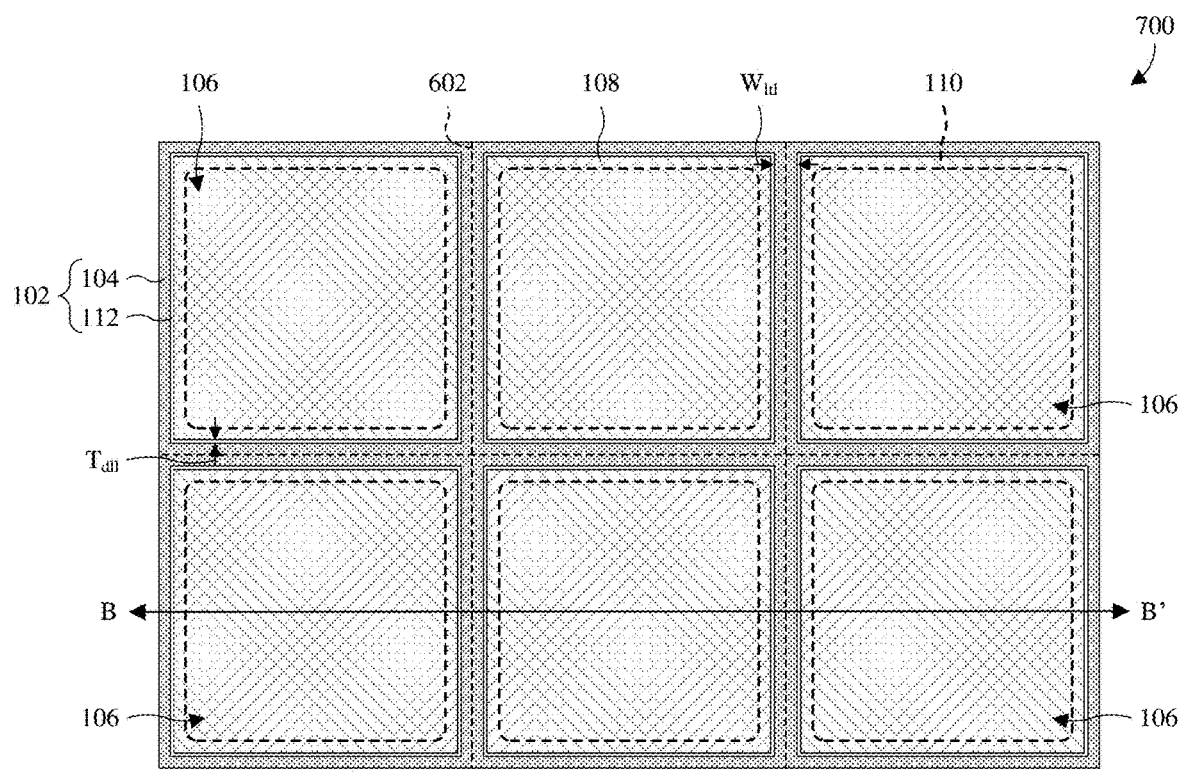
FIG. 7 illustrates a top layout view of some embodiments of the image sensor of FIG. 6.

With reference to FIG. 7, a top layout view 700 of some embodiments of the image sensor of FIG. 6 is provided. FIG. 7 may, for example, be taken along line B-B' in FIG. 6 and/or FIG. 6 may, for example, be taken along line B-B' in FIG. 7. The low-transmission layer 104 is continuous and individually surrounds the pixels 106 along boundaries 602 of the pixels 106 to separate the pixels 106 from each other and to reduce crosstalk. The dielectric liner layer 112 comprise a plurality of ring-shaped segments. The ring-shaped segments are individual to the pixels 106 and each extends in a closed path along the boundary of the individual pixel. While not visible within the top layout view 700, the ring-shaped segments may be interconnected through portions of the dielectric liner layer 112 underlying the low-transmission layer 104.

Figure 8:
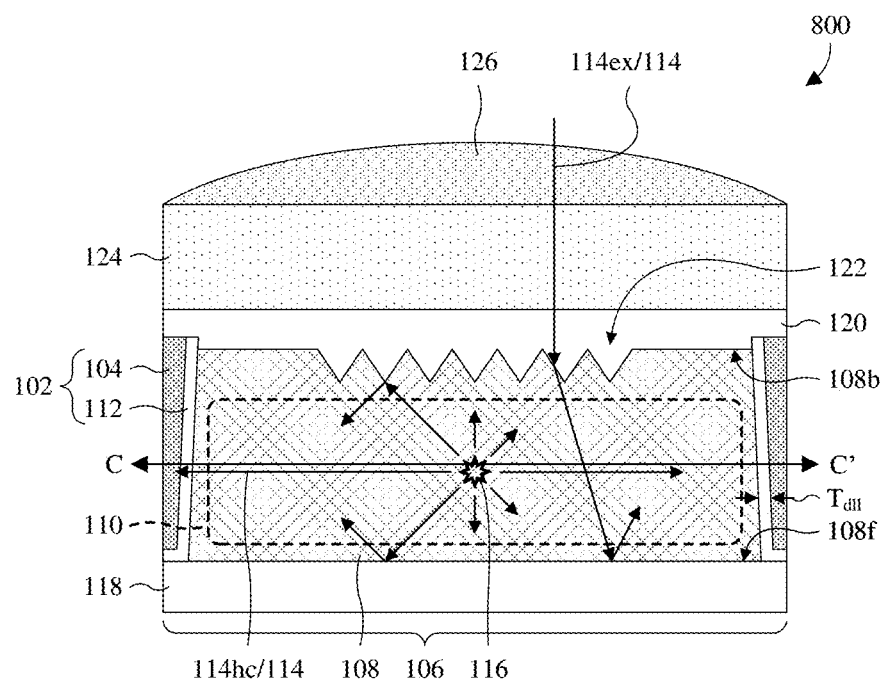
FIG. 8 illustrates a cross-sectional view of some alternative embodiments of the image sensor of FIG. 1 in which the low-transmission layer has high absorption.

With reference to FIG. 8, a cross-sectional view 800 of some alternative embodiments of the image sensor of FIG. 1 is provided in which the low-transmission layer 104 has high absorption instead of high reflection. As a result, radiation 114 is mostly absorbed, instead of reflected, by the low-transmission layer 104 when it impinges on the low-transmission layer 104. The high absorption may, for example, be absorption greater than about 80%, 90%, or 95%. Other suitable percentages are, however, amenable.

Because the low-transmission layer 104 has high absorption and low transmission, the low-transmission layer 104 and hence the inter-pixel trench isolation structure 102 prevent crosstalk. However, if the low-transmission layer 104 absorbed most radiation incident on the inter-pixel trench isolation structure 102, QE losses would be high and hence QE would be poor. Therefore, the dielectric liner layer 112 is configured to promote TIR at sidewall interfaces at which the dielectric liner layer 112 and the substrate 108 directly contact. TIR reflects most radiation, and the low-transmission layer 104 absorbs radiation that isn't reflected, so QE losses and crosstalk are both low. Note that in the preceding embodiments, TIR at the sidewall interfaces was redundant because the low-transmission layer 104 had high reflectance.

To promote TIR at the sidewall interfaces, the dielectric liner layer 112 has a higher refractive index than the substrate 108. For example, the dielectric liner layer 112 may be or comprise silicon oxide, whereas the substrate 108 may be or comprise silicon. Other suitable materials are, however, amenable. Additionally, the dielectric liner layer 112 has a thickness $T_{dll}$ to increase TIR and minimize QE losses. Generally, the larger the thickness $T_{dll}$, the greater the TIR at the sidewall interfaces and hence the less the QE losses. The thickness $T_{dll}$ may, for example, be greater than about 100 nanometers, about 200 nanometers, about 500 nanometers, or some other suitable value. Further, the thickness $T_{dll}$ may, for example, be about 100-200 nanometers, about 200 nanometers, about 200-500 nanometers, or some other suitable value.

If the thickness $T_{dll}$ is too small (e.g., less than about 100 nanometers or some other suitable value), TIR at the sidewall interfaces may be low and QE losses may be high. Hence, QE and other suitable performance metrics of the photodetector 110 may be low. If the thickness $T_{dll}$ is too large (e.g., greater than about 500 nanometers or some other suitable value), the size of the photodetector 110 may be small and/or the pixel 106 may be large. The former leads to low QE of the photodetectors 110, whereas the latter leads to low pixel density.

The low transmission of the low-transmission layer 104 and the high absorption of the low-transmission layer 104 are due to intrinsic properties of material making up the low-transmission layer 104 and do not depend upon TIR. In some embodiments, the low-transmission layer 104 is metal, a conductive ceramic, some other suitable conductive material(s), or any combination of the foregoing. The metal may, for example, be or comprise tungsten and/or some other suitable metal(s). The conductive ceramic may, for example, be or comprise titanium nitride, tantalum nitride, some other suitable conductive ceramic(s), or any combination of the foregoing. In alternative embodiments, the low-transmission layer 104 is a dielectric and/or some other suitable material(s). In at least some embodiments in which the low-transmission layer 104 is dielectric, the dielectric liner layer 112 may be omitted.

Figure 9:
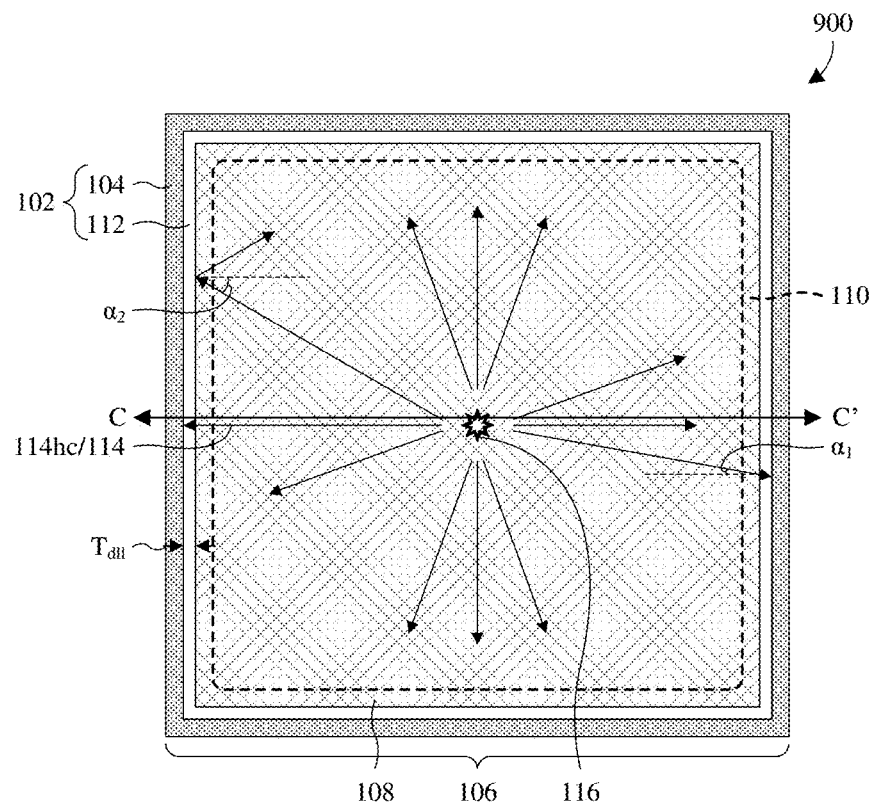
FIG. 9 illustrates a top layout view of some embodiments of the image sensor of FIG. 8.

With reference to FIG. 9, a top layout view 900 of some embodiments of the image sensor of FIG. 8 is provided. FIG. 9 may, for example, be taken along line C-C' in FIG. 8 and/or FIG. 8 may, for example, be taken along line C-C' in FIG. 9. Radiation 114 that impinges on sidewall interfaces of the dielectric liner layer 112 at an angle (e.g., $\alpha_1$) less than a critical angle for TIR passes through the dielectric liner layer 112 and is absorbed by the low-transmission layer 104. On the other hand, radiation 114 that impinges on the sidewall interfaces of the dielectric liner layer 112 at an angle (e.g., $\alpha_1$) greater than the critical angle for TIR is reflected by TIR. In at least some embodiments in which the substrate 108 is or comprise silicon and the dielectric liner layer 112 is or comprises silicon oxide, the critical angle is about 20 degrees. Other suitable materials and/or critical angles are, however, amenable.

Figure 10:
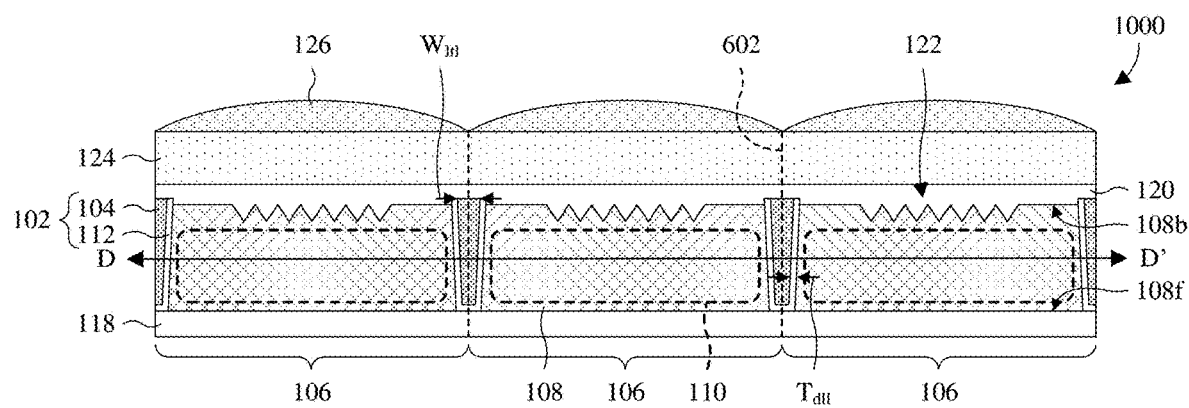
FIG. 10 illustrates a cross-sectional view of some embodiments of the image sensor of FIG. 8 in which the image sensor comprises multiple pixels.

With reference to FIG. 10, a cross-sectional view 1000 of some embodiments of the image sensor of FIG. 8 is provided in which the image sensor comprises multiple pixels 106. The pixels 106 are each as their counterpart is illustrated and described at FIG. 8 Further, the pixels 106 share the inter-pixel trench isolation structure 102. For clarity, boundaries 602 between the pixels 106 are demarcated by dashed lines.

In some embodiments, a ratio between the width $W_{ltl}$ of the low-transmission layer 104 and the thickness $T_{dll}$ of the dielectric liner layer 112 is about 1:1 to 5:1, about 1:1 to 2.5:1, about 2.5:1 to 5:1, or some other suitable values. If the ratio is too high (e.g., greater than about 5:1 or some other suitable value), the thickness $T_{dll}$ may be too small and/or the width $W_{ltl}$ may be too large. If the thickness $T_{dll}$ is too small, TIR at the sidewall interfaces may be low and QE losses may be high. If the width $W_{ltl}$ is too large, the photodetectors 110 may be too small and/or the pixels 106 may be too large. The former leads to low QE and the latter leads to low pixel density. If the ratio is too low (e.g., less than about 1:1 or some other suitable value), the thickness $T_{dll}$ may be too large and/or the width $W_{ltl}$ may be too small. If the thickness $T_{dll}$ is too large, the photodetectors 110 may be too small and/or the pixels 106 may be too large as above. If the width $W_{ltl}$ is too small, the low-transmission layer 104 may be too thin to absorb radiation 114.

Figure 11:
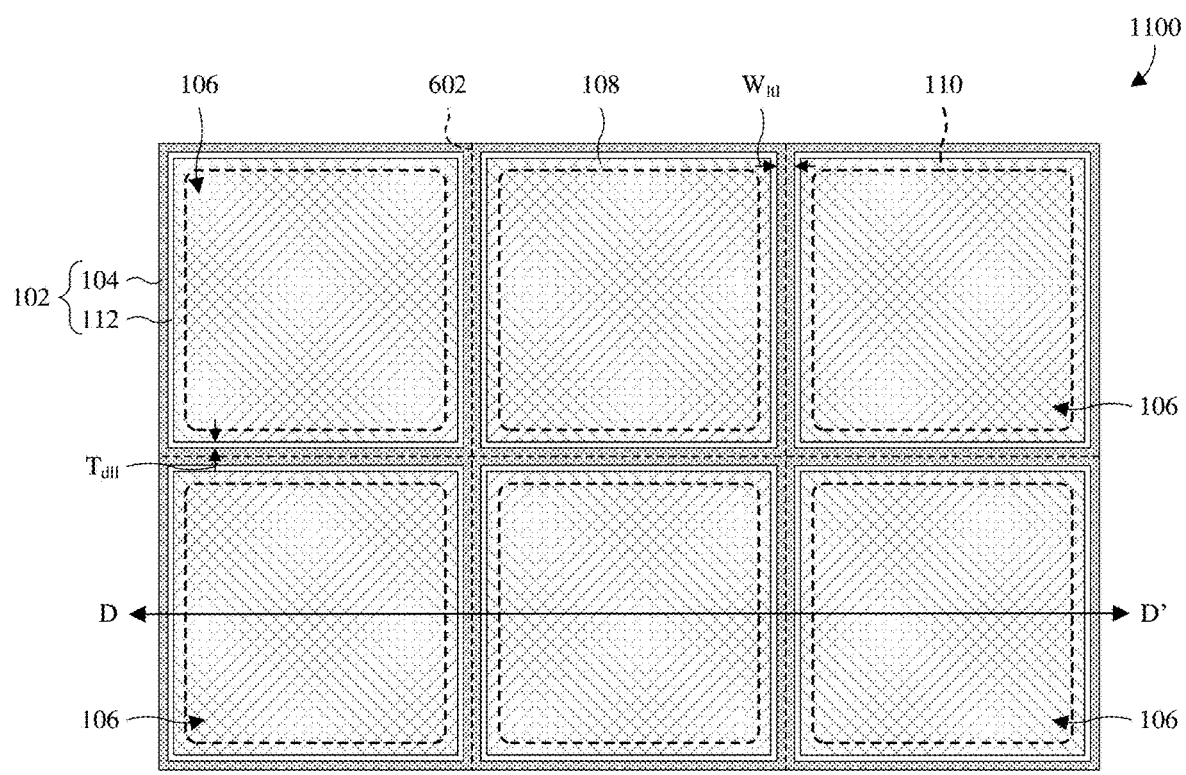
FIG. 11 illustrates a top layout view of some embodiments of the image sensor of FIG. 10.

With reference to FIG. 11, a top layout view 1100 of some embodiments of the image sensor of FIG. 10 is provided. FIG. 11 may, for example, be taken along line D-D' in FIG. 10 and/or FIG. 10 may, for example, be taken along line D-D' in FIG. 11.

Figure 12:
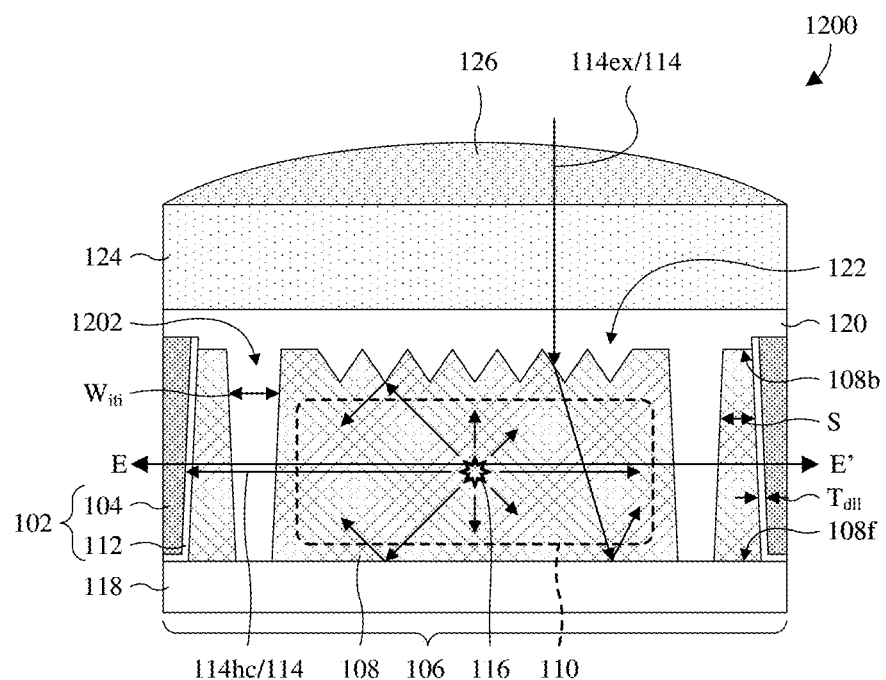
FIG. 12 illustrates a cross-sectional view of some alternative embodiments of the image sensor of FIG. 1 in which the low-transmission layer has high absorption and the image sensor further comprises an intra-pixel trench isolation structure.

With reference to FIG. 12, a cross-sectional view 1200 of some alternative embodiments of the image sensor of FIG. 1 is provided in which the low-transmission layer 104 has high absorption, instead of high reflection, as described at FIG. 8. Because the low-transmission layer 104 has high absorption and low transmission, the low-transmission layer 104 prevents crosstalk. However, if the low-transmission layer 104 absorbed most radiation directed across pixel boundaries, QE losses would be high and hence QE would be poor. Therefore, the image sensor further comprises an intra-pixel trench isolation structure 1202.

The intra-pixel trench isolation structure 1202 is surrounded by the inter-pixel trench isolation structure 102 and extends into the back side 108b of the substrate 108. Further, the intra-pixel trench isolation structure 1202 comprises a pair of intra-pixel isolation segments respectively on opposite sides of the pixel 106 and between which the photodetector 110 is sandwiched. In some embodiments, the intra-pixel trench isolation structure 1202 extends in a closed path around the photodetector 110 when viewed top down. In some embodiments, the intra-pixel trench isolation structure 1202 is also known as an inner trench isolation structure. The intra-pixel trench isolation structure 1202 is configured to promote TIR at sidewall interfaces at which the intra-pixel trench isolation structure 1202 and the substrate 108 directly contact. TIR reflects most radiation in route to the inter-pixel trench isolation structure 102, and the low-transmission layer 104 absorbs radiation that is not reflected by TIR, so QE losses and crosstalk are both low.

To promote TIR, the intra-pixel trench isolation structure 1202 has a higher refractive index than the substrate 108. For example, the intra-pixel trench isolation structure 1202 may be or comprise silicon oxide, whereas the substrate 108 may be or comprise silicon. Other suitable materials are, however, amenable. Additionally, the intra-pixel trench isolation structure 1202 has a width $W_{iti}$ to increase TIR and minimize QE losses. The width $W_{iti}$ may, for example, be greater than about 100 nanometers, about 200 nanometers, about 500 nanometers, or some other suitable value. Further, the width $W_{iti}$ may, for example, be about 100-200 nanometers, about 200 nanometers, about 200-500 nanometers, or some other suitable value.

If the width $W_{iti}$ is too small (e.g., less than about 100 nanometers or some other suitable value), TIR at the sidewall interfaces may be low and QE losses may be high. Hence, QE and other suitable performance metrics of the photodetector 110 may be low. If the width $W_{iti}$ is too large (e.g., greater than about 500 nanometers or some other suitable value), the size of the photodetector 110 may be small and/or the pixel may be large. The former leads to low QE and the latter leads to low pixel density.

In some embodiments, the intra-pixel trench isolation structure 1202 is defined by the back side dielectric structure 120. In alternative embodiments, the intra-pixel trench isolation structure 1202 is independent of the back side dielectric structure 120. In some embodiments, the intra-pixel trench isolation structure 1202 is spaced from the inter-pixel trench isolation structure 102 by a spacing S that is about 10-100 nanometers, about 10-55 nanometers, about 55-100 nanometers, or some other suitable value. The intra-pixel trench isolation structure 1202 may, for example, be or comprise silicon oxide and/or some other suitable dielectric(s).

Figure 13A:
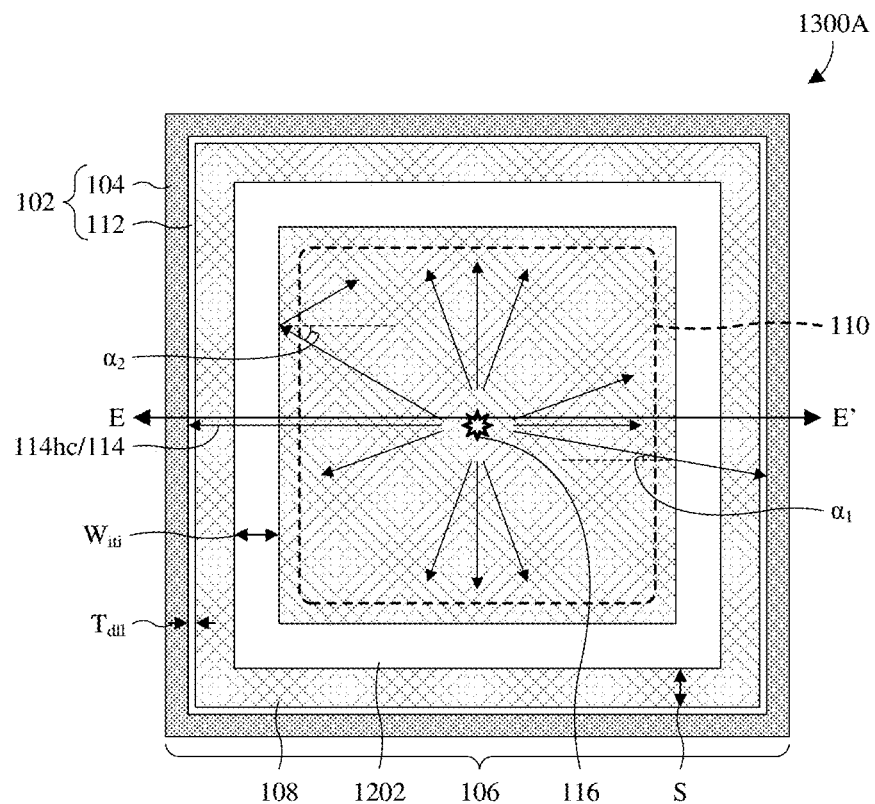
FIGS. 13A-13C illustrate top layout views of some embodiments of the image sensor of FIG. 12.
Figure 13B:
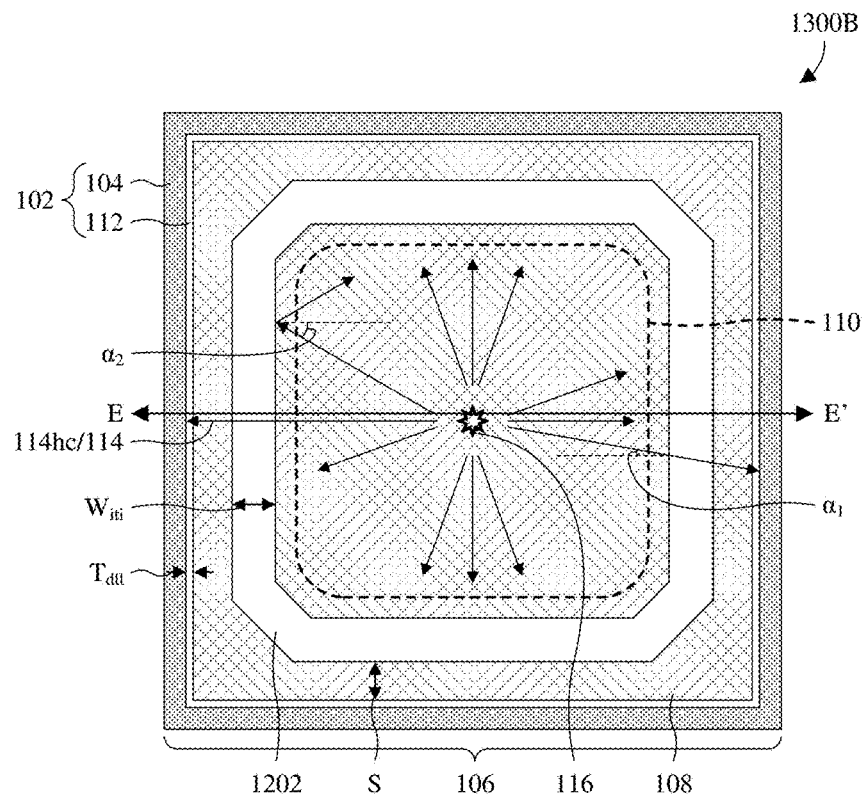
Figure 13C:
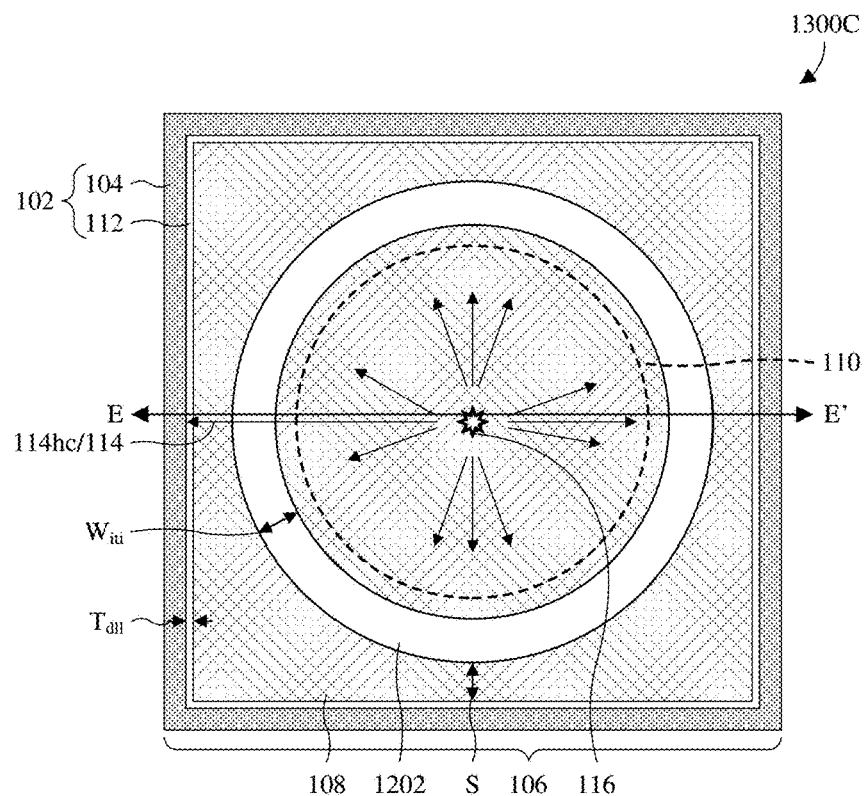

With reference to FIGS. 13A-13C, top layout views 1300A-1300C of some embodiments of the image sensor of FIG. 12 are provided. FIGS. 13A-13C are alternative embodiments of each other and may, for example, be taken along line E-E' in FIG. 12. Further, FIG. 12 may, for example, be taken along line E-E' in any of FIGS. 13A-13C.

The dielectric liner layer 112 and the low-transmission layer 104 each extend along the boundary of the pixel 106 in closed paths to surround the photodetector 110. The intra-pixel trench isolation structure 1202 is surrounded by the dielectric liner layer 112 and the low-transmission layer 104. Further, the intra-pixel trench isolation structure 1202 extends in a closed path around the photodetector 110. Radiation 114 that impinges on of the intra-pixel trench isolation structure 1202 at an angle (e.g., $\alpha_1$ in FIGS. 13A and 13B) less than a critical angle for TIR passes through the intra-pixel trench isolation structure 1202 and is absorbed by the low-transmission layer 104. Radiation 114 that impinges on the intra-pixel trench isolation structure 1202 at an angle (e.g., $\alpha_2$ in FIGS. 13A and 13B) greater than the critical angle for TIR is reflected by TIR.

In FIG. 13A, the intra-pixel trench isolation structure 1202 is square ring shaped with square corners. In FIG. 13B, the intra-pixel trench isolation structure 1202 is square ring shaped with chamfered corners. In FIG. 13C, the intra-pixel trench isolation structure 1202 is circular ring shaped. In alternative embodiments, the intra-pixel trench isolation structure 1202 has other suitable layouts and/or the corners.

Figure 14A:
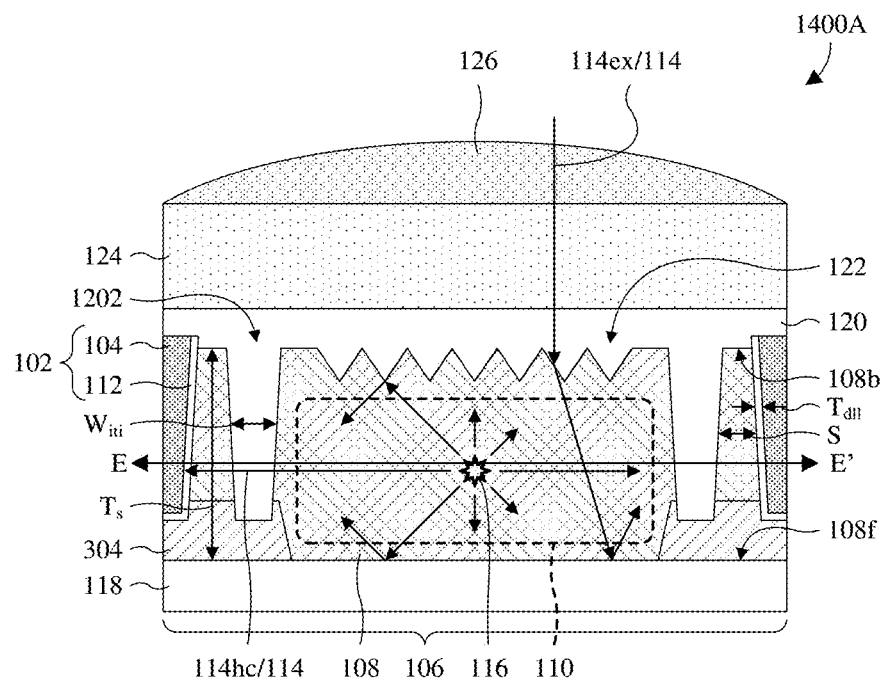
FIGS. 14A and 14B illustrate cross-sectional views of some alternative embodiments of the image sensor of FIG. 12 in which the image sensor further comprises an additional inter-pixel trench isolation structure.

With reference to FIG. 14A, a cross-sectional view 1400A of some alternative embodiments of the image sensor of FIG. 12 is provided in which an additional inter-pixel trench isolation structure 304 separates the pixel 106 from neighboring pixels (not shown). The additional inter-pixel trench isolation structure 304 extends into the front side 108f of the substrate 108 at the boundary of the pixel 106 and directly contacts both the inter-pixel trench isolation structure 102 and the intra-pixel trench isolation structure 1202 within the substrate 108. The additional inter-pixel trench isolation structure 304 may, for example, be as described at FIG. 3B and may hence provide enhanced inter-pixel isolation and crosstalk reduction when a thickness $T_s$ of the substrate 108 is too great for the additional inter-pixel trench isolation structure 304 and the inter-pixel trench isolation structure 102 to individually extend through the substrate 108.

Figure 14B:
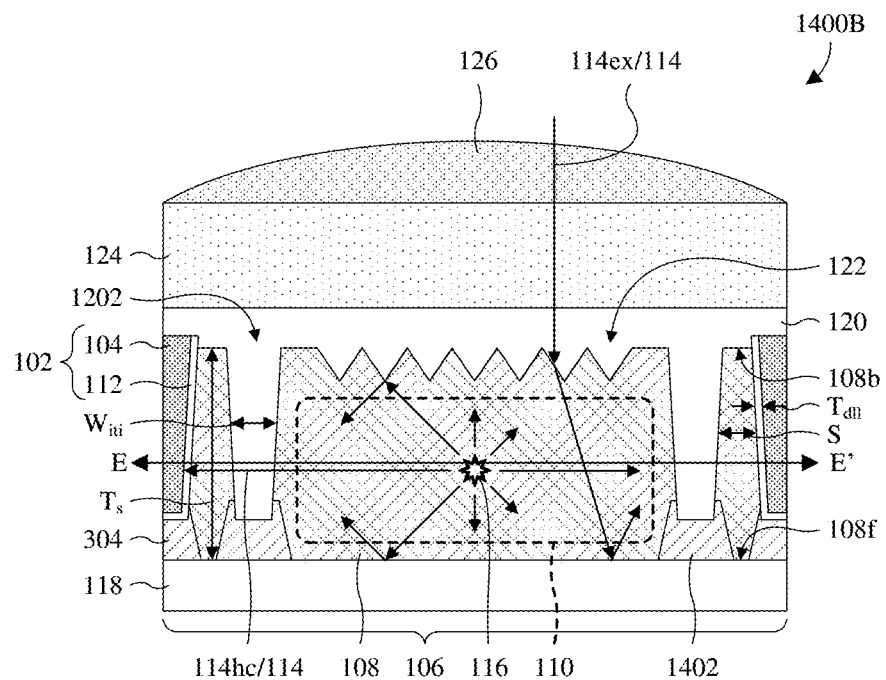

With reference to FIG. 14B, a cross-sectional view 1400B of some alternative embodiments of the image sensor of FIG. 14A is provided in which the additional inter-pixel trench isolation structure 304 is spaced from the intra-pixel trench isolation structure 1202. Further, an additional intra-pixel trench isolation structure 1402 extends into the front side 108f of the substrate 108 to the intra-pixel trench isolation structure 1202 while being surrounded by and spaced from the additional inter-pixel trench isolation structure 304.

The additional intra-pixel trench isolation structure 1402 comprises a dielectric material having a higher refractive index than the substrate 108 so as to promote TIR at sidewall interfaces at which the additional intra-pixel trench isolation structure 1402 and the substrate 108 directly contact. By promoting TIR at the sidewall interfaces, radiation 114 may be reflected back towards the photodetector 110 to reduce crosstalk and improve QE, SNR, and other suitable performance metrics. The additional intra-pixel trench isolation structure 1402 may, for example, be or comprise silicon oxide and/or some other suitable dielectric(s).

While FIGS. 13A-13C are described with regard to FIG. 12, it is to be appreciated that FIGS. 13A-13C are applicable to any of FIGS. 14A and 14B in alternative embodiments. Hence, any of FIGS. 14A and 14B may be taken along line E-E' in any of FIGS. 13A-13C. Further, any of FIGS. 13A-13C may be taken along line E-E' in any of FIGS. 14A and 14B.

Figure 15:
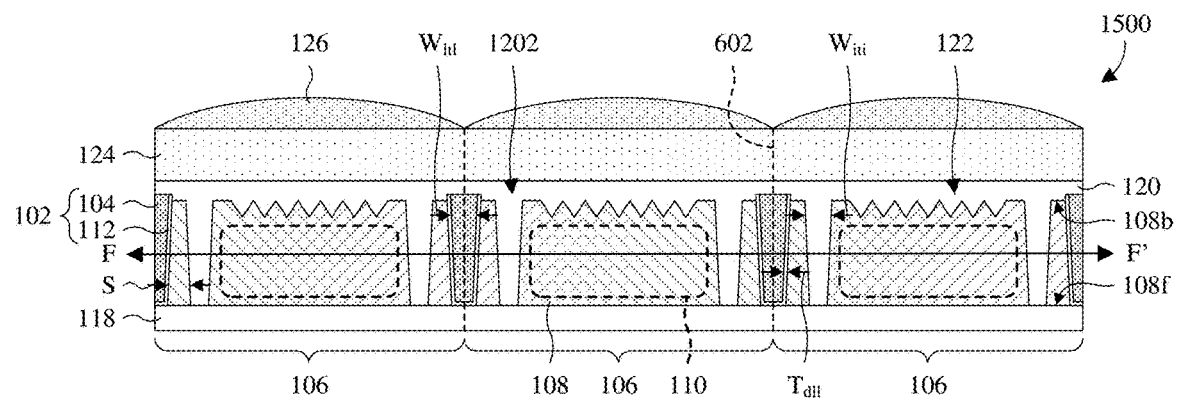
FIG. 15 illustrates a cross-sectional view of some embodiments of the image sensor of FIG. 12 in which the image sensor comprises multiple pixels.

With reference to FIG. 15, a cross-sectional view 1500 of some alternative embodiments of the image sensor of FIG. 12 is provided in which the image sensor comprises multiple pixels 106. The pixels 106 are each as their counterpart is illustrated and described at FIG. 12. Further, the pixels 106 share the inter-pixel trench isolation structure 102 and have individual intra-pixel trench isolation structures 1202. For clarity, boundaries 602 between the pixels 106 are demarcated by dashed lines.

While FIG. 15 illustrates an image sensor comprising multiple pixels 106 each configured as the pixel 106 in FIG. 12, the pixels 106 of FIG. 15 may each be configured as the pixel 106 in any of FIGS. 14A and 14B in alternative embodiments.

Figure 16:
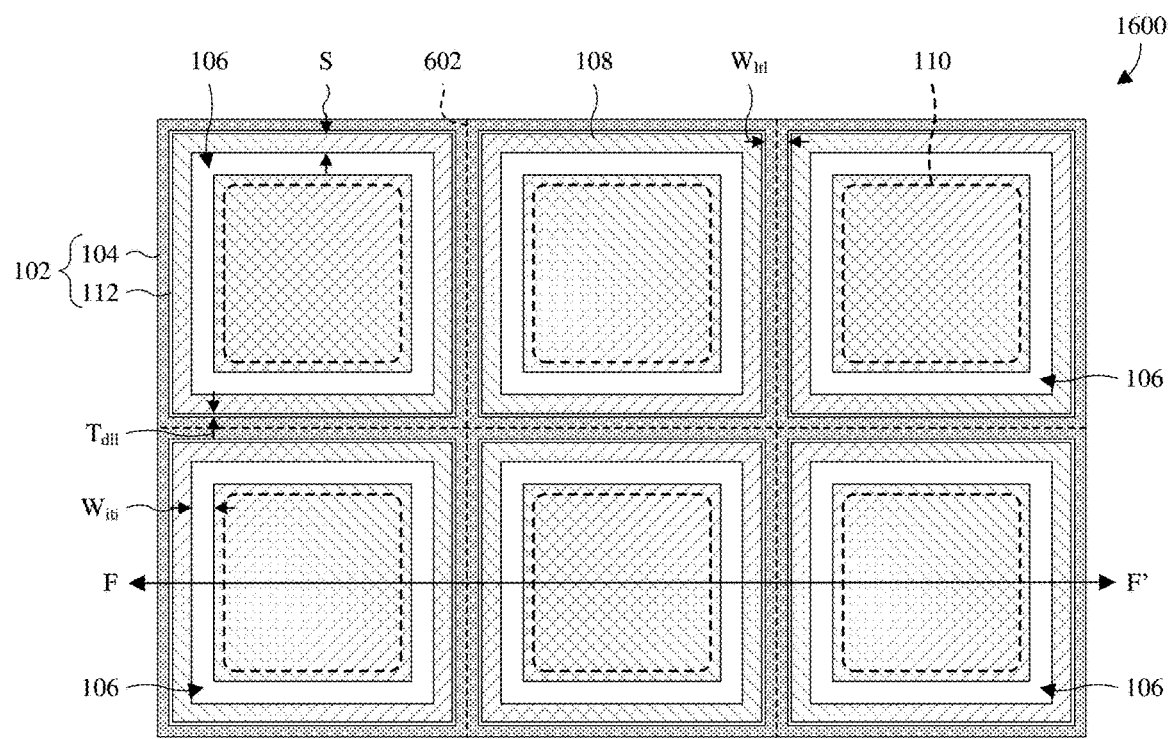
FIG. 16 illustrates a top layout view of some embodiments of the image sensor of FIG. 15.

With reference to FIG. 16, a top layout view 1600 of some embodiments of the image sensor of FIG. 15 is provided. FIG. 16 may, for example, be taken along line F-F' in FIG. 15 and/or FIG. 15 may, for example, be taken along line F-F' in FIG. 16.

Figure 17:
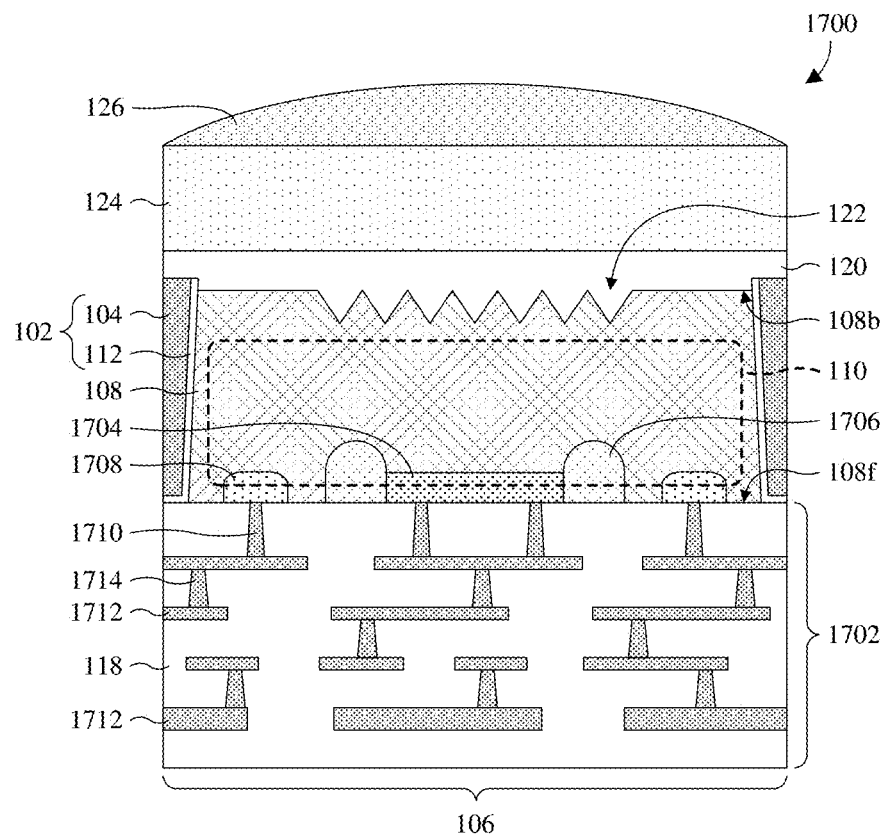
FIG. 17 illustrates a cross-sectional view of some embodiments of the image sensor of FIG. 1 in which a photodetector is shown in more detail and an interconnect structure is electrically coupled to the photodetector.

With reference to FIG. 17, a cross-sectional view 1700 of some embodiments of the image sensor of FIG. 1 is provided in which the photodetector 110 is shown in more detail and is electrically coupled to an interconnect structure 1702 on the front side 108f of the substrate 108. The photodetector 110 comprises a first contact region 1704, a guard ring 1706, and a pair of second contact regions 1708. Further, the photodetector 110 may, for example, be an APD, an SPAD, or some other suitable type of photodetector.

The first contact region 1704 is at a center of the pixel 106. The guard ring 1706 surrounds the first contact region 1704 and has a pair of guard ring segments. The guard ring segments are respectively on opposite sides of the first contact region 1704 at a boundary of the first contact region. In some embodiments, the guard ring 1706 extends in a closed path along a boundary of the first contact region 1704 when viewed top down. The first contact region 1704 and the guard ring 1706 share a common doping type, but the first contact region 1704 has a higher doping concentration. Further, the common doping type is opposite to a doping type of adjoining regions of the substrate 108 and/or a bulk of the substrate 108.

The second contact regions 1708 are respectively on opposite sides of the guard ring 1706 at a periphery of the pixel 106. In some embodiments, the second contact regions 1708 correspond to different segments of a ring-shaped contact region extending in a closed path around the guard ring 1706. The second contact regions 1708 share a common doping type that is opposite that of the first contact region 1704 and the guard ring 1706.

The interconnect structure 1702 is in the front side dielectric structure 118 and comprises a plurality of contacts 1710, a plurality of wires 1712, and a plurality of vias 1714. The contacts 1710 extend from the first and second contact regions 1704, 1708, and the wires 1712 and the vias 1714 are alternating stacked under the contacts 1710 to define conductive paths leading from the contacts 1710. The contacts 1710, the wires 1712, and the vias 1714 may, for example, be or comprise metal and/or other suitable conductive materials.

Figure 18:
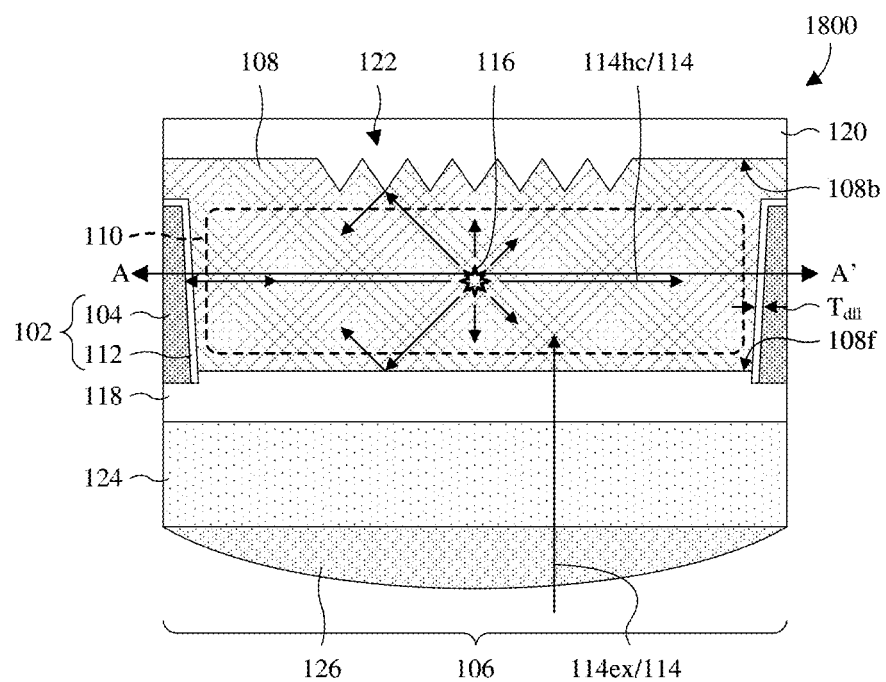
FIG. 18 illustrates a cross-sectional view of some alternative embodiments of the image sensor of FIG. 1 in which the image sensor is front side illuminated (FSI).

With reference to FIG. 18, a cross-sectional view 1800 of some alternative embodiments of the image sensor of FIG. 1 is provided in which the image sensor is front side illuminated (FSI) instead of back side illuminated (BSI). As such, the spacer layer 124 and the micro lens 126 are on the front side 108f of the substrate 108 and the image sensor is configured to receive external radiation 114ex from the front side 108f of the substrate 108. Additionally, the inter-pixel trench isolation structure 102 extends into the front side 108f of the substrate 108 to a depth less than a full thickness of the substrate 108. In alternative embodiments, the inter-pixel trench isolation structure 102 extends fully through the substrate 108.

Figure 19A:
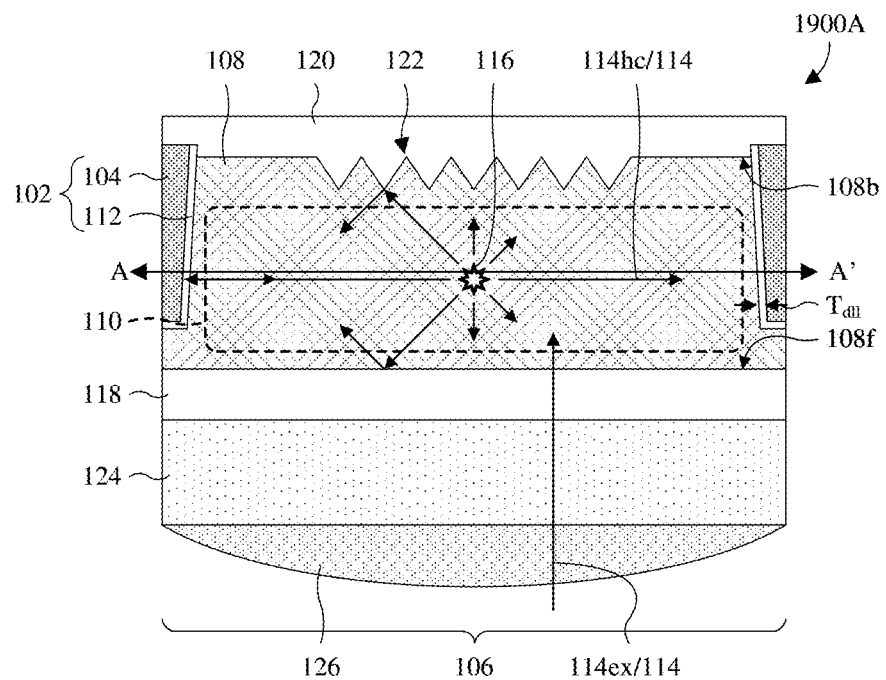
FIGS. 19A and 19B illustrate cross-sectional views of some alternative embodiments of the image sensor of FIG. 18 in which the inter-pixel trench isolation structure extends into a back side of a substrate.
Figure 19B:
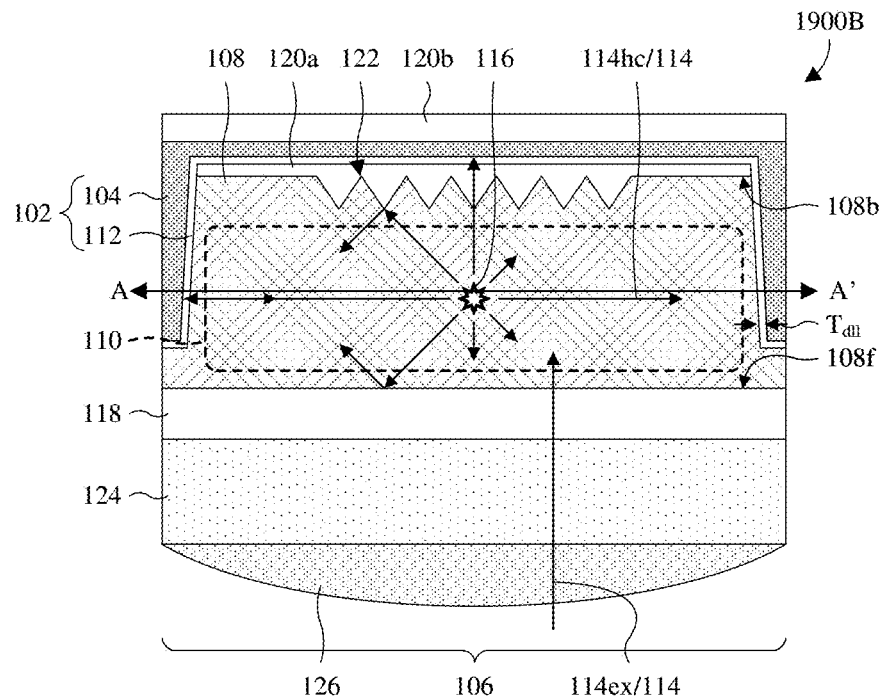

With reference to FIGS. 19A and 19B, cross-sectional views 1900A, 1900B of some alternative embodiments of the image sensor of FIG. 18 are provided in which the inter-pixel trench isolation structure 102 extends into the back side 108b of the substrate 108 instead of the front side 108f of the substrate 108. In FIG. 19A, the low-transmission layer 104 and the dielectric liner layer 112 do not cover the back side 108b of the substrate 108. In FIG. 19B, the low-transmission layer 104 and the dielectric liner layer cover the back side 108b of the substrate 108. Further, the back side dielectric structure 120 is divided into a first back side dielectric layer 120a and a second back side dielectric layer 120b respectively under and over the low-transmission layer 104. The first back side dielectric layer 120a and/or the second back side dielectric layer 120b may, for example, be as the back side dielectric structure 120 of FIG. 18 is described.

Because the low-transmission layer 104 covers the back side 108b of the substrate 108 and has a high reflectance, radiation 114 that passes across the back side 108b of the substrate 108 to the low-transmission layer 104 may be reflected back to the photodetector 110. This gives the photodetector 110 another opportunity to absorb the radiation 114. Hence, QE and other suitable performance metrics of the photodetector 110 are enhanced.

Figure 20:
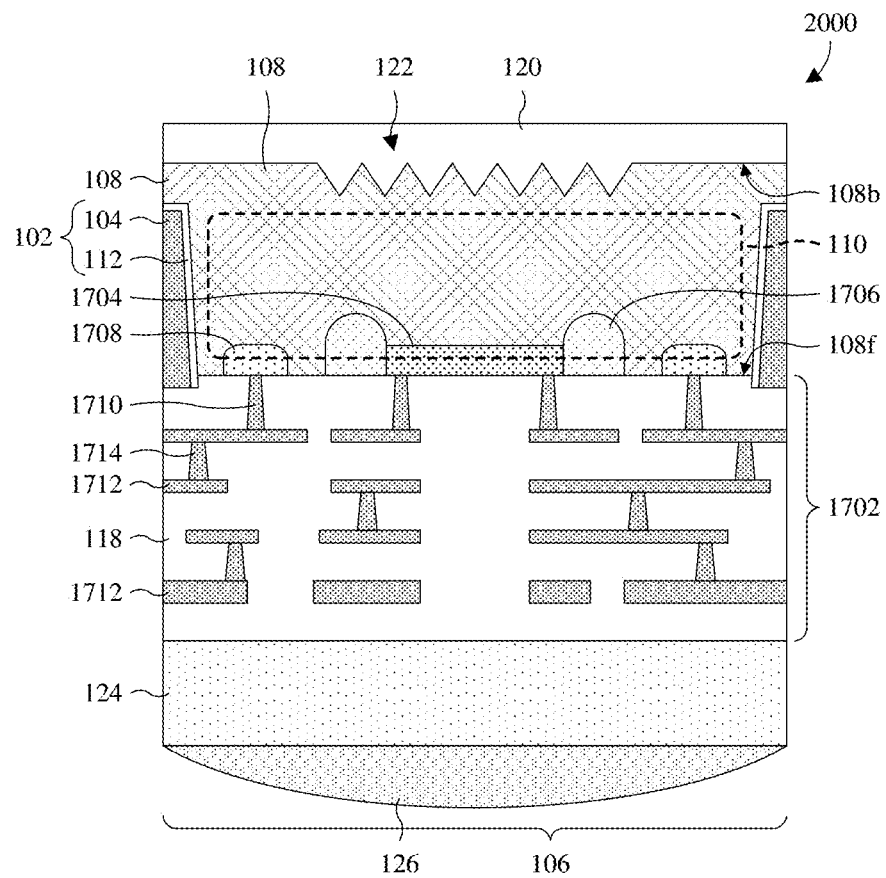
FIG. 20 illustrates a cross-sectional view of some embodiments of the image sensor of FIG. 18 in which a photodetector is shown in more detail and an interconnect structure is electrically coupled to the photodetector.

With reference to FIG. 20, a cross-sectional view 2000 of some embodiments of the image sensor of FIG. 18 is provided in which the photodetector 110 is shown in more detail and is electrically coupled to an interconnect structure 1702 on the front side 108f of the substrate 108. The photodetector 110 and the interconnect structure 1702 are as described at FIG. 17 except conductive features (e.g., the contacts 1710, the wires 1712, and the vias 1714) of the interconnect structure 1702 are cleared directly under the first contact region 1704 to allow radiation to pass through the interconnect structure 1702 to the photodetector 110.

While FIG. 3A illustrates alternative embodiments of the image sensor of FIG. 1 including the barrier layer 302, alternative embodiments of the image sensor in any of FIGS. 3B, 4A, 4B, 5A, 5B, 6, 8, 10, 12, 14A, 14B, 15, 17, 18, 19A, 19B, and 20 may include the barrier layer 302 as in FIG. 3A. While FIG. 3B illustrates alternative embodiments of the image sensor of FIG. 1 including the additional inter-pixel trench isolation structure 304, alternative embodiments of the image sensor in any of FIGS. 3A, 4B, 5A, 5B, 6, 8, 10, 12, 15, and 17 may include the additional intra-pixel trench isolation structure 304 as in FIG. 3B. While FIG. 4A illustrates alternative embodiments of the image sensor of FIG. 1 in which the inter-pixel trench isolation structure 102 extends into the front side 108f of the substrate 108, alternative embodiments of the image sensor in any of FIGS. 3A, 3B, 4B, 5A, 5B, 6, 8, 10, 12, 15, and 17 may also have the inter-pixel trench isolation structure 102 extending into the front side 108f of the substrate 108 as in FIG. 4A. While FIG. 4B illustrates alternative embodiments of the image sensor of FIG. 1 in which a top surface of the low-transmission layer 104 is about even with that of the substrate 108, alternative embodiments of the image sensor in any of FIGS. 3A, 3B, 4A, 5A, 5B, 6, 8, 10, 12, 14A, 14B, 15, 17, 18, 19A, 19B, and 20 may also have the top surface of the low-transmission layer 104 about even with that of the substrate 108. While FIGS. 5A and 5B illustrates alternative embodiments of the image sensor of FIG. 1 in which constituents of the diffuser 122 and/or the dielectric liner layer 112 is/are omitted, alternative embodiments of the image sensor in any of FIGS. 3A, 3B, 4A, 4B, 6, 8, 10, 12, 14A, 14B, 15, 17, 18, 19A, 19B, and 20 may also omit the diffuser 122 and/or the dielectric liner layer 112. While FIG. 8 illustrates alternative embodiments of the image sensor of FIG. 1 in which the low-transmission layer 104 is absorptive and the dielectric liner layer 112 is configured for TIR, the low-transmission layer 104 may be absorptive as in FIG. 8 and the dielectric liner layer 112 may be configured for TIR as in FIG. 8 in alternative embodiments of the image sensor in any of FIGS. 3A, 3B, 4A, 4B, 5A, 5B, 6, 12, 14A, 14B, 15, 17, 18, 19A, 19B, and 20. While FIG. 12 illustrates alternative embodiments of the image sensor of FIG. 1 in which the low-transmission layer 104 is absorptive and the image sensor further comprises the intra-pixel trench isolation structure 1202, the low-transmission layer 104 may be absorptive as in FIG. 12 and the image sensor may further comprises the intra-pixel trench isolation structure 1202 as in FIG. 12 in alternative embodiments of the image sensor in any of FIGS. 3A, 3B, 4A, 4B, 5A, 5B, 6, 8, 10, 17, 18, 19A, 19B, and 20. While FIG. 17 illustrates more detailed embodiments of the image sensor of FIG. 1 in which the photodetector 110 is shown in more detail and electrically coupled to an interconnect structure 1702, the photodetector 110 in any of FIGS. 3A, 3B, 4A, 4B, 5A, 5B, 6, 12, 14A, 14B, and 15 may be as shown in FIG. 17 and electrically coupled to an interconnect structure 1702 as in FIG. 17 in alternative embodiments. While FIG. 18 illustrates alternative embodiments of the image sensor of FIG. 1 in which the image sensor is FSI, the image sensor in any of FIGS. 3A, 3B, 4A, 4B, 5A, 5B, 6, 12, 14A, 14B, and 15 may be FSI as in FIG. 18 in alternative embodiments.

With reference to FIGS. 21-26, 27A, 27B, 28, and 29, a series of cross-sectional views 2100-2600, 2700A, 2700B, 2800, 2900 of some embodiments of a method for forming an image sensor is provided in which an inter-pixel trench isolation structure defined in part by a low-transmission layer. The method may, for example, be employed to form the image sensor in any of FIGS. 1, 2, 3A, 3B, 4B, 5A, 5B, and 6-11 and other suitable image sensors.

Figure 21:
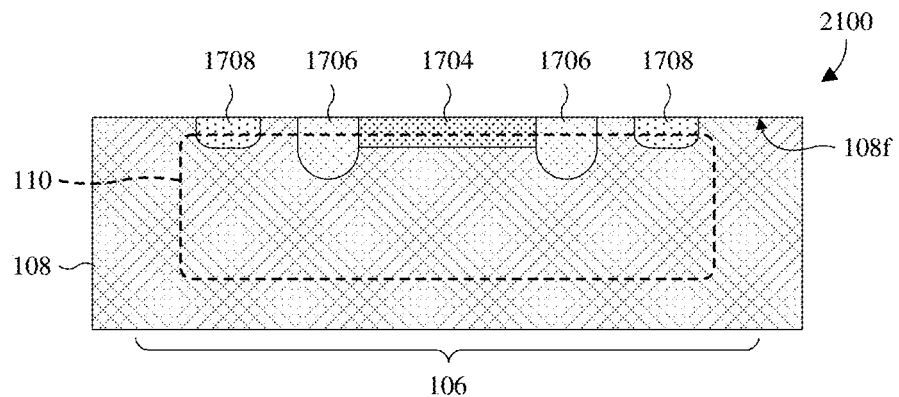
FIGS. 21-26, 27A, 27B, 28, and 29 illustrate a series of cross-sectional views of some embodiments of a method for forming an image sensor comprising an inter-pixel trench isolation structure defined in part by a low-transmission layer.

As illustrated by the cross-sectional view 2100 of FIG. 21, a photodetector 110 is formed in a substrate 108 from a front side 108f of the substrate 108. The photodetector 110 is individual to a pixel 106 of the image sensor being formed and comprises a first contact region 1704, a guard ring 1706, and a pair of second contact regions 1708. The first contact region 1704 and the guard ring 1706 share a common doping type opposite to that of adjoining regions of the substrate 108. Further, the guard ring 1706 has a lesser doping concentration than the first contact region 1704. The second contact regions 1708 have an opposite doping type as the first contact region 1704 and the guard ring 1706. The photodetector 110 may, for example, be an APD, an SPAD, or some other suitable type of photodetector. In alternative embodiments, the photodetector 110 has some other suitable configuration.

Figure 22:
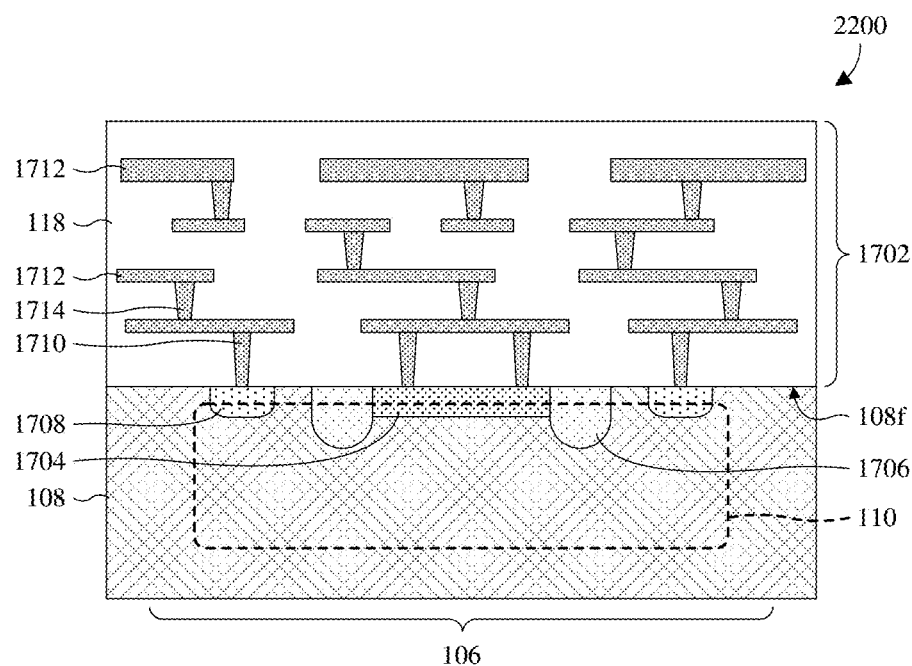

As illustrated by the cross-sectional view 2200 of FIG. 22, a front side dielectric structure 118 is formed covering the photodetector 110 on the front side 108f of the substrate 108. In some embodiments, the front side dielectric structure 118 has a higher refractive index than the substrate 108 at an interface between the front side dielectric structure 118 and the substrate 108 to promote TIR at the interface. The first back side dielectric layer 120a may, for example, be or comprise silicon oxide and/or some other suitable dielectric(s).

Also illustrated by the cross-sectional view 2200 of FIG. 22, an interconnect structure 1702 is formed electrically coupled to the photodetector 110 in the front side dielectric structure 118. The interconnect structure 1702 comprises a plurality of contacts 1710, a plurality of wires 1712, and a plurality of vias 1714. The contacts 1710 extend from the first and second contact regions 1704, 1708, and the wires 1712 and the vias 1714 are alternating stacked over the contacts 1710 to define conductive paths leading from the contacts 1710.

Figure 23:
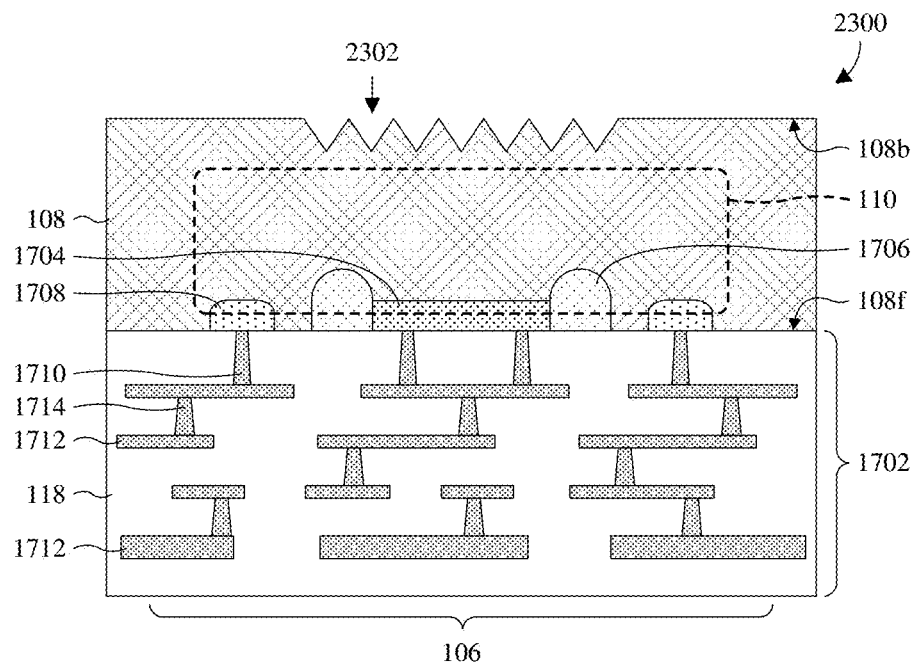

As illustrated by the cross-sectional view 2300 of FIG. 23, the substrate 108 is flipped so a back side 108b of the substrate 108 overlies the front side 108f of the substrate 108. Further, the back side 108b of the substrate 108 is patterned to form a periodic pattern 2302 directly over the photodetector 110. The periodic pattern may, for example, have a saw-toothed profile or some other suitable profile. The patterning may, for example, be performed by a photolithography/etching process or some other suitable patterning process.

Figure 24:
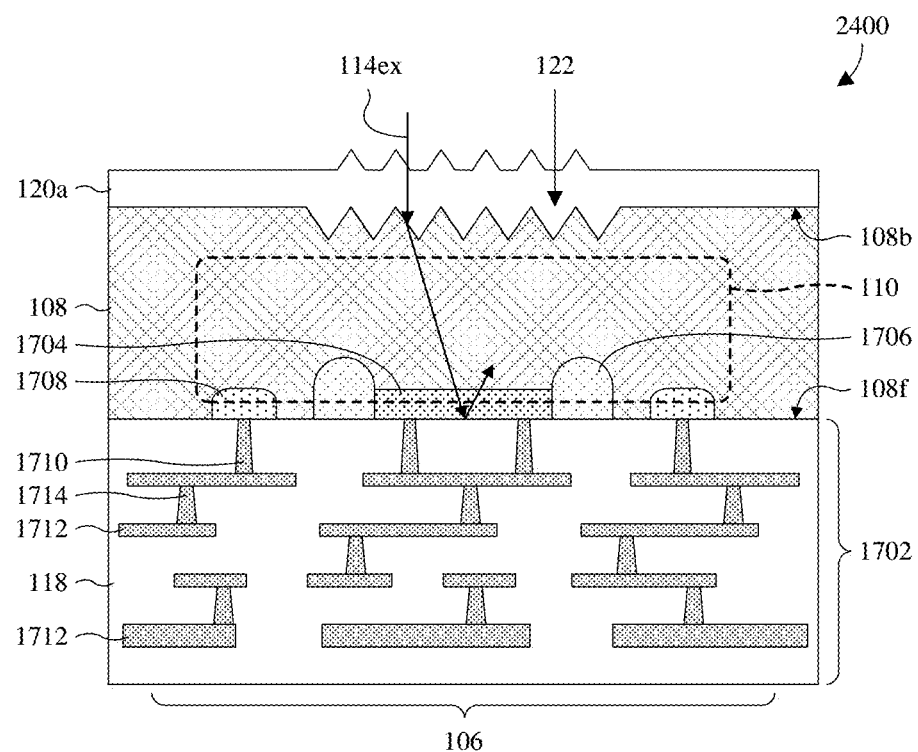

As illustrated, by the cross-sectional view 2400 of FIG. 24, a first back side dielectric layer 120a is deposited covering the back side 108b of the substrate 108 and the periodic pattern 2302 (see, e.g., FIG. 23). The first back side dielectric layer 120a has a higher refractive index than the substrate 108 to promote TIR at an interface between the first back side dielectric layer 120a and the substrate 108. Further, a top surface of the first back side dielectric layer 120a is rough at least at the periodic pattern. The first back side dielectric layer 120a may, for example, be or comprise silicon oxide and/or some other suitable dielectric(s).

Collectively, the first back side dielectric layer 120a and the substrate 108 define a diffuser 122 at the periodic pattern 2302 (see, e.g., FIG. 23). The diffuser 122 serves to scatter external radiation 114ex received at the back side 108b of the substrate 108. This may, for example, increase an angle of incidence of the external radiation 114ex at the front side 108f of the substrate 108 to increase TIR at the front side 108f. By increasing TIR at the front side 108f of the substrate 108, more of the external radiation 114ex may be reflected back to the photodetector 110. Hence, QE and other suitable performance metrics of the photodetector 110 may be enhanced.

Figure 25:
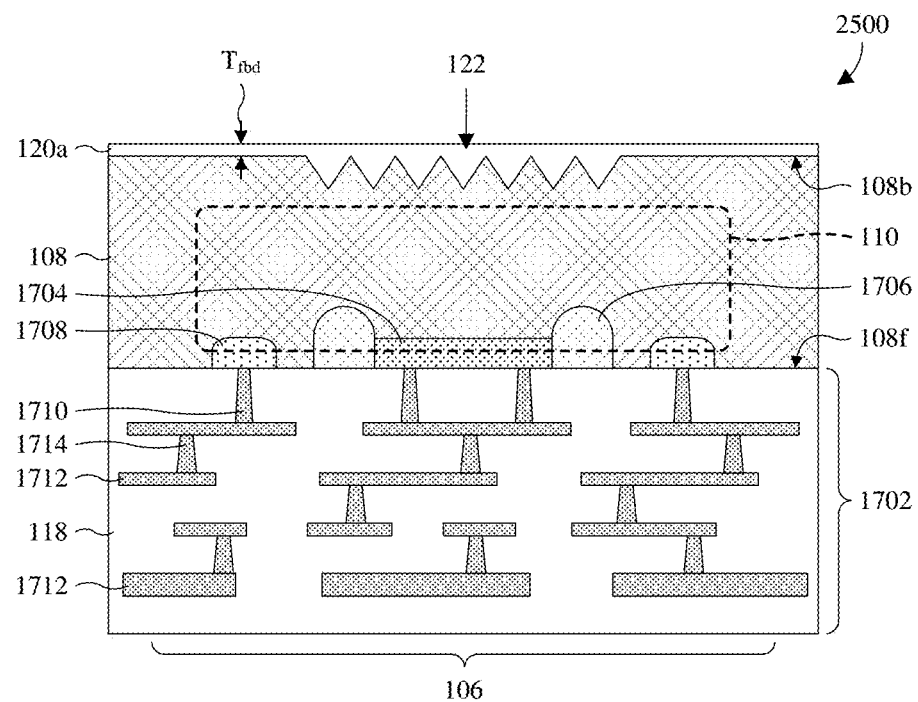

As illustrated by the cross-sectional view 2500 of FIG. 25, a top surface of the first back side dielectric layer 120a is flattened. The flattening may, for example, be performed by a chemical mechanical polish (CMP) or some other suitable planarization process.

Figure 26:
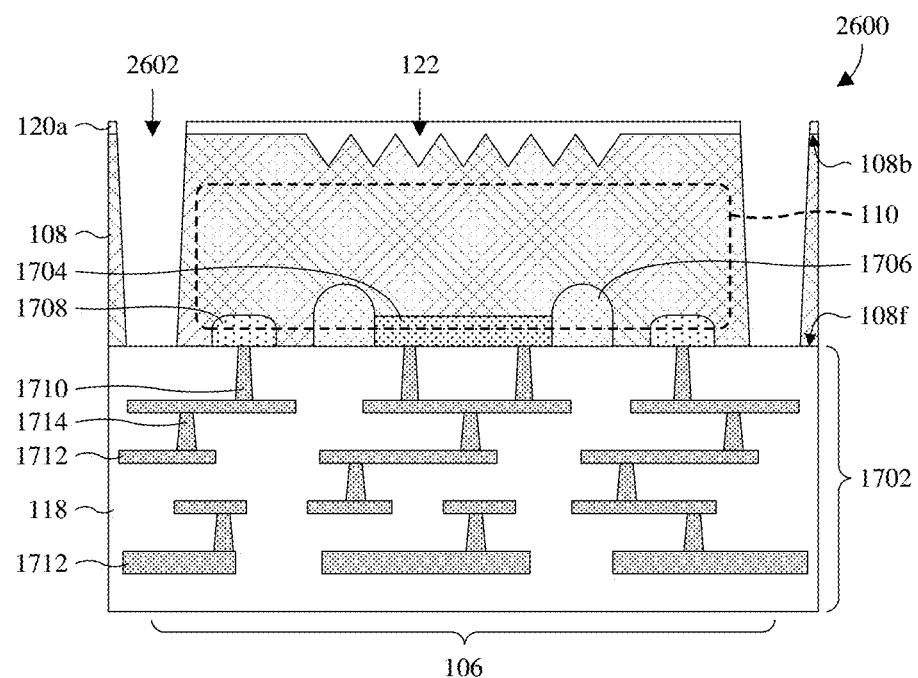

As illustrated by the cross-sectional view 2600 of FIG. 26, the first back side dielectric layer 120a and the substrate 108 are patterned to define an inter-pixel isolation trench 2602. The inter-pixel isolation trench 2602 may, for example, also be known as an outer isolation trench. The inter-pixel isolation trench 2602 has a pair of segments respectively on opposite sides of the photodetector 110 at a boundary of the pixel 106. In some embodiments, the inter-pixel isolation trench 2602 extends in a closed path along a boundary of the pixel 106 to surround the photodetector 110 when viewed top down. Further, in some embodiments, the inter-pixel isolation trench 2602 has the same top layout as the inter-pixel trench isolation structure 102 of FIG. 2 or FIG. 7. The patterning may, for example, be performed by a photolithography/etching process or some other suitable patterning process.

Figure 27A:
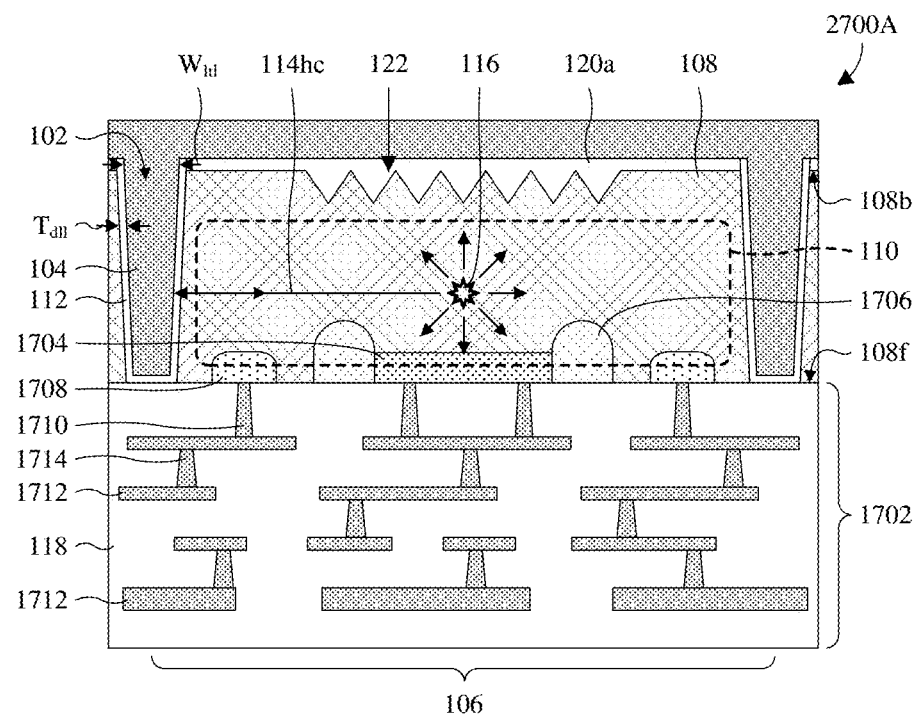

As illustrated by the cross-sectional views 2700A of FIG. 27A, a dielectric liner layer 112 and a low-transmission layer 104 are deposited filling the inter-pixel isolation trench 2602 (see, e.g., FIG. 26). The dielectric liner layer 112 is deposited before the low-transmission layer 104 and electrically separates the low-transmission layer 104 from the substrate 108. The dielectric liner layer 112 may, for example, be or comprise silicon oxide, aluminum oxide, some other suitable dielectric(s), or any combination of the foregoing.

In some embodiments, the dielectric liner layer 112 also serves as a diffusion barrier for the low-transmission layer 104. For example, the dielectric liner layer 112 may be or comprise aluminum oxide, whereas the low-transmission layer 104 may be or comprise copper. Other suitable materials are, however, amenable. In some embodiments, the dielectric liner layer 112 has a higher refractive index than the substrate 108. For example, the dielectric liner layer 112 may be or comprise silicon oxide, whereas the substrate 108 may be or comprise silicon.

The dielectric liner layer 112 has low absorption for radiation and, in some embodiments, has high transmission for radiation. The low absorption may, for example, be absorption less about than 10%, 5%, 1%, or some other suitable percentage of incident radiation. The high transmission may, for example, be transmission greater than 90%, 95%, 99%, or some other suitable percentage of incident radiation. The low absorption minimizes QE losses while the high transmission allows radiation to pass unimpeded to the low-transmission layer 104. In some embodiments, the dielectric liner layer 112 is transparent to radiation.

In some embodiments, to achieve low absorption and high transmission, a thickness $T_{dll}$ of the dielectric liner layer 112 is small. The thickness $T_{dll}$ may, for example, be small when less than about 100 nanometers, about 50 nanometers, about 10 nanometers, or some other suitable value. Further, the thickness $T_{dll}$ may, for example, be small when about 10-100 nanometers, about 10-55 nanometers, about 55-100 nanometers, about 20 nanometers, or some other suitable value. If the thickness $T_{dll}$ is too small (e.g., less than about 10 nanometers or some other suitable value), the dielectric liner layer 112 may be unable to electrically separate the low-transmission layer 104 from the substrate 108. If the thickness $T_{dll}$ is too large (e.g., more than about 100 nanometers or some other suitable value), the dielectric liner layer 112 may absorb or otherwise interfere with radiation traveling to the low-transmission layer 104.

The dielectric liner layer 112 may, for example, be deposited by thermal oxidation, such that the dielectric liner layer 112 grows from the substrate 108 but does not grow, or minimally grows, from the first back side dielectric layer 120a. Alternatively, the dielectric liner layer 112 may be deposited by chemical vapor deposition (CVD), physical vapor deposition (PVD), or some other suitable deposition process.

The low-transmission layer 104 overlies the dielectric liner layer 112 in the inter-pixel isolation trench 2602 and further covers the first back side dielectric layer 120a. The low-transmission layer 102 has low transmission for radiation and hence blocks most or all radiation incident thereon. In some embodiments, the low transmission is transmission less than about 1%, 5%, 10%, or some other suitable percentage of radiation. In some embodiments, the low-transmission layer 104 is opaque to radiation. The low-transmission layer 104 further has high reflectance for radiation. The high reflectance may, for example, be reflectance greater than about 80%, 90%, 95%, or some other suitable percentage of radiation.

The low transmission of the low-transmission layer 104 and the high reflectance of the low-transmission layer 104 are due to intrinsic properties of material making up the low-transmission layer 104 and do not depend upon TIR. In some embodiments, the low-transmission layer 104 is metal and/or some other suitable conductive material(s). The metal may, for example, be or comprise copper, aluminum, silver, some other suitable metal(s), or any combination of the foregoing. In alternative embodiments, the low-transmission layer 104 is a dielectric and/or some other suitable material(s). In at least some embodiments in which the low-transmission layer 104 is dielectric, deposition of the dielectric liner layer 112 may be omitted and the low-transmission layer 104 may be deposited directly on the substrate 108 in the inter-pixel isolation trench 2602.

The low-transmission layer 104 and the dielectric liner layer 112 define an inter-pixel trench isolation structure 102 filling the inter-pixel isolation trench 2602. A top layout of the inter-pixel trench isolation structure 102 may, for example, be as in any of FIGS. 2, 7, 9, and 11. Because the low-transmission layer 104 has the low transmission and the high reflectance, the inter-pixel trench isolation structure 102 also has the low transmission and the high reflectance. Because of the low transmission, the inter-pixel trench isolation structure 102 may reduce radiation from passing from the pixel 106 to neighboring pixels (not shown), or vice versa, and may hence reduce crosstalk. By reducing crosstalk, SNR and other suitable performance metrics of the photodetector 110 may be enhanced. Because of the high reflectance, the inter-pixel trench isolation structure 102 may reflect radiation incident thereon back towards the photodetector 110. This provides the photodetector 110 with another opportunity to absorb the radiation, which may improve QE, SNR, and other suitable performance metrics of the photodetector 110.

In some embodiments, the photodetector 110 operates in a reverse biased state at a high voltage. For example, the photodetector 110 may be an APD, a SPAD, or some other suitable type of photodetector. Because the photodetector 110 may operate at the high voltage, the photodetector 110 may be prone to hot carrier luminescence 116 (schematically illustrated by a star). Hot carrier luminescence 116 may emit hot carrier radiation 114hc in any direction, which makes it difficult to efficiently block the hot carrier radiation 114hc by TIR. TIR depends upon the angle of incidence exceeding a so-called critical angle.

Because the inter-pixel trench isolation structure 102 has the low transmission and does not depend upon TIR for the low transmission, the inter-pixel trench isolation structure 102 may block the hot carrier radiation 114hc regardless of the angle of incidence. As a result, the inter-pixel trench isolation structure 102 may efficiently reduce crosstalk from hot carrier luminescence 116. Further, because the inter-pixel trench isolation structure 102 has the high reflectance and does not depend upon TIR for the high reflectance, the inter-pixel trench isolation structure 102 may reflect the hot carrier radiation 114hc regardless of angle of incidence.

In some embodiments, the patterning at FIG. 26 and the deposition of the dielectric liner layer 112 coordinate so a width $W_{ltl}$ of the low-transmission layer 104 in the inter-pixel isolation trench 2602 is greater than about 100 nanometers, about 200 nanometers, about 500 nanometers, or some other suitable value. Further, in some embodiments, the width $W_{ltl}$ is about 100-200 nanometers, about 200-500 nanometers, or some other suitable value. If the width $W_{ltl}$ is too small (e.g., less than about 100 nanometers or some other suitable value), the low-transmission layer 104 may have high transmission and hence crosstalk may be high. If the width $W_{ltl}$ is too large (e.g., greater than about 500 nanometers or some other suitable value), the size of the photodetector 110 may be small and/or the size of the pixel 106 may be large. The former degrades performance of the photodetector 110 and the latter degrades pixel density.

Figure 27B:
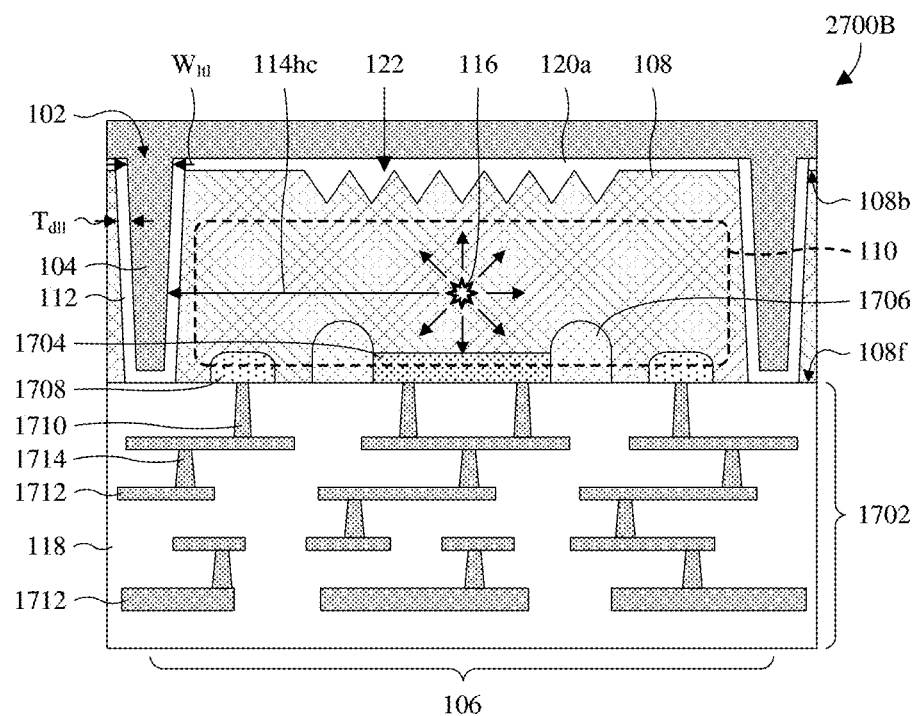

As illustrated by the cross-sectional views 2700B of FIG. 27B, the dielectric liner layer 112 and the low-transmission layer 104 are deposited filling the inter-pixel isolation trench 2602 (see, e.g., FIG. 26) according to alternative embodiments. In other words, FIGS. 27A and 27B are alternatives of each other and hence each individually illustrates the deposition proceeding from FIG. 26. In contrast with FIG. 27A, the low-transmission layer 104 of FIG. 27B has high absorption instead of high reflection. As a result, radiation is mostly absorbed, instead of reflected, by the low-transmission layer 104. The high absorption may, for example, be absorption greater than about 80%, 90%, or 95%. Other suitable percentages are, however, amenable.

If the inter-pixel trench isolation structure 102 absorbed most radiation incident on the inter-pixel trench isolation structure 102, QE losses would be high and hence QE would be poor. Therefore, the dielectric liner layer 112 is configured to promote TIR at sidewall interfaces at which the dielectric liner layer 112 and the substrate 108 directly contact. TIR at the sidewall interfaces reflects most radiation before it reaches the low-transmission layer 104, and the low-transmission layer 104 absorbs any radiation that passes through dielectric liner layer 112 without be reflected by TIR, so QE losses and crosstalk are both low.

To promote TIR at the sidewall interfaces, the dielectric liner layer 112 has a higher refractive index than the substrate 108. Additionally, the dielectric liner layer 112 has a thickness $T_{dll}$ to increase TIR and minimize QE losses. Generally, the larger the thickness $T_{dll}$, the greater the TIR at the sidewall interfaces and hence the less the QE losses. The thickness $T_{dll}$ may, for example, be greater than about 100 nanometers, about 200 nanometers, about 500 nanometers, or some other suitable value. Further, the thickness $T_{dll}$ may, for example, be about 100-200 nanometers, about 200 nanometers, about 200-500 nanometers, or some other suitable value.

If the thickness $T_{dll}$ is too small (e.g., less than about 100 nanometers or some other suitable value), TIR at the sidewall interfaces may be low and QE losses may be high. Hence, QE and other suitable performance metrics of the photodetector 110 may be low. If the thickness $T_{dll}$ is too large (e.g., greater than about 500 nanometers or some other suitable value), the size of the photodetector 110 may be small and/or the size of the pixel 106 may be large. The former leads to poor performance and the latter leads to low pixel density.

In some embodiments, the low-transmission layer 104 is metal, a conductive ceramic, some other suitable conductive material(s), or any combination of the foregoing. The metal may, for example, be or comprise tungsten and/or some other suitable metal(s). The conductive ceramic may, for example, be or comprise titanium nitride, tantalum nitride, some other suitable conductive ceramic(s), or any combination of the foregoing.

Figure 28:
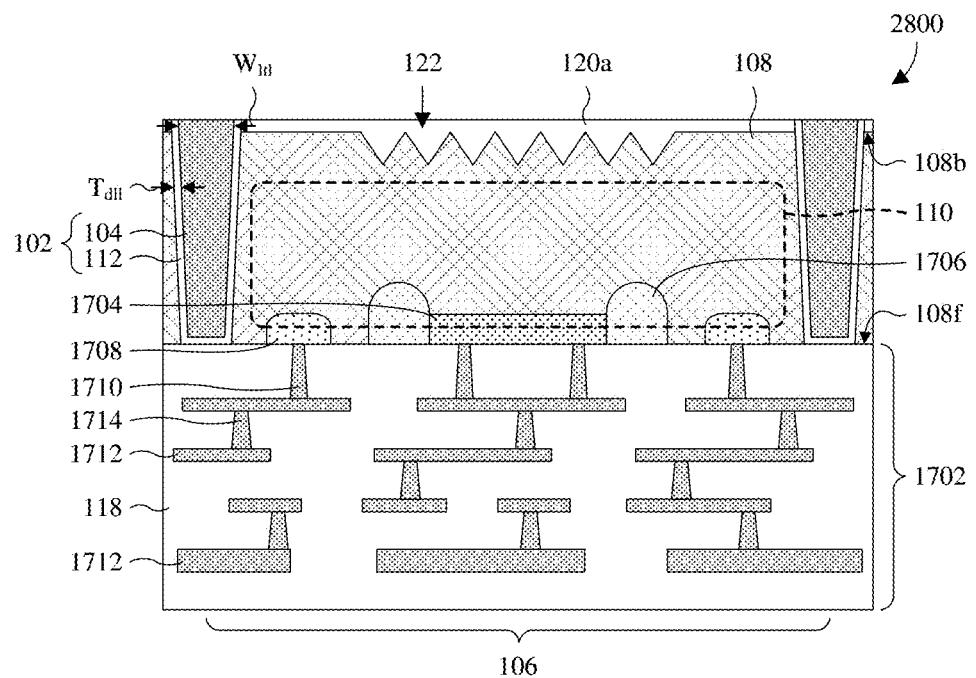

As illustrated by the cross-sectional view 2800 of FIG. 28, a top surface of the low-transmission layer 104 is recessed to uncover the first back side dielectric layer 120*a*. The recessing may be performed on the low-transmission layer 104 in any of FIGS. 27A and 27B but is illustrated using the low-transmission layer 104 in FIG. 27A. As noted above, FIGS. 27A and 27B are alternatives of each other. In some embodiments, the recessing persists until the top surface of the low-transmission layer 104 is about even with that of the first back side dielectric layer 120*a*. In other embodiments, the recessing persists until the top surface of the low-transmission layer 104 is about even with that of the substrate 108. In some embodiments, the recessing also flattens the top surface of the low-transmission layer 104. The recessing may, for example, be performed by an etch back, a CMP, some other suitable process, or any combination of the foregoing.

Figure 29:
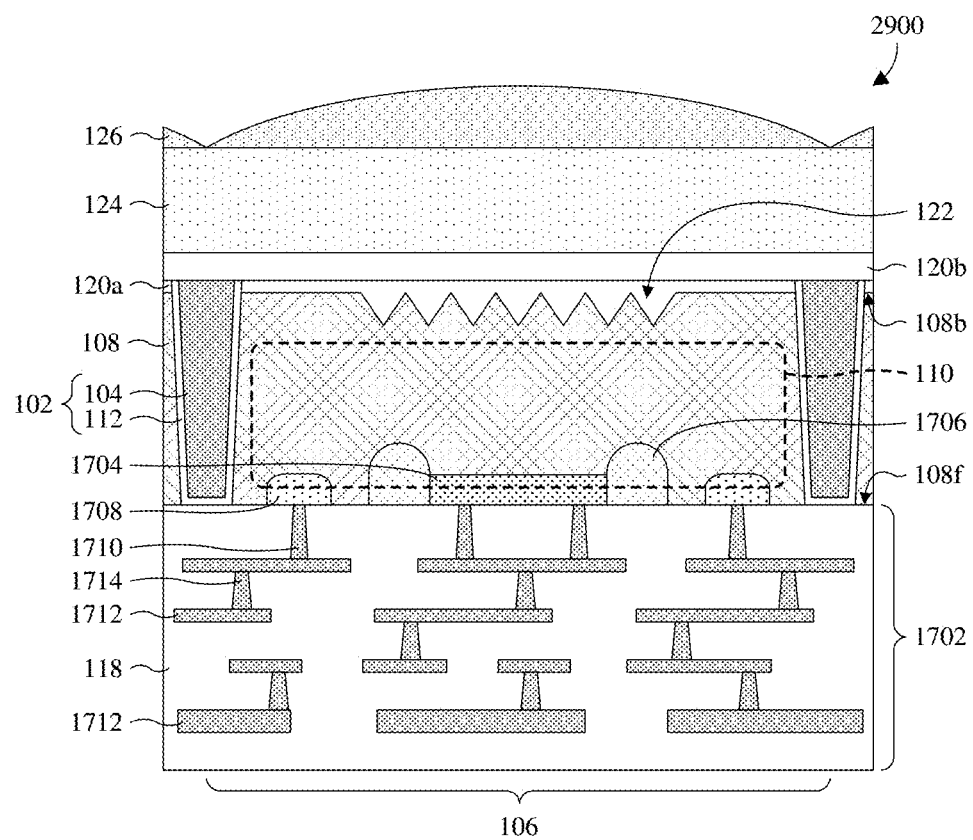

As illustrated by the cross-sectional view 2900 of FIG. 29, a second back side dielectric layer 120*b* and a spacer layer 124 are deposited over the inter-pixel trench isolation structure 102 and the first back side dielectric layer 120*a*. Further, micro lenses 126 are formed over the spacer layer 124. The second back side dielectric layer 120*b* and the spacer layer 124 may, for example, be or comprise silicon oxide and/or some other suitable dielectric(s).

While FIGS. 21-26, 27A, 27B, 28, and 29 are described with reference to various embodiments of a method, it will be appreciated that the structures shown in FIGS. 21-26, 27A, 27B, 28, and 29 are not limited to the method but rather may stand alone separate of the method. While FIGS. 21-26, 27A, 27B, 28, and 29 are described as a series of acts, it will be appreciated that the order of the acts may be altered in other embodiments. While FIGS. 21-26, 27A, 27B, 28, and 29 illustrate and describe as a specific set of acts, some acts that are illustrated and/or described may be omitted in other embodiments. Further, acts that are not illustrated and/or described may be included in other embodiments.

Figure 30:
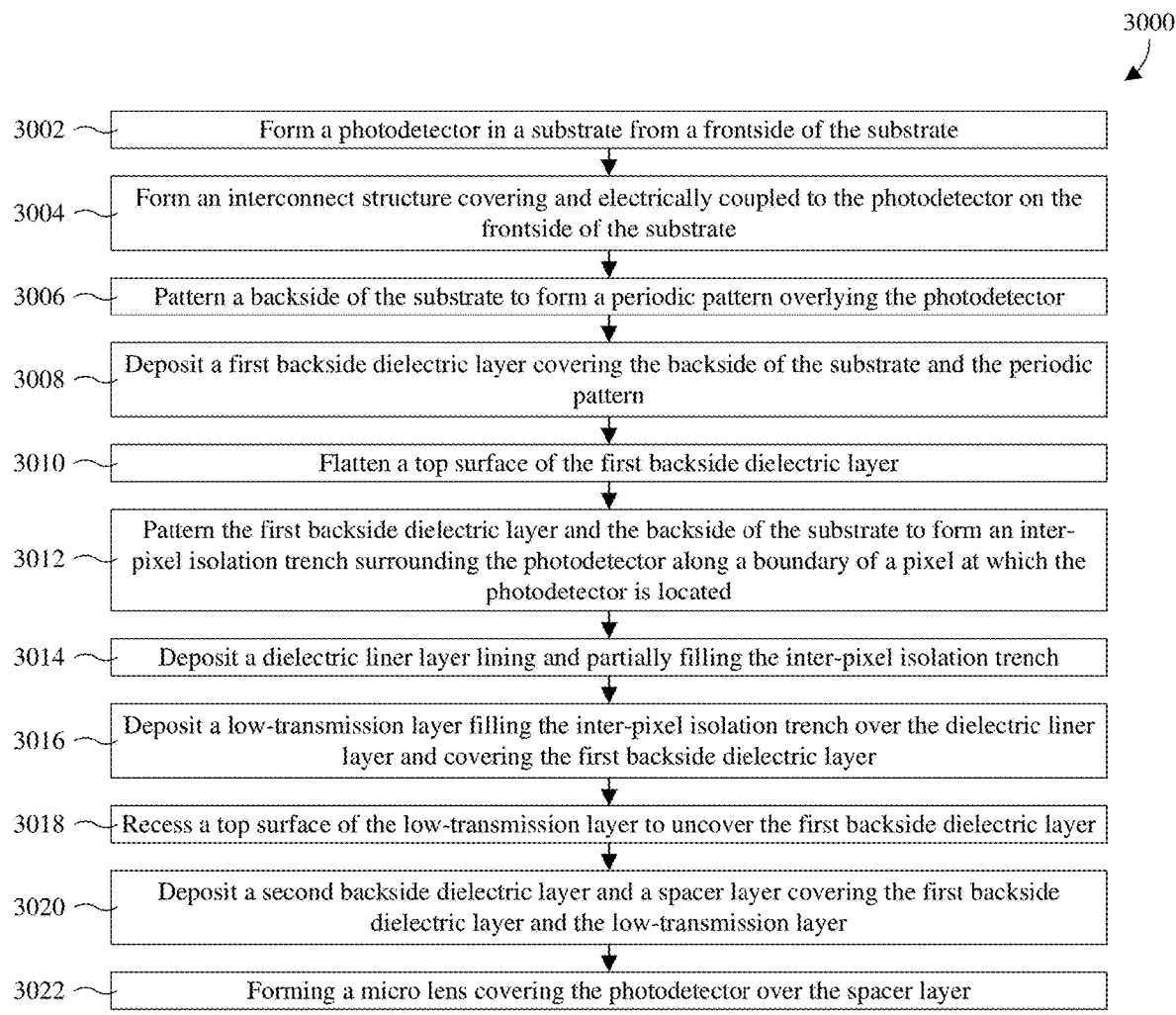
FIG. 30 illustrates a block diagram of some embodiments of the method of FIGS. 21-26, 27A, 27B, 28, and 29.

With reference to FIG. 30, a block diagram 3000 of some embodiments of the method of FIGS. 21-26, 27A, 27B, 28, and 29 is provided.

At 3002, a photodetector is formed in a substrate from a front side of the substrate. See, for example, FIG. 21.

At 3004, an interconnect structure is formed covering and electrically coupled to the photodetector on the front side of the substrate. See, for example, FIG. 22.

At 3006, a back side of the substrate is patterned to form a periodic pattern overlying the photodetector. See, for example, FIG. 23.

At 3008, a first back side dielectric layer is deposited covering the back side of the substrate and the periodic pattern. See, for example, FIG. 24.

At 3010, a top surface of the first back side dielectric layer is flattened. See, for example, FIG. 25.

At 3012, the first back side dielectric layer and the back side of the substrate are patterned to form an inter-pixel isolation trench surrounding the photodetector along a boundary of a pixel at which the photodetector is located. See, for example, FIG. 26.

At 3014, a dielectric liner layer is deposited lining and partially filling the inter-pixel isolation trench. See, for example, FIGS. 27A and 27B.

At 3016, a low-transmission layer is deposited filling the inter-pixel isolation trench over the dielectric liner layer and covering the first back side dielectric layer. See, for example, FIGS. 27A and 27B. The low-transmission layer may, for example, be metal, a conductive ceramic, some other suitable materials, or any combination of the foregoing. Further, the low-transmission layer may, for example, have high reflectance or high absorption.

At 3018, a top surface of the low-transmission layer is recessed to uncover the first back side dielectric layer. See, for example, FIG. 28.

At 3020, a second back side dielectric layer and a spacer layer are deposited covering the first back side dielectric layer and the low-transmission layer. See, for example, FIG. 29.

At 3022, a micro lens is formed covering the photodetector over the spacer layer. See, for example, FIG. 29.

While the block diagram 3000 of FIG. 30 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 31-33, 34A, 34B, 35, and 36, a series of cross-sectional views 3100-3300, 3400A, 3400B, 3500, 3600 of some alternative embodiments of the method of FIGS. 31-33, 34A, 34B, 35, and 36 is provided in which the dielectric liner layer 112 and the first back side dielectric layer 120*a* are integrated together.

Figure 31:
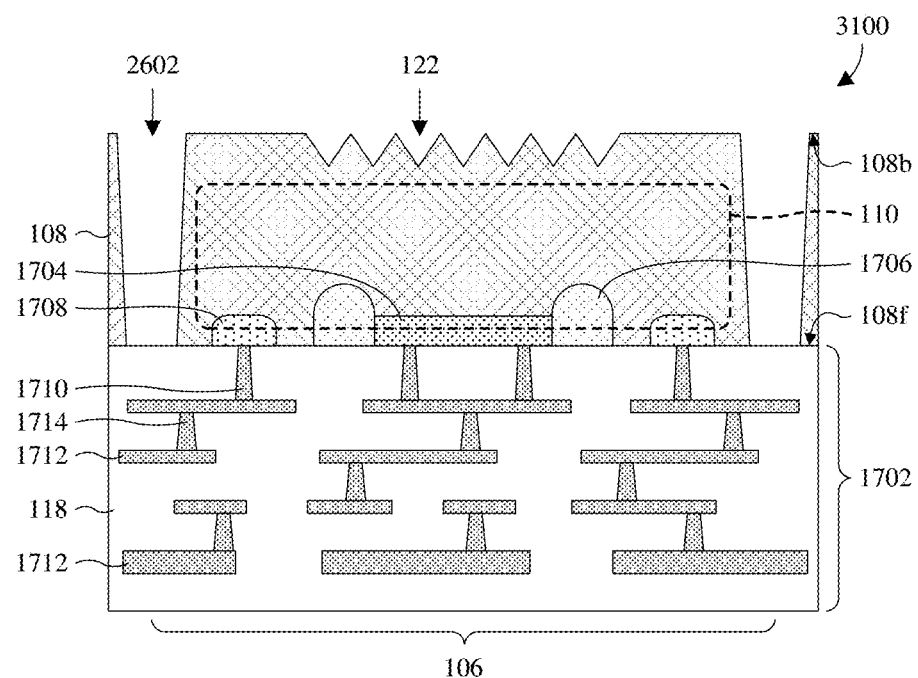
FIGS. 31-33, 34A, 34B, 35, and 36 illustrate a series of cross-sectional views of some alternative embodiments of the method of FIGS. 21-26, 27A, 27B, 28, and 29 in which a dielectric liner layer and a first back side dielectric layer are integrated.

As illustrated by the cross-sectional view 3100 of FIG. 31, the acts at FIGS. 21-23 are performed. A photodetector 110 is formed in a substrate 108 from a front side 108*f* of the substrate 108 as described with regard to FIG. 21. A front side dielectric structure 118 and an interconnect structure 1702 are formed covering the photodetector 110 on the front side 108*f* of the substrate 108 as described with regard to FIG. 22. A back side 108*b* of the substrate 108 is patterned to form a periodic pattern 2302 directly over the photodetector 110 as described with regard to FIG. 23.

Also illustrated by the cross-sectional view 3100 of FIG. 31, the substrate 108 is patterned to define an inter-pixel isolation trench 2602. The inter-pixel isolation trench 2602 has a pair of segments respectively on opposite sides of the photodetector 110. In some embodiments, the inter-pixel isolation trench 2602 extends in a closed path along a boundary of the pixel 106 to surround the photodetector 110 when viewed top down. Further, in some embodiments, the inter-pixel isolation trench 2602 has the same top layout as the inter-pixel trench isolation structure 102 of FIG. 2 or 7. The patterning may, for example, be performed by a photolithography/etching process or some other suitable patterning process. In some embodiments, the patterning to form the inter-pixel isolation trench 2602 is independent of the patterning to form the periodic pattern 2302. For example, the inter-pixel isolation trench 2602 and the periodic pattern 2302 may be formed using different photolithography/etching processes with difference masks.

Figure 32:
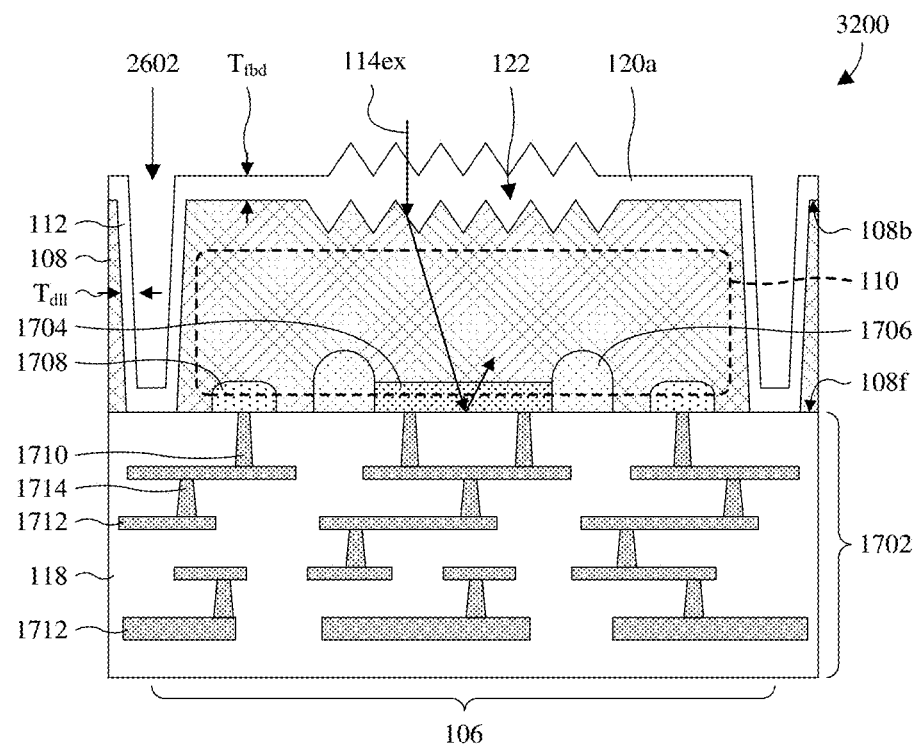

As illustrated by the cross-sectional view 3200 of FIG. 32, a first back side dielectric layer 120*a* is deposited covering the back side 108*b* of the substrate 108 and lining the inter-pixel isolation trench 2602. The first back side dielectric layer 120*a* has a higher refractive index than the substrate 108 to promote TR at an interface between the first back side dielectric layer 120*a* and the substrate 108. Further, a top surface of the first back side dielectric layer 120*a* is rough at least at the periodic pattern (see, e.g., FIG. 31). The first back side dielectric layer 120a may, for example, be or comprise silicon oxide and/or some other suitable dielectric(s).

The dielectric liner layer 112 may, for example, be deposited by CVD, PVD, or some other suitable deposition process. In some embodiments, a thickness $T_{fbd}$ of the first back side dielectric layer 120a is greater at a bottom surface of the first back side dielectric layer 120a and a top surface of the first back side dielectric layer 120a than at sidewalls of the first back side dielectric layer 120a due to the deposition process.

Collectively, the first back side dielectric layer 120a and the substrate 108 define a diffuser 122 at the periodic pattern 2302 (see, e.g., FIG. 31). The diffuser 122 serves to scatter external radiation 114ex received at the back side 108b of the substrate 108. Further, a portion of the first back side dielectric layer 120a in the inter-pixel isolation trench 2602 defines a dielectric liner layer 112. Other than being formed as part of the first back side dielectric layer 120a, the dielectric liner layer 112 may, for example, be as described with regard to FIGS. 27A and 27B.

Figure 33:
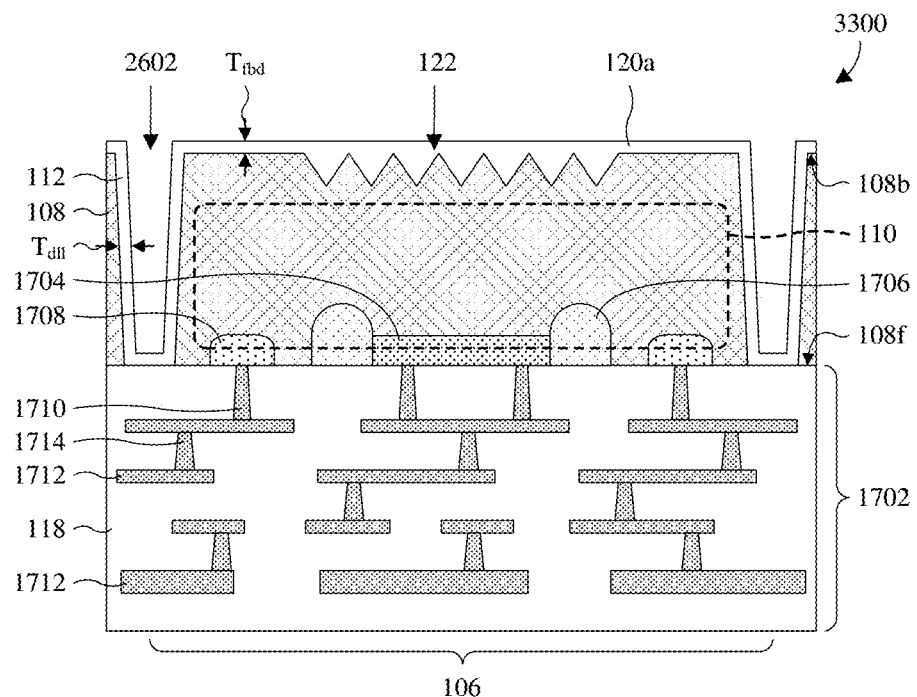

As illustrated by the cross-sectional view 3300 of FIG. 33, a top surface of the first back side dielectric layer 120a is flattened. Further, the first back side dielectric layer 120a is etched back to reduce the thickness $T_{fbd}$ of the first back side dielectric layer 120a at top and bottom surfaces of the first back side dielectric layer 120a. The flattening may, for example, be performed by a CMP and/or some other suitable planarization process.

Figure 34A:
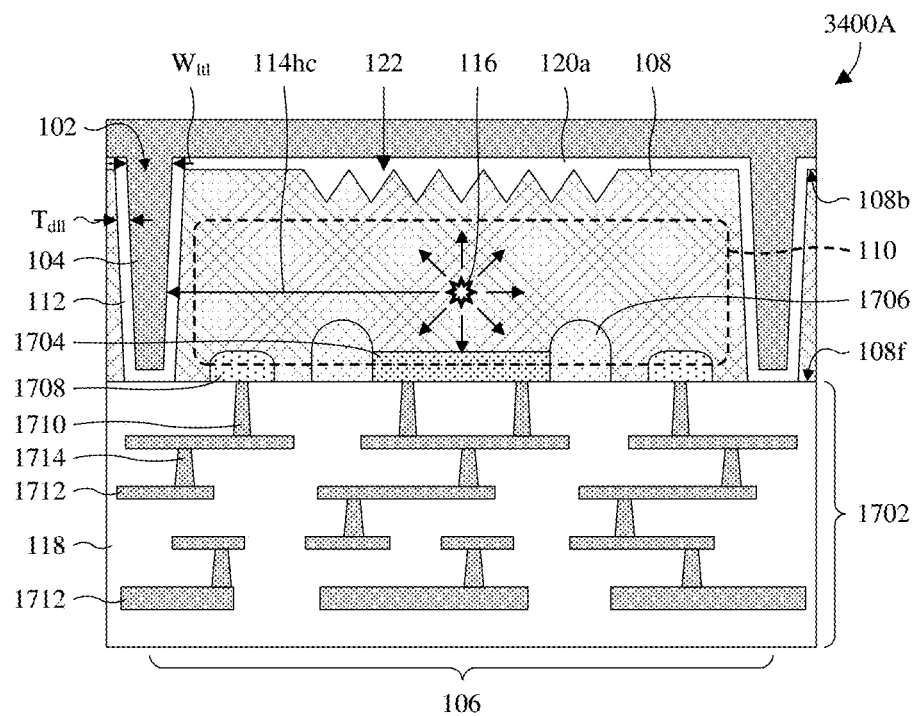
Figure 34B:
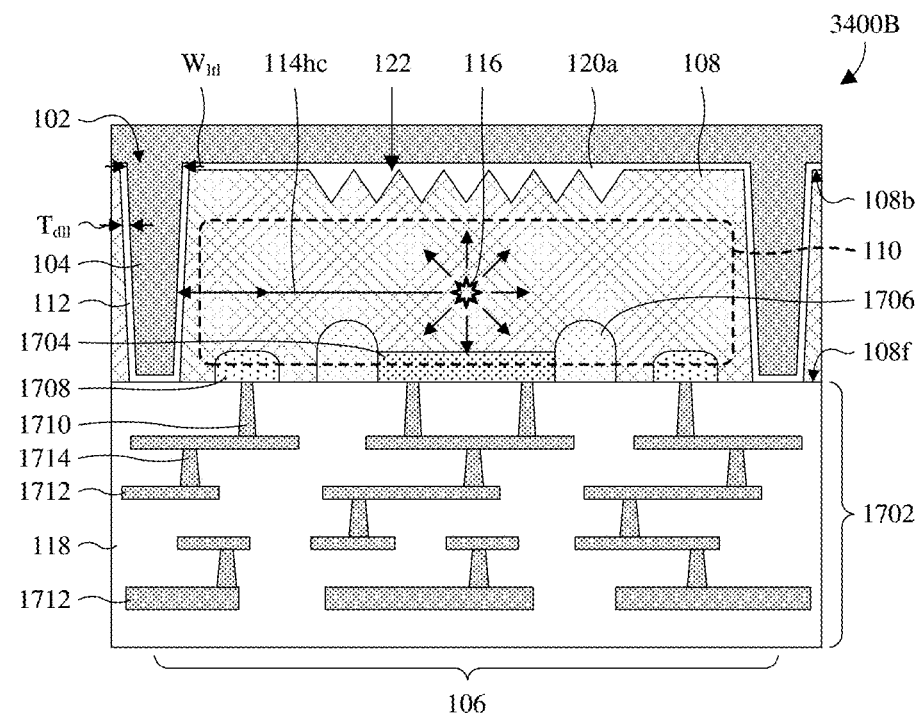

As illustrated by the cross-sectional views 3400A, 3400B of FIGS. 34A and 34B, a low-transmission layer 104 is deposited filling the inter-pixel isolation trench 2602 (see, e.g., FIG. 33) over the dielectric liner layer 112. FIGS. 34A and 34B are alternative of each other and hence each individually illustrates the deposition. FIG. 34A proceeds from FIG. 33, whereas FIG. 34B proceeds from alternative embodiments of FIG. 33 in which the dielectric liner layer 112 is deposited or otherwise formed with a lesser thickness $T_{dll}$.

In FIG. 34A, the low-transmission layer 104 and the dielectric liner layer 112 define an inter-pixel trench isolation structure 102 as described with regard to FIG. 27B. The low-transmission layer 104 has a low transmission and a high absorption, whereas the dielectric liner layer 112 is configured for TIR. The dielectric liner layer 112 reflects radiation by TIR, and the low-transmission layer 104 absorbs radiation not reflected by TIR, to respectively increase QE and reduce crosstalk. In FIG. 34B, the low-transmission layer 104 and the dielectric liner layer 112 define an inter-pixel trench isolation structure 102 as described with regard to FIG. 27A. The low-transmission layer 104 has a low transmission and a high reflection, whereas the dielectric liner layer 112 has low absorption. In some embodiments, the dielectric liner layer 112 is transparent. The low-transmission layer 104 reflects radiation to reduce crosstalk and increase QE.

Figure 35:
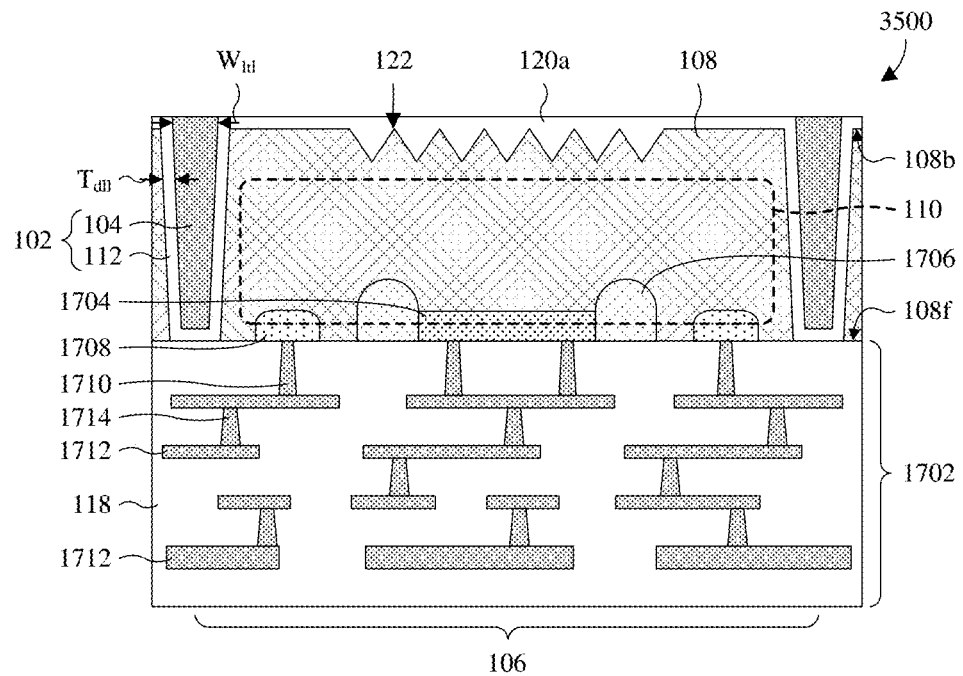

As illustrated by the cross-sectional view 3500 of FIG. 35, a top surface of the low-transmission layer 104 is recessed to uncover the first back side dielectric layer 120a as described with regard to FIG. 28. The recessing may be performed on the low-transmission layer 104 in any of FIGS. 34A and 34B but is illustrated using the low-transmission layer 104 in FIG. 34A. As noted above, FIGS. 34A and 34B are alternatives of each other.

Figure 36:
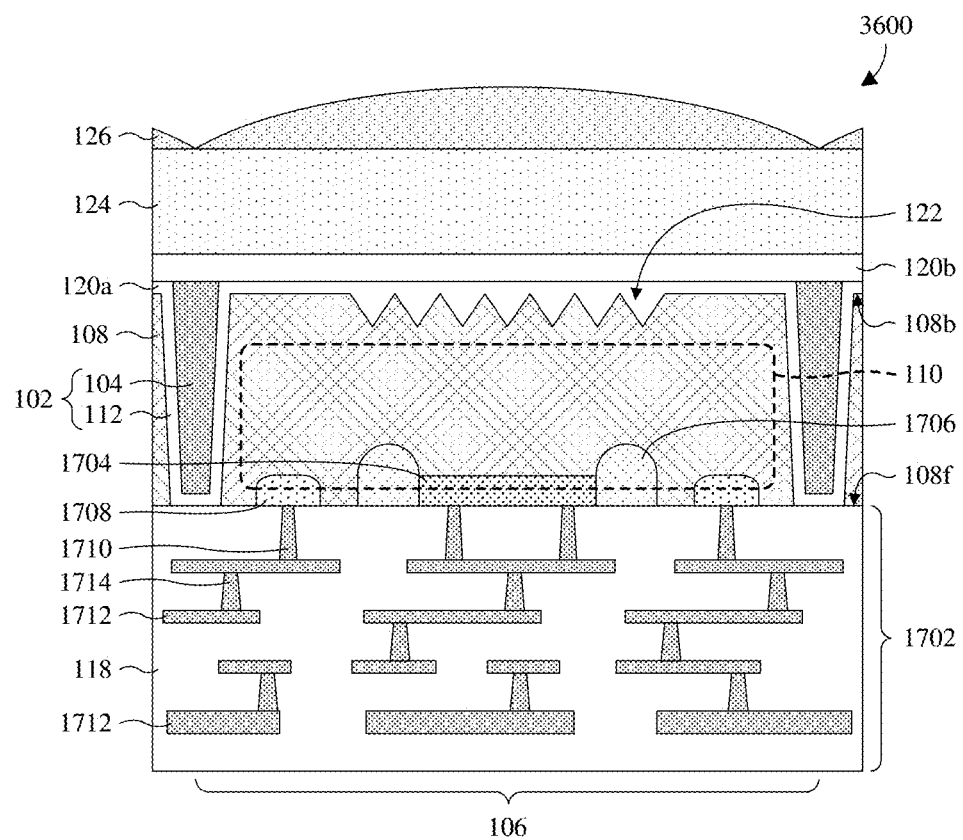

As illustrated by the cross-sectional view 3600 of FIG. 36, a second back side dielectric layer 120b and a spacer layer 124 are deposited over the inter-pixel trench isolation structure 102 and the first back side dielectric layer 120a. Further, micro lenses 126 are formed over the spacer layer 124. The second back side dielectric layer 120b and the spacer layer 124 may, for example, be or comprise silicon oxide and/or some other suitable dielectric(s).

While FIGS. 31-33, 34A, 34B, 35, and 36 are described with reference to various embodiments of a method, it will be appreciated that the structures shown in FIGS. 31-33, 34A, 34B, 35, and 36 are not limited to the method but rather may stand alone separate of the method. While FIGS. 31-33, 34A, 34B, 35, and 36 are described as a series of acts, it will be appreciated that the order of the acts may be altered in other embodiments. While FIGS. 31-33, 34A, 34B, 35, and 36 illustrate and describe as a specific set of acts, some acts that are illustrated and/or described may be omitted in other embodiments. Further, acts that are not illustrated and/or described may be included in other embodiments.

With reference to FIG. 3700, a block diagram 3700 of some embodiments of the method of FIGS. 31-33, 34A, 34B, 35, and 36 is provided.

At 3702, a photodetector is formed in a substrate from a front side of the substrate. See, for example, FIGS. 31 and 21.

At 3704, an interconnect structure is formed covering and electrically coupled to the photodetector on the front side of the substrate. See, for example, FIGS. 31 and 22.

At 3706, a back side of the substrate is patterned to form a periodic pattern overlying the photodetector. See, for example, FIGS. 31 and 23.

At 3708, the back side of the substrate is patterned to form an inter-pixel isolation trench surrounding the photodetector along a boundary of a pixel at which the photodetector is located. See, for example, FIG. 31.

At 3710, a first back side dielectric layer is deposited covering the back side of the substrate and lining the inter-pixel isolation trench. See, for example, FIG. 32.

At 3712, a top surface of the first back side dielectric layer is flattened and etched back. See, for example, FIG. 33.

At 3714, a low-transmission layer is deposited filling the inter-pixel isolation trench and covering the first back side dielectric layer. See, for example, FIGS. 34A and 34B.

At 3716, a top surface of the low-transmission layer is recessed to uncover the first back side dielectric layer. See, for example, FIG. 35.

At 3718, a second back side dielectric layer and a spacer layer are deposited covering the first back side dielectric layer and the low-transmission layer. See, for example, FIG. 36.

At 3720, a micro lens is formed covering the photodetector. See, for example, FIG. 36.

Figure 37:
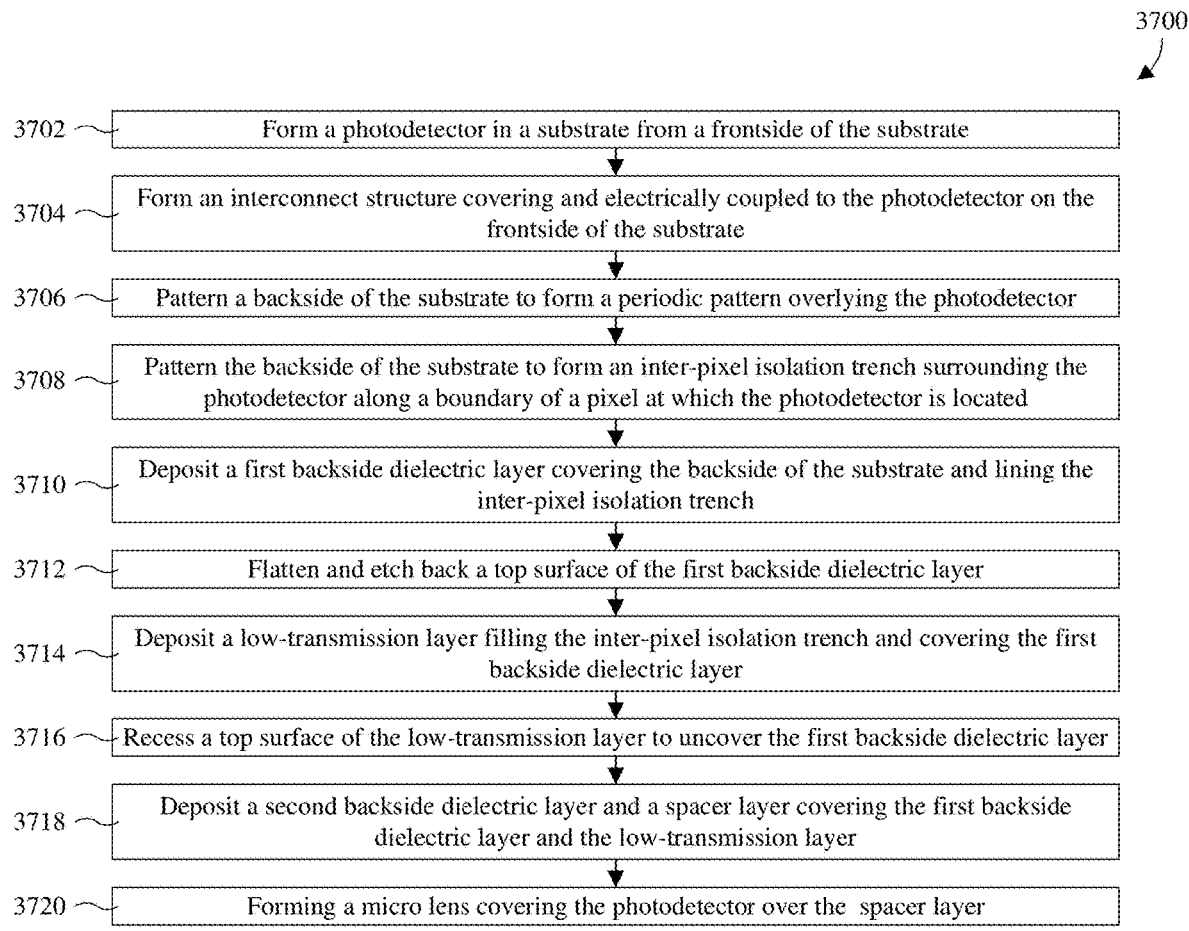
FIG. 37 illustrates a block diagram of some embodiments of the method of FIGS. 31-33, 34A, 34B, 35, and 36.

While the block diagram 3700 of FIG. 37 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 38, 39, 40A, 40B, 41, and 42, a series of cross-sectional views 3800, 3900, 4000A, 4000B, 4100, 4200 of some alternative embodiments of the method of FIGS. 21-26, 27A, 27B, 28, and 29 is provided in which the dielectric liner layer 112 is deposited covering the first back side dielectric layer 120a.

Figure 38:
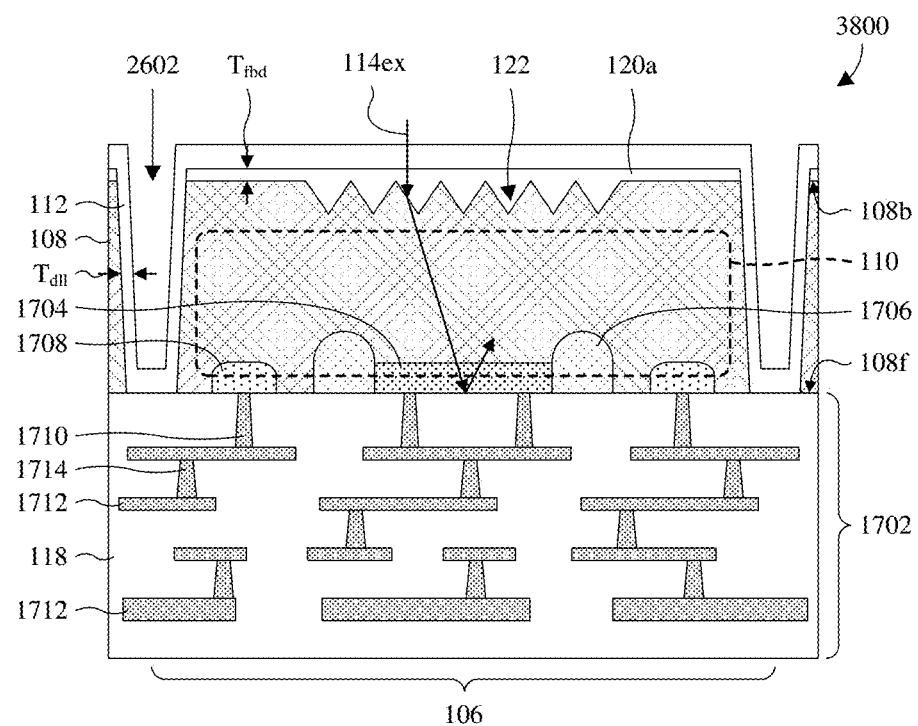
FIGS. 38, 39, 40A, 40B, 41, and 42 illustrate a series of cross-sectional views of some alternative embodiments of the method of FIGS. 21-26, 27A, 27B, 28, and 29 in which a dielectric liner layer is deposited covering a first back side dielectric layer.

As illustrated by the cross-sectional view 3800 of FIG. 38, the acts at FIGS. 21-26 are performed. A photodetector 110 is formed in a substrate 108 from a front side 108f of the substrate 108 as described with regard to FIG. 21. A front side dielectric structure 118 and an interconnect structure 1702 are formed covering the photodetector 110 on the front side 108f of the substrate 108 as described with regard to FIG. 22. A back side 108b of the substrate 108 is patterned to form a periodic pattern directly over the photodetector 110 as described with regard to FIG. 23. A first back side dielectric layer 120a is deposited covering the back side 108b of the substrate 108 and the periodic pattern as described with regard to FIG. 24. Collectively, the first back side dielectric layer 120a and the substrate 108 define a diffuser 122 at the periodic pattern. A top surface of the first back side dielectric layer 120a is flattened as described with regard to FIG. 25. The first back side dielectric layer 120a and the substrate 108 are patterned to define an inter-pixel isolation trench 2602 as described with regard FIG. 26.

Also illustrated by the cross-sectional view 3800 of FIG. 38, a dielectric liner layer 112 is deposited covering the first back side dielectric layer 120a and lining the inter-pixel isolation trench 2602. The dielectric liner layer 112 may, for example, be deposited by CVD, PVD, or some other suitable deposition process. In some embodiments, a thickness $T_{dll}$ of the dielectric liner layer 112 is greater at top and bottom surfaces of the dielectric liner layer 112 than at sidewalls of the dielectric liner layer 112 due to the deposition process. The dielectric liner layer 112 may, for example, be as described with regard to FIGS. 27A and 27B.

Figure 39:
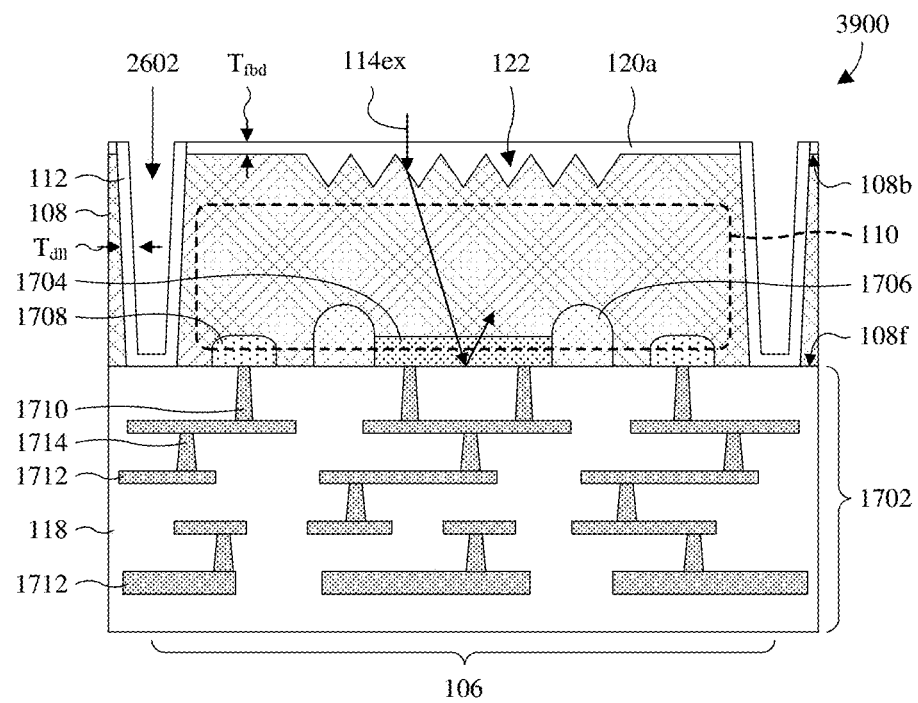

As illustrated by the cross-sectional view 3900 of FIG. 39, the dielectric liner layer 112 is etched back to reduce the thickness $T_{dll}$ of the dielectric liner layer 112 at top and bottom surfaces of the dielectric liner layer 112.

Figure 40A:
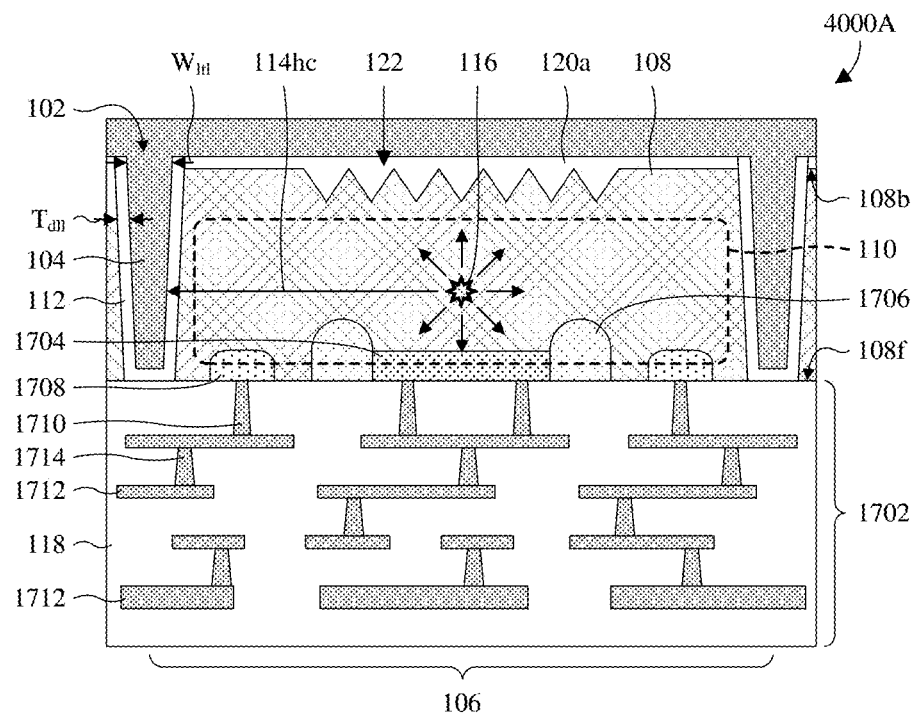
Figure 40B:
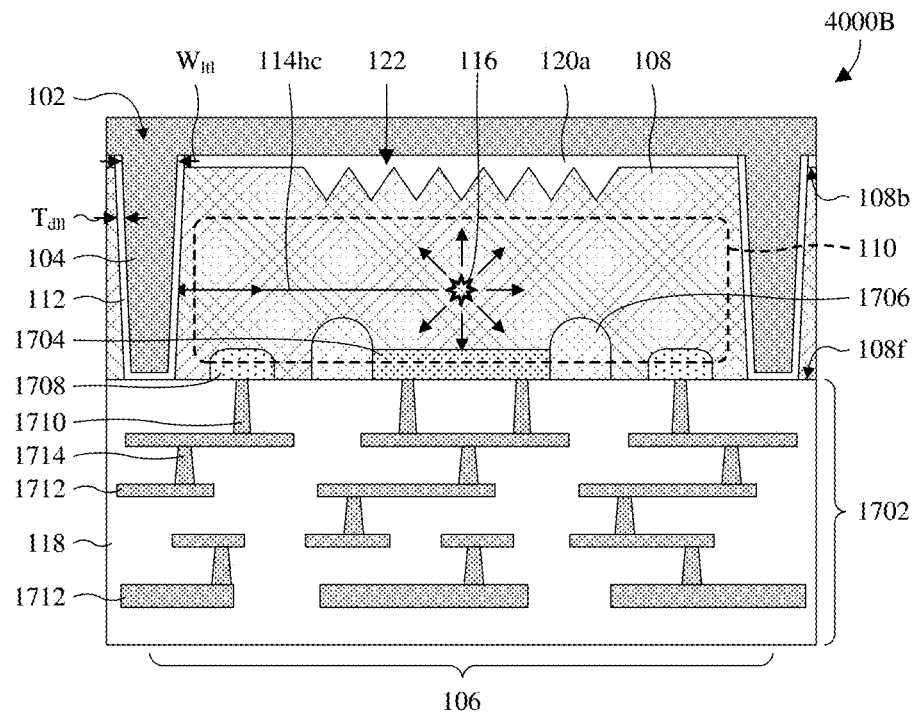

As illustrated by the cross-sectional views 4000A, 4000B of FIGS. 40A and 40B, a low-transmission layer 104 is deposited filling the inter-pixel isolation trench 2602 (see, e.g., FIG. 39) over the dielectric liner layer 112. FIGS. 40A and 40B are alternative of each other and hence each individually illustrates the deposition. FIG. 40A proceeds from FIG. 39, whereas FIG. 40B proceeds from alternative embodiments of FIG. 39 in which the dielectric liner layer 112 is deposited or otherwise formed with a lesser thickness $T_{dll}$.

In FIG. 40A, the low-transmission layer 104 and the dielectric liner layer 112 define an inter-pixel trench isolation structure 102 as described with regard to FIG. 27B. The low-transmission layer 104 has a low transmission and a high absorption, whereas the dielectric liner layer 112 is configured for TIR. The dielectric liner layer 112 reflects radiation by TIR, and the low-transmission layer 104 absorbs radiation not reflected by TIR, to respectively increase QE and reduce crosstalk. In FIG. 40B, the low-transmission layer 104 and the dielectric liner layer 112 define an inter-pixel trench isolation structure 102 as described with regard to FIG. 27A. The low-transmission layer 104 has a low transmission and a high reflection, whereas the dielectric liner layer 112 has low absorption. In some embodiments, the dielectric liner layer 112 is transparent. The low-transmission layer 104 reflects radiation to reduce crosstalk and increase QE.

Figure 41:
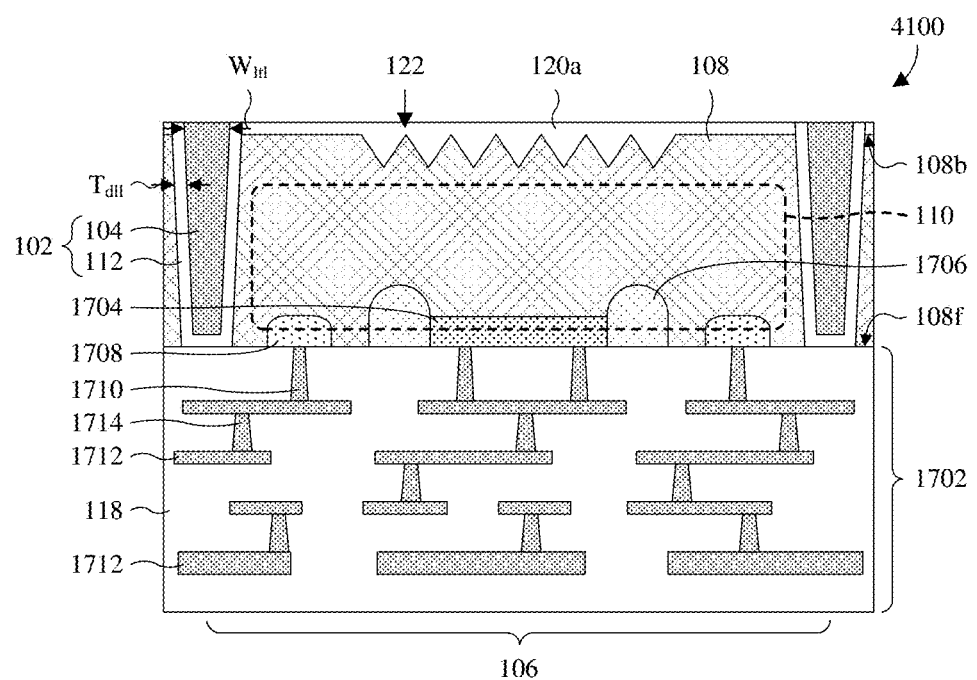

As illustrated by the cross-sectional view 4100 of FIG. 41, a top surface of the low-transmission layer 104 is recessed to uncover the first back side dielectric layer 120a as described with regard to FIG. 28. The recessing may be performed on the low-transmission layer 104 in any of FIGS. 40A and 40B but is illustrated using the low-transmission layer 104 in FIG. 40A. As noted above, FIGS. 40A and 40B are alternatives of each other.

Figure 42:
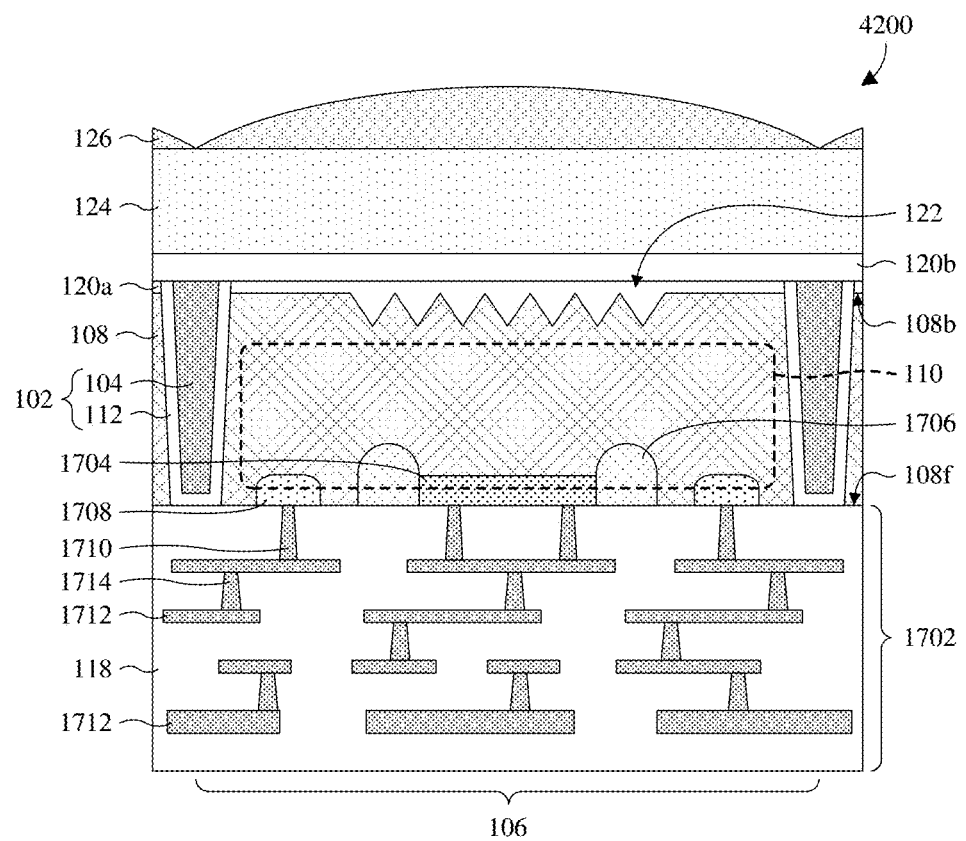

As illustrated by the cross-sectional view 4200 of FIG. 42, a second back side dielectric layer 120b and a spacer layer 124 are deposited over the inter-pixel trench isolation structure 102 and the first back side dielectric layer 120a. Further, micro lenses 126 are formed over the spacer layer 124. The second back side dielectric layer 120b and the spacer layer 124 may, for example, be or comprise silicon oxide and/or some other suitable dielectric(s).

While FIGS. 38, 39, 40A, 40B, 41, and 42 are described with reference to various embodiments of a method, it will be appreciated that the structures shown in FIGS. 38, 39, 40A, 40B, 41, and 42 are not limited to the method but rather may stand alone separate of the method. While FIGS. 38, 39, 40A, 40B, 41, and 42 are described as a series of acts, it will be appreciated that the order of the acts may be altered in other embodiments. While FIGS. 38, 39, 40A, 40B, 41, and 42 illustrate and describe as a specific set of acts, some acts that are illustrated and/or described may be omitted in other embodiments. Further, acts that are not illustrated and/or described may be included in other embodiments.

With reference to FIG. 4300, a block diagram 4300 of some embodiments of the method of FIGS. 38, 39, 40A, 40B, 41, and 42 is provided.

At 4302, a photodetector is formed in a substrate from a front side of the substrate. See, for example, FIGS. 38 and 21.

At 4304, an interconnect structure is formed covering and electrically coupled to the photodetector on the front side of the substrate. See, for example, FIGS. 38 and 22.

At 4306, a back side of the substrate is patterned to form a periodic pattern overlying the photodetector. See, for example, FIGS. 38 and 23.

At 4308, a first back side dielectric layer is deposited covering the back side of the substrate and the periodic pattern. See, for example, FIGS. 38 and 24.

At 4310, a top surface of the first back side dielectric layer is flattened. See, for example, FIGS. 38 and 25.

At 4312, the first back side dielectric layer and the back side of the substrate are patterned to form an inter-pixel isolation trench surrounding the photodetector along a boundary of a pixel at which the photodetector is located. See, for example, FIGS. 38 and 36.

At 4314, a dielectric liner layer is deposited lining the inter-pixel isolation trench and covering the first back side dielectric layer. See, for example, FIG. 38.

At 4316, the dielectric liner layer is etched back. See, for example, FIG. 39.

At 4318, a low-transmission layer is deposited filling the inter-pixel isolation trench over the dielectric liner layer and covering the first back side dielectric layer. See, for example, FIGS. 40A and 40B.

At 4320, a top surface of the low-transmission layer is recessed to uncover the first back side dielectric layer. See, for example, FIG. 41.

At 4322, a second back side dielectric layer and a spacer layer are deposited covering the first back side dielectric layer and the low-transmission layer. See, for example, FIG. 42.

At 4324, a micro lens is formed covering the photodetector over the spacer layer. See, for example, FIG. 42.

Figure 43:
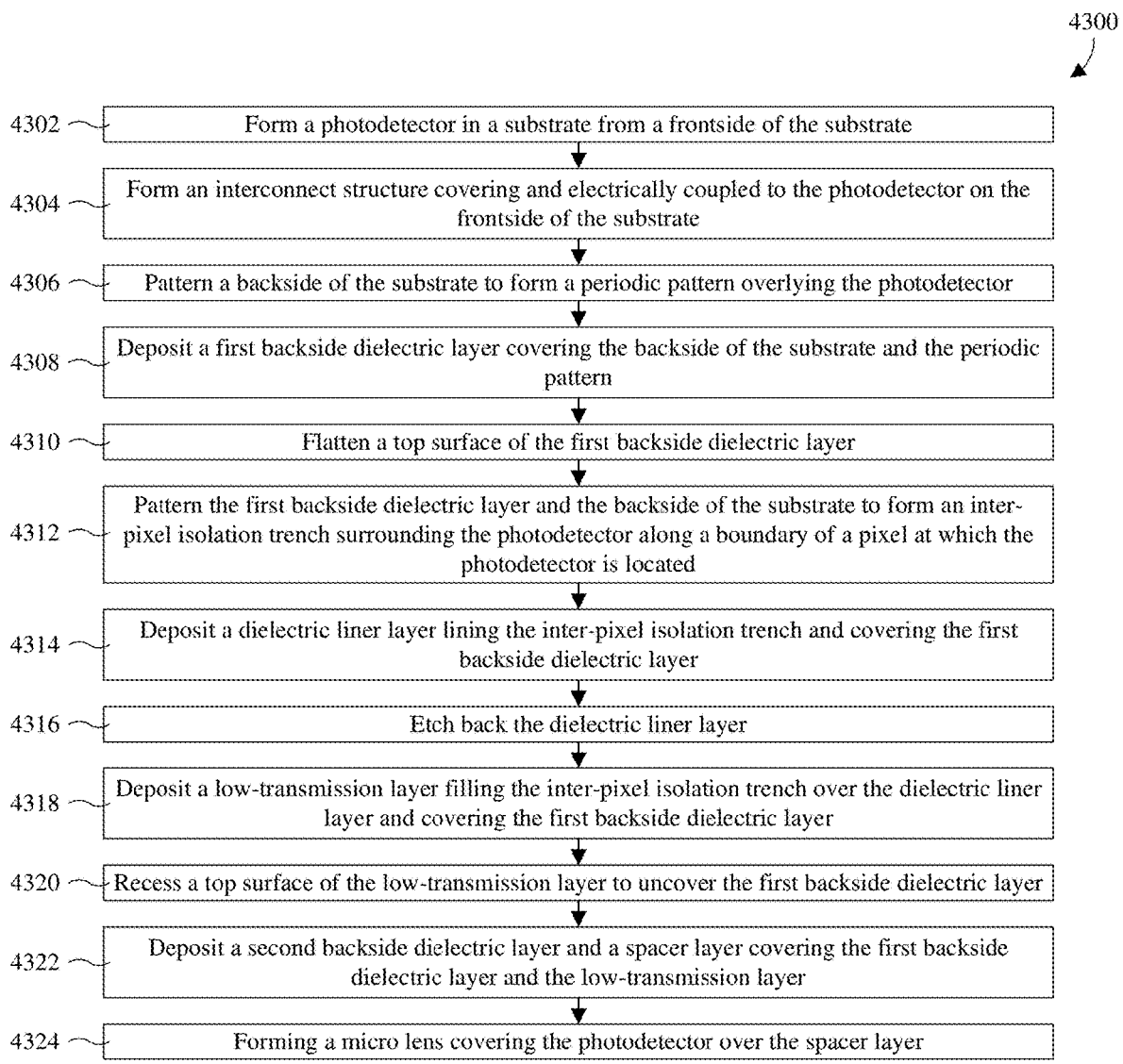
FIG. 43 illustrates a block diagram of some embodiments of the method of FIGS. 38, 39, 40A, 40B, 41, and 42.

While the block diagram 4300 of FIG. 43 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 44-47, 48A, 48B, 49, and 50, a series of cross-sectional views 4400-4700, 4800A, 4800B, 4900, and 5000 of some alternative embodiments of the method of FIGS. 21-26, 27A, 27B, 28, and 29 is provided in which the image sensor further comprises an intra-pixel trench isolation structure. The method may, for example, be employed to form the image sensor in any of FIGS. 12, 13A-13C, 14A, 14B, 15, and 16 and other suitable image sensors.

Figure 44:
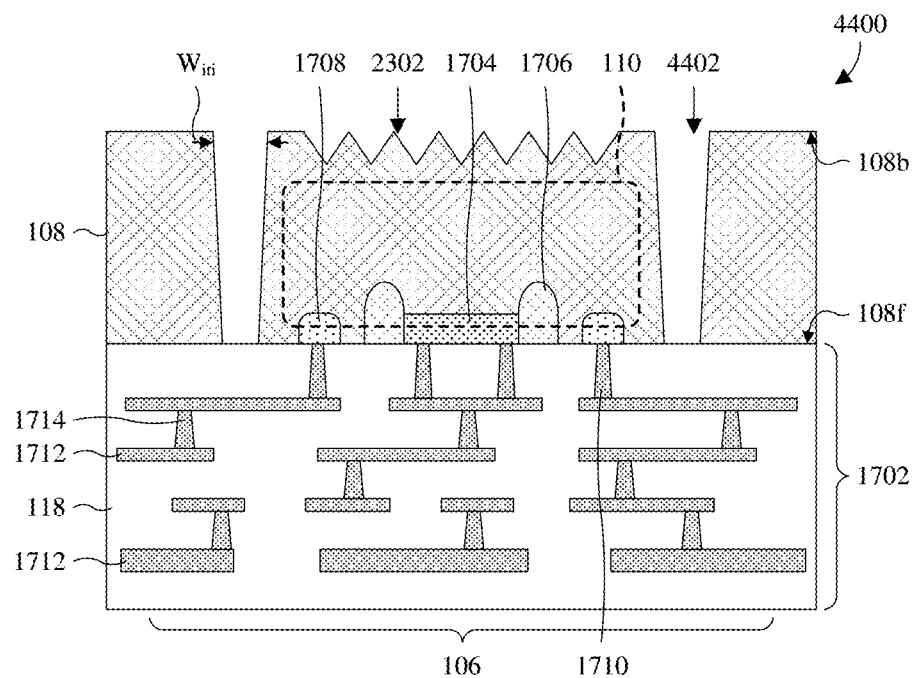
FIGS. 44-47, 48A, 48B, 49, and 50 illustrate a series of cross-sectional views of some alternative embodiments of the method of FIGS. 21-26, 27A, 27B, 28, and 29 in which the image sensor further comprises an intra-pixel trench isolation structure.

As illustrated by the cross-sectional view 4400 of FIG. 44, the acts at FIGS. 21-23 are performed. A photodetector 110 is formed in a substrate 108 from a front side 108f of the substrate 108 as described with regard to FIG. 21. A front side dielectric structure 118 and an interconnect structure 1702 are formed covering the photodetector 110 on the front side 108f of the substrate 108 as described with regard to FIG. 22. A back side 108b of the substrate 108 is patterned to form a periodic pattern 2302 directly over the photodetector 110 as described with regard to FIG. 23.

Also illustrated by the cross-sectional view 4400 of FIG. 44, the substrate 108 is patterned to define an intra-pixel isolation trench 4402. The intra-pixel isolation trench 4402 may, for example, also be known as an inner isolation trench. The intra-pixel isolation trench 4402 has a pair of segments respectively on opposite sides of the photodetector 110. The patterning may, for example, be performed by a photolithography/etching process or some other suitable patterning process. In some embodiments, the patterning to form the intra-pixel isolation trench 4402 is independent of the patterning to form the periodic pattern 2302. For example, the intra-pixel isolation trench 4402 and the periodic pattern 2302 may be formed using different photolithography/etching processes with difference masks.

In some embodiments, the intra-pixel isolation trench 4402 extends in a closed path to surround the photodetector 110 when viewed top down. In some embodiments, the intra-pixel isolation trench 4402 has the same top layout as the intra-pixel trench isolation structure 1202 in any of FIGS. 13A-13C and 16. In some embodiments, a width $W_{iti}$ of the intra-pixel isolation trench 4402 greater than about 100 nanometers, about 200 nanometers, about 500 nanometers, or some other suitable value. Further, in some embodiments, the width $W_{iti}$ is about 100-200 nanometers, about 200 nanometers, about 200-500 nanometers, or some other suitable value.

As seen hereafter, an intra-pixel trench isolation structure is formed in the intra-pixel isolation trench 4402 and is configured to reflect incident radiation by TIR. If the width $W_{iti}$ is too small (e.g., less than about 100 nanometers or some other suitable value), TIR at the sidewall interfaces may be low. If an inter-pixel trench isolation structure surrounding the intra-pixel trench isolation structure has high absorption, the low TIR may result in high QE losses. If the width $W_{iti}$ is too large (e.g., greater than about 500 nanometers or some other suitable value), the size of the photodetector 110 may be small and/or the size of the pixel 106 may be large. The former leads to poor performance of the photodetector 110 and the latter leads to low pixel density.

Figure 45:
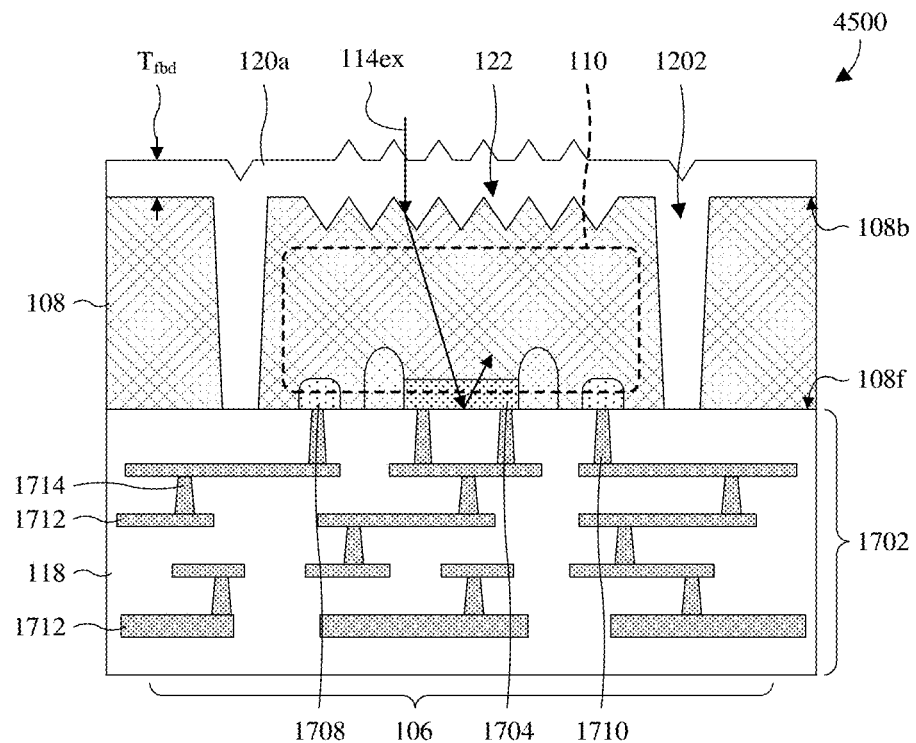

As illustrated by the cross-sectional view 4500 of FIG. 45, a first back side dielectric layer 120a is deposited covering the back side 108b of the substrate 108 and filling the intra-pixel isolation trench 4402. The first back side dielectric layer 120a has a higher refractive index than the substrate 108 to promote TR at an interface between the first back side dielectric layer 120a and the substrate 108. Further, a top surface of the first back side dielectric layer 120a is rough at least at the periodic pattern 2302 (see, e.g., FIG. 44). The first back side dielectric layer 120a may, for example, be or comprise silicon oxide and/or some other suitable dielectric(s).

Collectively, the first back side dielectric layer 120a and the substrate 108 define a diffuser 122 configured to scatter external radiation 114ex at the periodic pattern 2302 (see, e.g., FIG. 44). Further, a portion of the first back side dielectric layer 120a in the intra-pixel isolation trench 4402 defines an intra-pixel trench isolation structure 1202. The intra-pixel trench isolation structure 1202 may, for example, have a top layout as illustrated at any of FIGS. 13A-13C or may have some other suitable top layout.

Figure 46:
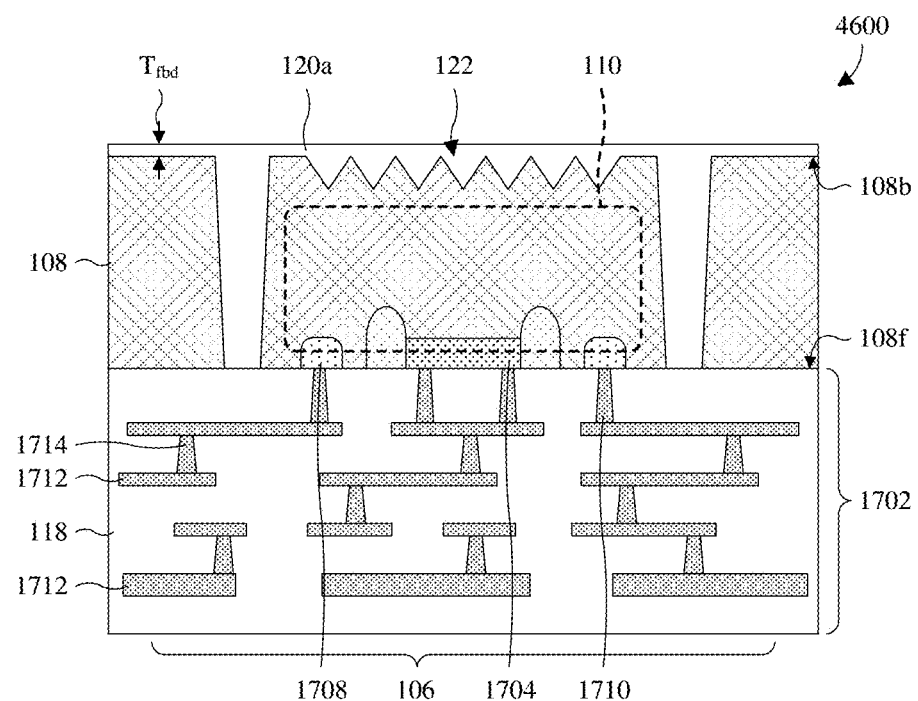
Figure 47:
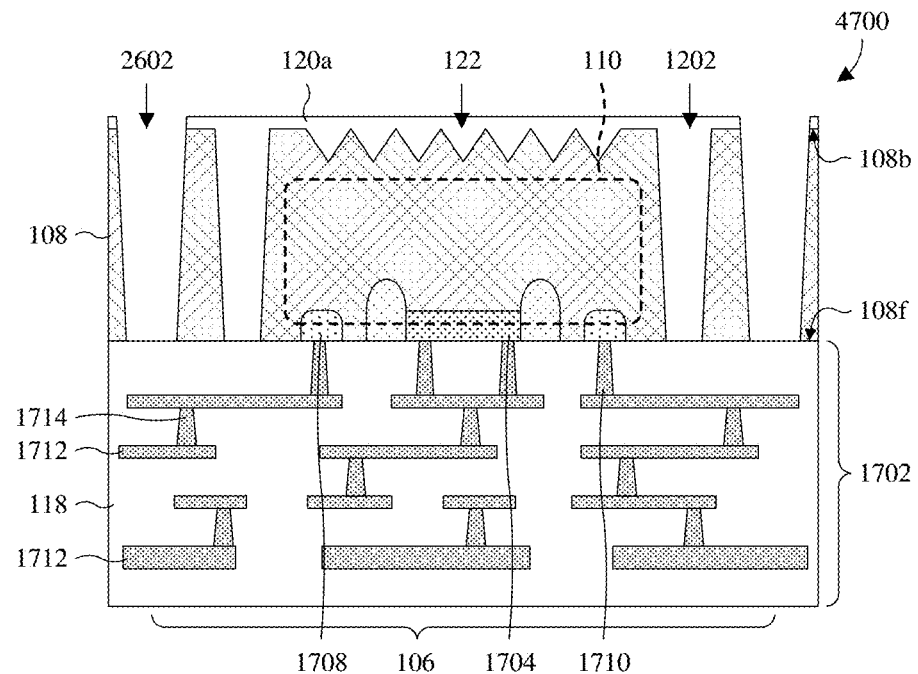
Figure 48A:
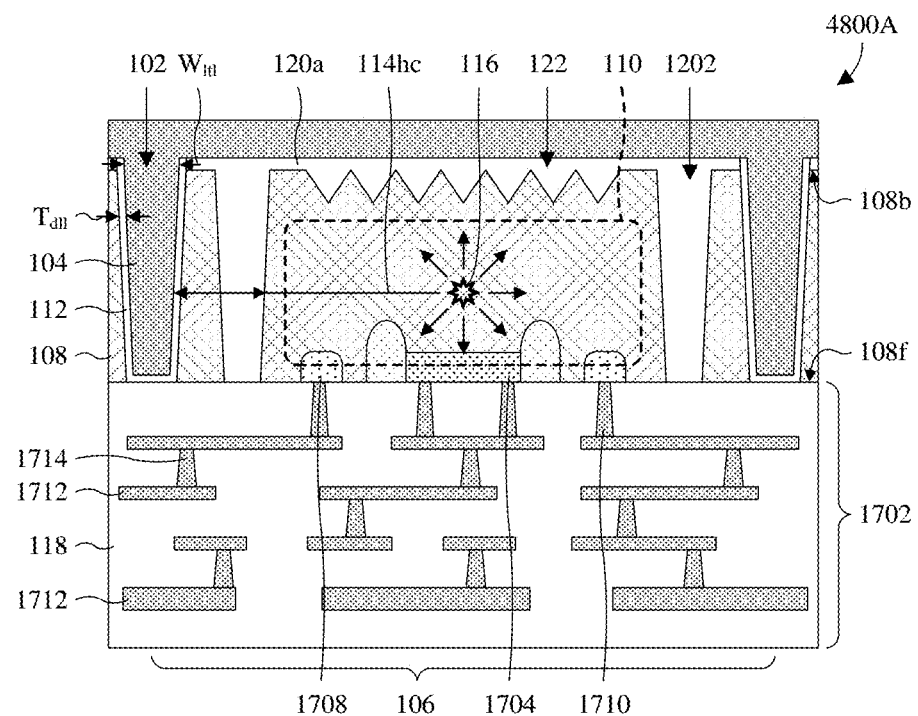
Figure 48B:
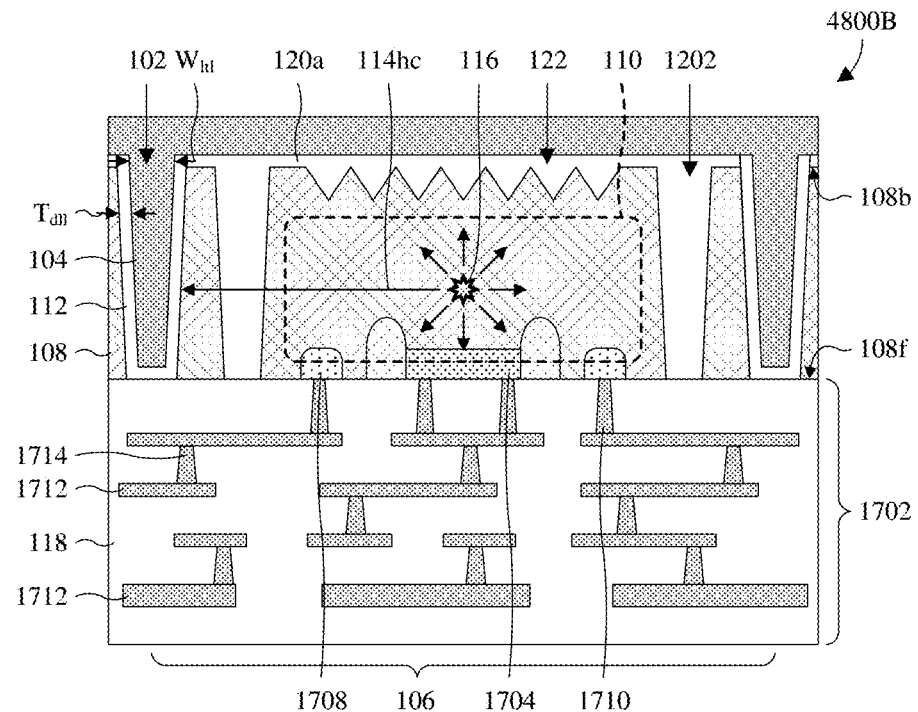
Figure 49:
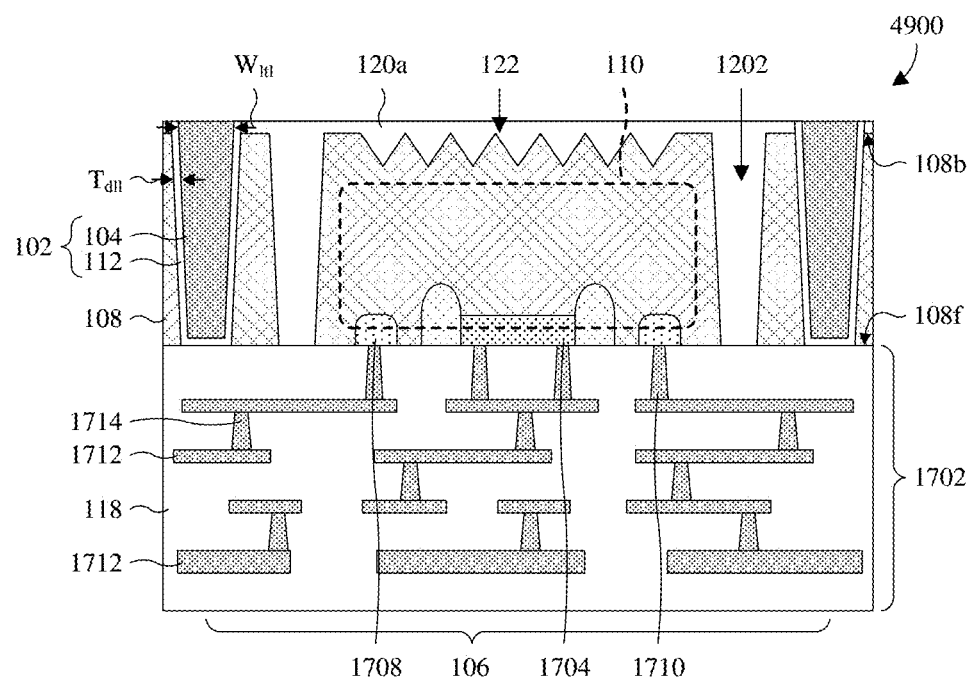
Figure 50:
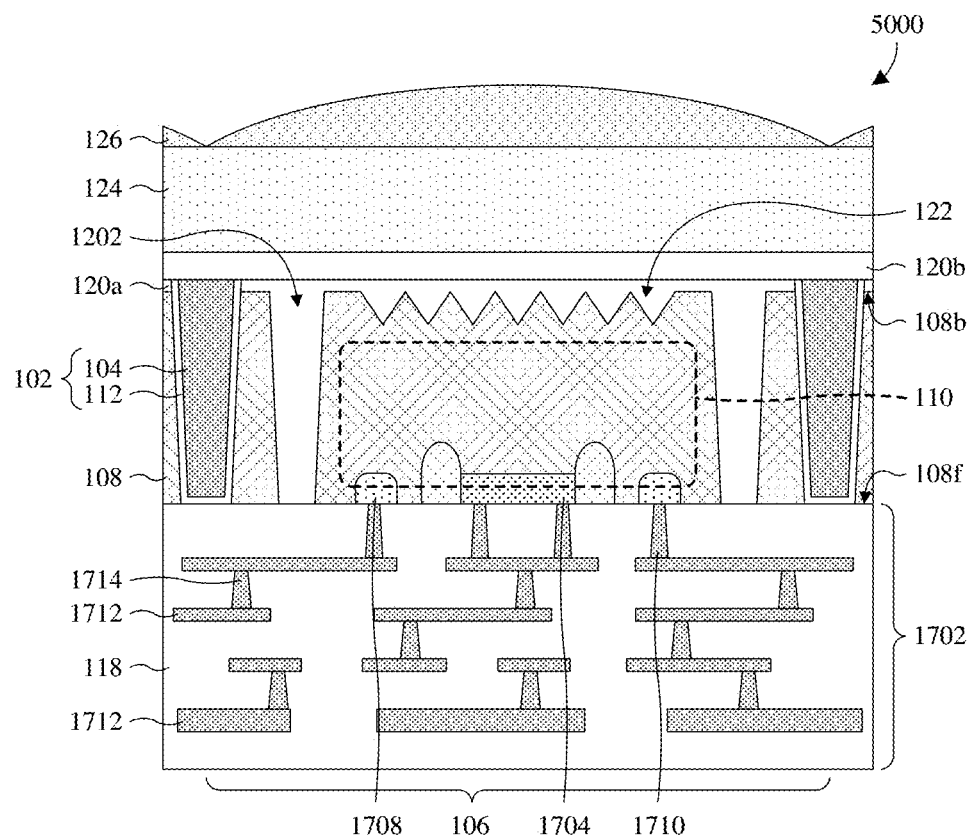

As illustrated by the cross-sectional view 4600 of FIG. 46, a top surface of the first back side dielectric layer 120a is flattened. Further, the first back side dielectric layer 120a is etched back to reduce the thickness $T_{fbd}$ of the first back side dielectric layer 120a at top and bottom surfaces of the first back side dielectric layer 120a. The flattening may, for example, be performed by a CMP and/or some other suitable planarization process.

As illustrated by the cross-sectional views 4700, 4800A, 4800B, 4900, 5000 of FIGS. 47, 48A, 48B, 49, and 50, the acts at FIGS. 26, 27A, 27B, 28, and 29 are performed. At FIG. 47, the first back side dielectric layer 120a and the substrate 108 are patterned to define an inter-pixel isolation trench 2602 as described with regard to FIG. 26. The inter-pixel isolation trench 2602 may, for example, have the same top layout as the inter-pixel trench isolation structure 102 in any of FIGS. 13A-13C or some other suitable top layout. At FIGS. 48A and 48B, a dielectric liner layer 112 and a low-transmission layer 104 are deposited filling the inter-pixel isolation trench 2602 (see, e.g., FIG. 47) as described respectively with regard to FIGS. 27A and 27B. Collectively, the low-transmission layer 104 and the dielectric liner layer 112 define an inter-pixel trench isolation structure 102. The inter-pixel trench isolation structure 102 may, for example, have a top layout as in any of FIGS. 13A-13C or some other suitable top layout. At FIG. 49, a top surface of the low-transmission layer 104 is recessed to uncover the first back side dielectric layer 120a as described with regard to FIG. 28. At FIG. 50, a second back side dielectric layer 120b, a spacer layer 124, and micro lenses 126 are formed as described with regard to FIG. 29.

While FIGS. 44-47, 48A, 48B, 49, and 50 are described with reference to various embodiments of a method, it will be appreciated that the structures shown in FIGS. 44-47, 48A, 48B, 49, and 50 are not limited to the method but rather may stand alone separate of the method. While FIGS. 44-47, 48A, 48B, 49, and 50 are described as a series of acts, it will be appreciated that the order of the acts may be altered in other embodiments. While FIGS. 44-47, 48A, 48B, 49, and 50 illustrate and describe as a specific set of acts, some acts that are illustrated and/or described may be omitted in other embodiments. Further, acts that are not illustrated and/or described may be included in other embodiments. For example, the acts at FIGS. 31-33, 34A, 34B, 35, and 36 may instead be performed in place of the acts at FIGS. 47, 48A, 48B, 49 and 50.

Figure 51:
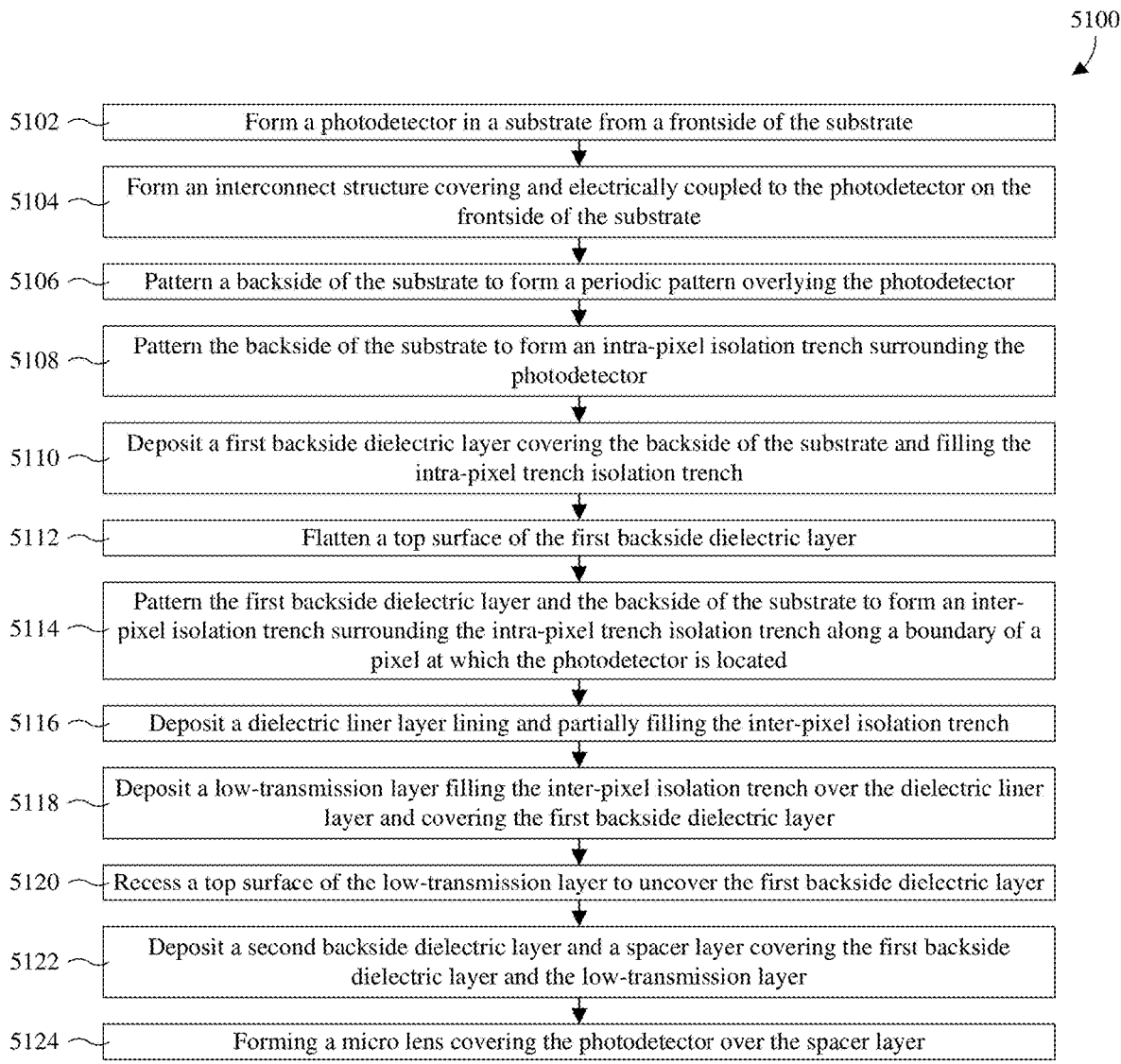
FIG. 51 illustrates a block diagram of some embodiments of the method of FIGS. 44-47, 48A, 48B, 49, and 50.

With reference to FIG. 51, a block diagram 5100 of some embodiments of the method of FIGS. 44-47, 48A, 48B, 49, and 50 is provided.

At 5102, a photodetector is formed in a substrate from a front side of the substrate. See, for example, FIGS. 44 and 21.

At 5104, an interconnect structure is formed covering and electrically coupled to the photodetector on the front side of the substrate. See, for example, FIGS. 44 and 22.

At 5106, a back side of the substrate is patterned to form a periodic pattern overlying the photodetector. See, for example, FIGS. 44 and 23.

At 5108, the back side of the substrate is patterned to form an intra-pixel isolation trench surrounding the photodetector. See, for example, FIG. 44.

At 5110, a first back side dielectric layer is deposited covering the back side of the substrate and filling the intra-pixel isolation trench. See, for example, FIG. 45.

At 5112, a top surface of the first back side dielectric layer is flattened and etched back. See, for example, FIG. 46.

At 5114, the first back side dielectric layer and the back side of the substrate are patterned to form an inter-pixel isolation trench surrounding the intra-pixel trench isolation trench along a boundary of a pixel at which the photodetector is located. See, for example, FIG. 47.

At 5116, a dielectric liner layer is deposited lining and partially filling the inter-pixel isolation trench. See, for example, FIGS. 48A and 48B.

At 5118, a low-transmission layer is deposited filling the inter-pixel isolation trench over the dielectric liner layer and covering the first back side dielectric layer. See, for example, FIGS. 48A and 48B.

At 5120, a top surface of the low-transmission layer is recessed to uncover the first back side dielectric layer. See, for example, FIG. 49.

At 5122, a second back side dielectric layer and a spacer layer are deposited covering the first back side dielectric layer and the low-transmission layer. See, for example, FIG. 50.

At 5124, a micro lens is formed covering the photodetector over the spacer layer. See, for example, FIG. 50.

While the block diagram 5100 of FIG. 51 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 52-54, 55A, 55B, and 56-58, a series of cross-sectional views 5200-5400, 5500A, 5500B, and 5600-5800 of some alternative embodiments of the method of FIGS. 21-26, 27A, 27B, 28, and 29 is provided in which the image sensor is FSI. The method may, for example, be employed to form the image sensor in any of FIGS. 18 and 20 and other suitable image sensors.

Figure 52:
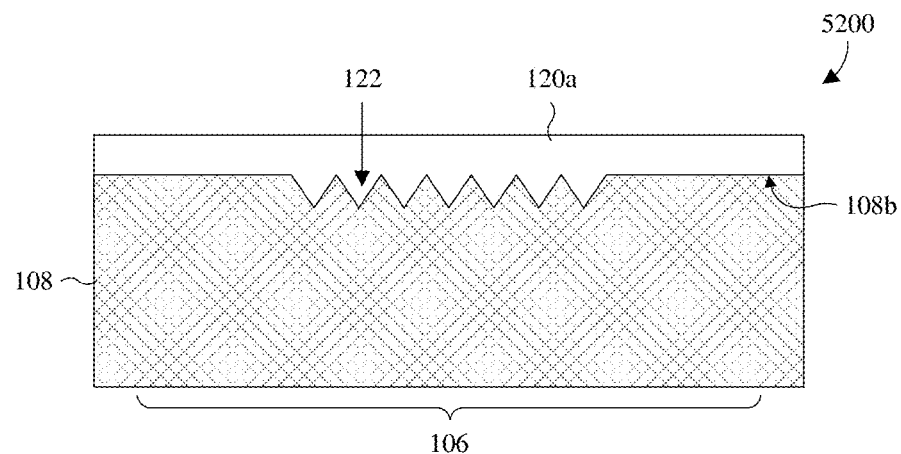
FIGS. 52-54, 55A, 55B, and 56-58 illustrate a series of cross-sectional views of some alternative embodiments of the method of FIGS. 21-26, 27A, 27B, 28, and 29 in which the image sensor is FSI.

As illustrated by the cross-sectional view 5200 of FIG. 52, the acts at FIGS. 23-25 are performed. A back side 108*b* of a substrate 108 is patterned to form a periodic pattern at a pixel 106 as described with regard to FIG. 23. A first back side dielectric layer 120*a* is deposited covering the back side 108*b* of the substrate 108 and the periodic pattern as described with regard to FIG. 24. Collectively, the first back side dielectric layer 120*a* and the substrate 108 define a diffuser 122 at the periodic pattern. A top surface of the first back side dielectric layer 120*a* is flattened as described with regard to FIG. 25.

Figure 53:
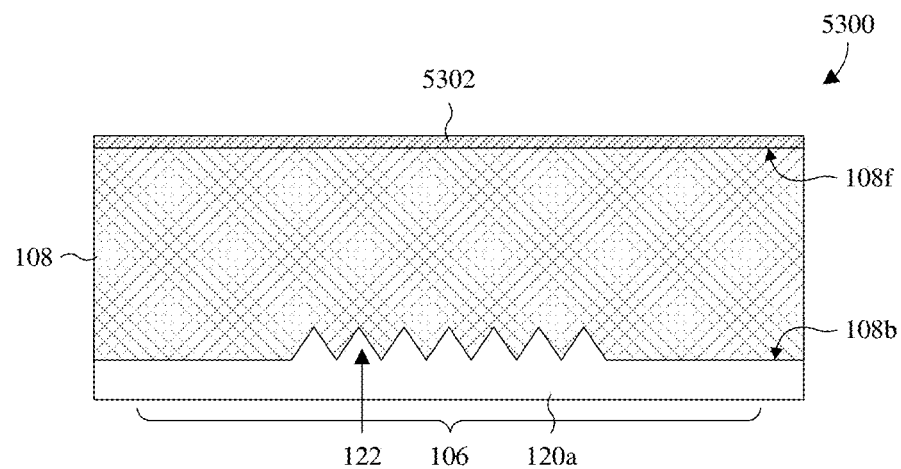
Figure 54:
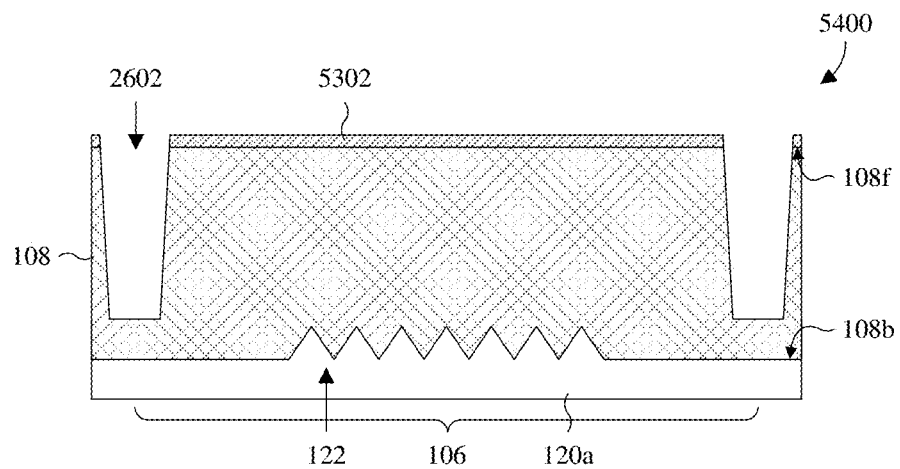
Figure 55A:
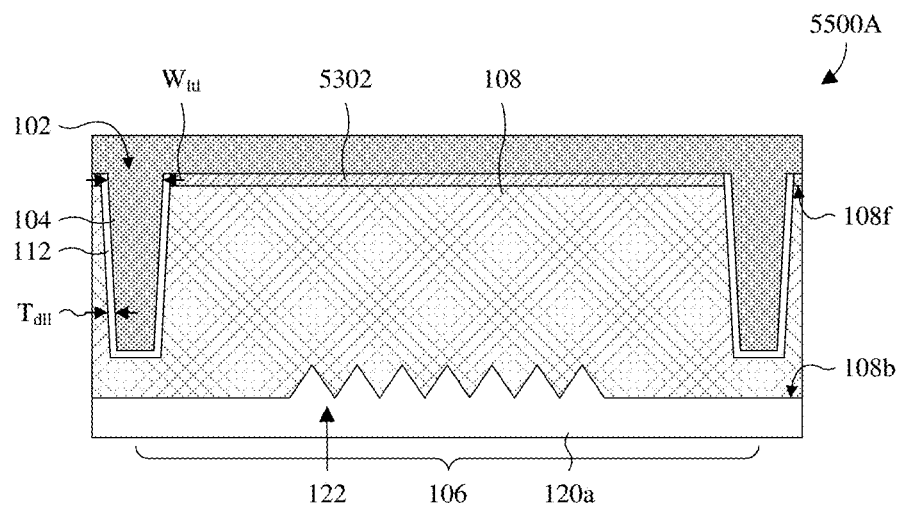
Figure 55B:
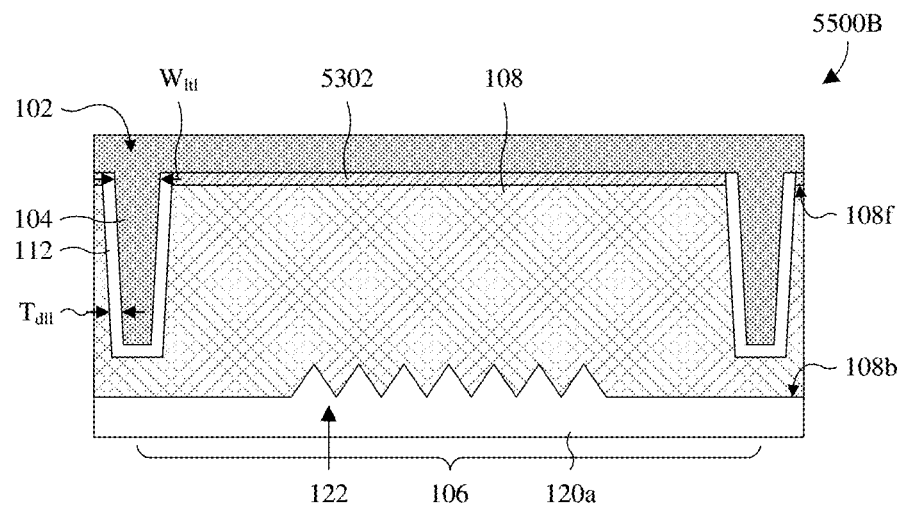
Figure 56:
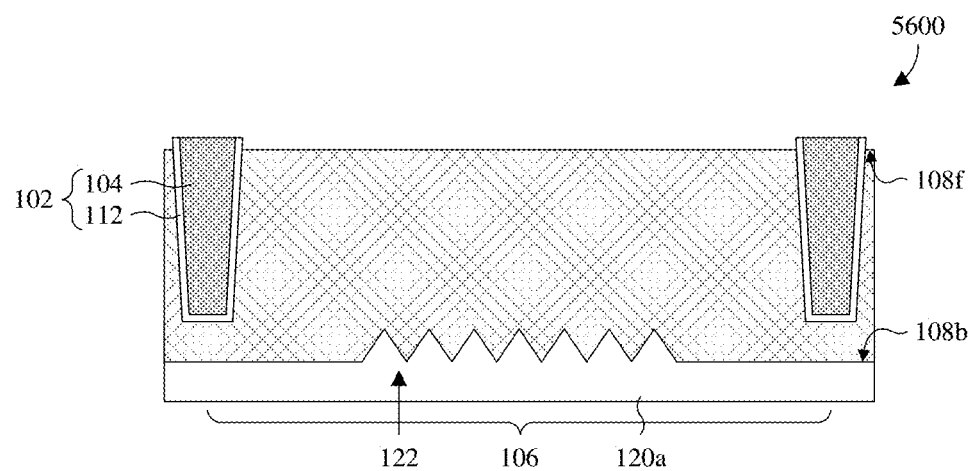

As illustrated by the cross-sectional view 5300 of FIG. 53, the substrate 108 is flipped so a front side 108*f* of the substrate 108 overlies the back side 108*b* of the substrate 108. Further, a mask layer 5302 is deposited covering the front side 108*f* of the substrate 108. The mask layer 5302 may, for example, be or comprise silicon oxide, silicon nitride, some other suitable dielectric(s), or any combination of the foregoing.

As illustrated by the cross-sectional views 5400, 5500A, 5500B, 5600 of FIGS. 54, 55A, 55B, and 56, the acts at FIGS. 26, 27A, 27B, and 28 are performed. At FIG. 54, the mask layer 5302 and the substrate 108 are patterned to define an inter-pixel isolation trench 2602 as described with regard to FIG. 26. At FIGS. 55A and 55B, a dielectric liner layer 112 and a low-transmission layer 104 are deposited filling the inter-pixel isolation trench 2602 (see, e.g., FIG. 54) as respectively described with regard to FIGS. 27A and 27B. Collectively, the low-transmission layer 104 and the dielectric liner layer 112 define an inter-pixel trench isolation structure 102. At FIG. 56, a top surface of the low-transmission layer 104 is recessed to uncover the mask layer 5302 as described with regard to FIG. 28. Further, at FIG. 56, the mask layer 5302 is removed. In alternative embodiments, the mask layer 5302 persists after the acts at FIG. 56.

Figure 57:
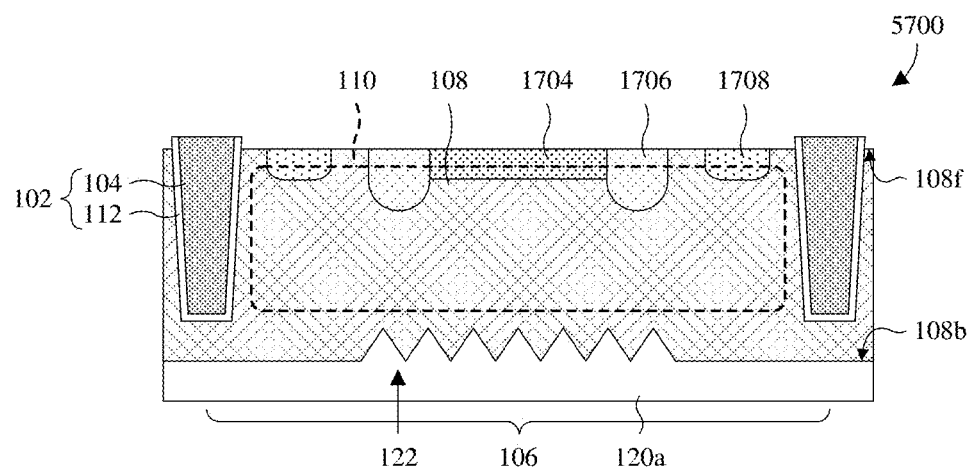

As illustrated by the cross-sectional view 5700 of FIG. 57, a photodetector 110 is formed in the substrate 108 surrounded by the inter-pixel trench isolation structure 102. The photodetector 110 may, for example, be formed as described with regard to FIG. 21.

Figure 58:
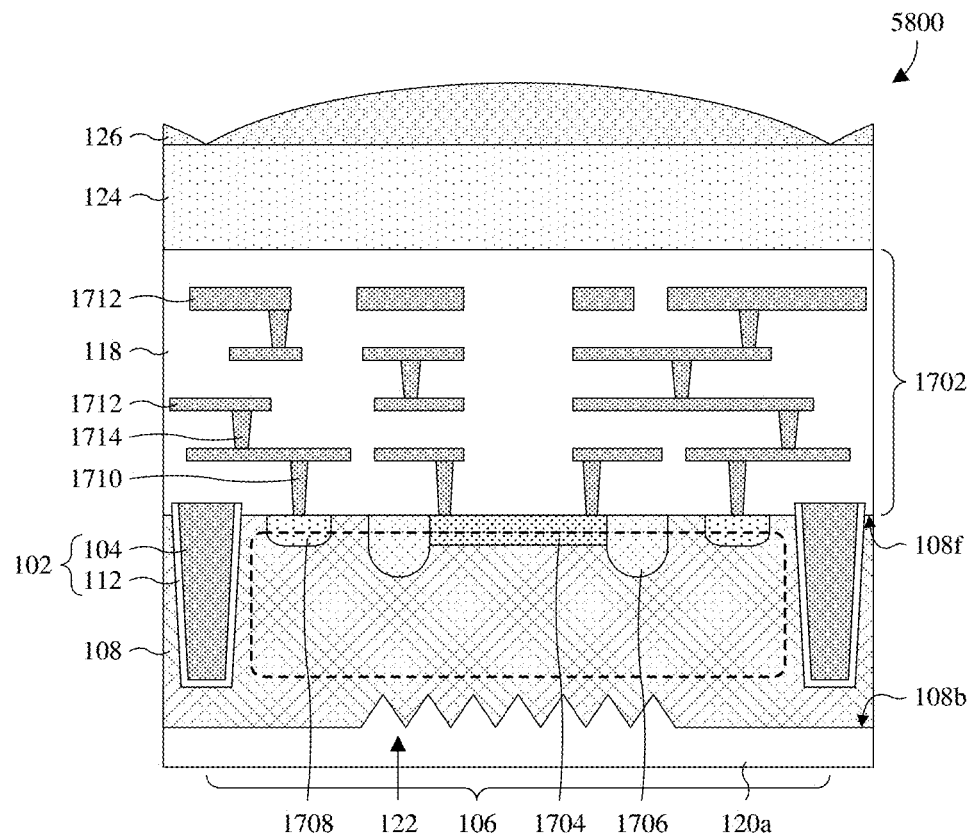

As illustrated by the cross-sectional view 5800 of FIG. 58, a front side dielectric structure 118 is formed covering the photodetector 110 and the inter-pixel trench isolation structure 102 on the front side 108*f* of the substrate 108. Further, an interconnect structure 1702 is formed covering and electrically coupled to the photodetector 110 while forming the front side dielectric structure 118. The interconnect structure 1702 comprises a plurality of contacts 1710, a plurality of wires 1712, and a plurality of vias 1714 stacked in the front side dielectric structure 118.

Also illustrated by the cross-sectional view 5800 of FIG. 58, a spacer layer 124 is deposited over the front side dielectric structure 118 and the interconnect structure 1702. Further, micro lenses 126 are formed over the spacer layer 124. The spacer layer 124 may, for example, be or comprise silicon oxide and/or some other suitable dielectric(s).

While FIGS. 52-54, 55A, 55B, and 56-58 are described with reference to various embodiments of a method, it will be appreciated that the structures shown in FIGS. 52-54, 55A, 55B, and 56-58 are not limited to the method but rather may stand alone separate of the method. While FIGS. 52-54, 55A, 55B, and 56-58 are described as a series of acts, it will be appreciated that the order of the acts may be altered in other embodiments. While FIGS. 52-54, 55A, 55B, and 56-58 illustrate and describe as a specific set of acts, some acts that are illustrated and/or described may be omitted in other embodiments. Further, acts that are not illustrated and/or described may be included in other embodiments.

Figure 59:
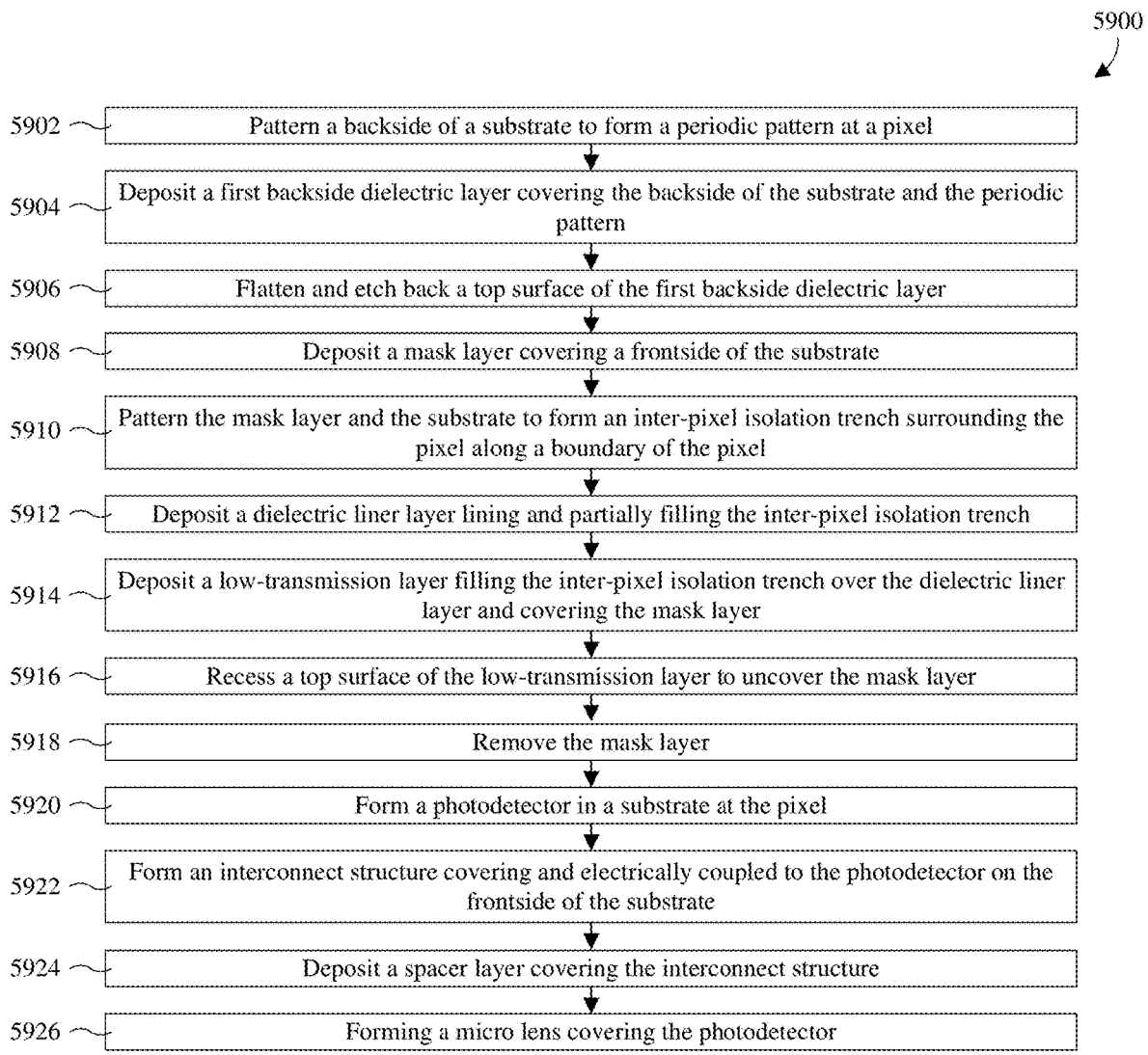
FIG. 59 illustrates a block diagram of some embodiments of the method of FIGS. 52-54, 55A, 55B, and 56-58.

With reference to FIG. 59, a block diagram 5900 of some embodiments of the method of FIGS. 52-54, 55A, 55B, and 56-58 is provided.

At 5902, a back side of a substrate is patterned to form a periodic pattern at a pixel. See, for example, FIGS. 52 and 23.

At 5904, a first back side dielectric layer is deposited covering the back side of the substrate and the periodic pattern. See, for example, FIGS. 52 and 24.

At 5906, a top surface of the first back side dielectric layer is flattened and etched back. See, for example, FIGS. 52 and 25.

At 5908, a mask layer is deposited covering a front side of the substrate. See, for example, FIG. 53.

At 5910, the mask layer and the substrate are patterned to form an inter-pixel isolation trench surrounding the pixel along a boundary of the pixel. See, for example, FIG. 54.

At 5912, a dielectric liner layer is deposited lining and partially filling the inter-pixel isolation trench. See, for example, FIGS. 55A and 55B.

At 5914, a low-transmission layer is deposited filling the inter-pixel isolation trench over the dielectric liner layer and covering the mask layer. See, for example, FIGS. 55A and 55B.

At 5916, a top surface of the low-transmission layer is recessed to uncover the mask layer. See, for example, FIG. 56.

At 5918, the mask layer is removed. See, for example, FIG. 56.

At 5920, a photodetector is formed in the substrate at the pixel. See, for example, FIG. 57.

At 5922, an interconnect structure is formed covering and electrically coupled to the photodetector on the front side of the substrate. See, for example, FIG. 58.

At 5924, a spacer layer is deposited covering the interconnect structure. See, for example, FIG. 58.

At 5926, a micro lens is formed covering the photodetector. See, for example, FIG. 58.

While the block diagram 5900 of FIG. 59 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an image sensor including: a substrate; a pixel including a photodetector, wherein the photodetector is in the substrate; and an outer trench isolation structure extending into the substrate, wherein the outer trench isolation structure has a pair of outer isolation segments respectively on opposite sides of the photodetector at a boundary of the pixel, wherein the outer trench isolation structure includes a low-transmission layer, and wherein the low-transmission layer blocks incident radiation regardless of incident angle. In some embodiments, the low-transmission layer is metal and is reflective of the incident radiation. In some embodiments, the low-transmission layer is metal and is absorptive of the incident radiation. In some embodiments, the outer trench isolation structure includes a dielectric liner layer separating the low-transmission layer from the substrate, wherein the dielectric liner layer has a lower refractive index than the substrate. In some embodiments, a thickness of the dielectric liner layer is greater than about 100 nanometers. In some embodiments, the image sensor further includes an inner trench isolation structure including a pair of inner isolation segments respectively on the opposite sides of the photodetector, wherein the inner trench isolation structure is between the outer isolation segments and includes a dielectric having a lower refractive index than the substrate. In some embodiments, the outer trench isolations structure extends in a closed path along the boundary of the pixel to completely surround the pixel. In some embodiments, the low-transmission layer has optical transmission less than about 10%.

In some embodiments, the present disclosure provides another image sensor including: a substrate; an array of pixels in a plurality of rows and a plurality of columns on the substrate, wherein the pixels include individual photodetectors in the substrate; and an inter-pixel trench isolation structure in the substrate, wherein the inter-pixel trench isolation structure extends along boundaries of the pixels, and individually surrounds the pixels, to separate the pixels from each other, and wherein the inter-pixel trench isolation structure includes a metal layer. In some embodiments, the metal layer includes copper and/or aluminum. In some embodiments, the metal layer includes tungsten, titanium nitride, tantalum nitride, or any combination of the foregoing. In some embodiments, the inter-pixel trench isolation structure is configured to reflect radiation incident on a sidewall of the inter-pixel trench isolation structure at any angle. In some embodiments, the image sensor further includes an intra-pixel trench isolation structure including a plurality of ring-shaped trench isolation segments, wherein the ring-shaped trench isolation segments are individual to the pixels and are surrounded by the inter-pixel trench isolation structure at the individual pixels. In some embodiments, the intra-pixel trench isolation structure is configured to reflect radiation incident on a sidewall of the intra-pixel trench isolation structure at an angle greater than about 20 degrees, but not less than about 20 degrees.

In some embodiments, the present disclosure provides a method for forming an image sensor, the method including: forming a pixel on a substrate and including a photodetector in the substrate; patterning the substrate to form an outer trench, wherein the outer trench surrounds the photodetector along a boundary of the pixel and has a pair of outer isolation segments respectively on opposite sides of the photodetector; and depositing a low-transmission layer covering the substrate and filling the outer trench, wherein the low-transmission layer blocks incident radiation regardless of incident angle. In some embodiments, the method includes recessing a top surface of the low-transmission layer to localize the low-transmission layer to the outer trench. incident radiation regardless of incident angle. In some embodiments, the method includes depositing a dielectric liner layer lining the outer trench, wherein the low-transmission layer is deposited over the dielectric liner layer. incident radiation regardless of incident angle. In some embodiments, the method includes the dielectric liner layer is configured for TR at a sidewall of the dielectric liner layer in the outer trench. In some embodiments, the method further includes: patterning the substrate to form an inner trench, wherein the inner trench has a pair of inner isolation segments respectively on the opposite sides of the photodetector, and wherein the outer trench surrounds the inner trench; and depositing a dielectric layer filling the inner trench before the patterning to form the outer trench. In some embodiments, the method further includes: patterning the substrate to form a periodic structure overlying the photodetector; depositing a dielectric layer covering the substrate and having a bottom surface conforming to the periodic structure, wherein the dielectric layer has a higher refractive index than the substrate; and flattening a top surface of the dielectric layer before the patterning to form the outer trench.

In some embodiments, the present disclosure provides another method for forming an image sensor, the method including: forming a pixel including a photodetector in a substrate; patterning the substrate to form an inner trench, wherein the inner trench has a pair of inner trench segments between which the photodetector is sandwiched; forming a dielectric layer filling the inner trench; patterning the substrate and the dielectric layer to form an outer trench, wherein the outer trench surrounds the photodetector along a boundary of the pixel and has a pair of outer trench segments respectively on opposite sides of the photodetector and between which the inner trench segments are sandwiched; depositing a low-transmission layer covering the substrate and filling the outer trench, wherein the low-transmission layer blocks incident radiation regardless of incident angle; and performing a planarization into the low-transmission layer, wherein a top surface of the low-transmission layer is level with a top surface of the dielectric layer and is elevated relative to a top surface of the substrate upon completion of the planarization. In some embodiments, the method further includes depositing a dielectric liner layer lining the outer trench, wherein the low-transmission layer is deposited over the dielectric liner layer. In some embodiments, the dielectric liner layer is configured for total internal reflection at a sidewall of the dielectric liner layer in the outer trench. In some embodiments, the low-transmission layer has a transmission that is low compared to that of the dielectric liner layer. In some embodiments, the planarization is further performed into the dielectric liner layer, wherein a top surface of the dielectric liner layer is level with the top surface of the dielectric layer and the top surface of the low-transmission layer upon completion of the planarization. In some embodiments, the method further includes: patterning the substrate to form a periodic structure overlying the photodetector, wherein the dielectric layer is further formed covering the substrate and having a bottom surface conforming to the periodic structure, and wherein the dielectric layer has a higher refractive index than the substrate; and flattening the top surface of the dielectric layer before the patterning to form the outer trench. In some embodiments, the photodetector includes a first contact region, a pair of second contact regions, and a guard ring in the substrate, wherein the first contact region has a first doping type, wherein the pair of second contact regions have a second doping type opposite the first doping type and are respectively on opposite sides of the first contact region, wherein the guard ring separates the first contact region from the second contact regions, wherein the periodic structure has a width beginning at a first location and ending at a second location, and wherein the first and second locations respectively and directly overlie the second contact regions.

In some embodiments, the present disclosure provides another method for forming an image sensor, the method including: forming a pixel including a photodetector in a substrate; performing a first etch into the substrate to form a recess with a saw-toothed profile overlying the photodetector; performing a second etch into the substrate to form a first trench, wherein the first trench extends in a first closed path to surround the pixel; depositing a dielectric layer filling the recess and the first trench; performing a third etch into the substrate and the dielectric layer to form a second trench, wherein the second trench extends along a boundary of the pixel in a second closed path to surround the first trench; depositing a metal layer covering the substrate and filling the second trench, wherein the metal layer blocks incident radiation; and recessing the metal layer to remove portions of the metal layer outside the second trench, wherein the recessing includes a planarization into the metal layer, and wherein a top surface of the metal layer is level with a top surface of the dielectric layer and is elevated relative to a top surface of the substrate upon completion of the planarization; wherein a height of the first trench is substantially equal to a height of the substrate. In some embodiments, the height of the first trench is equal to the height of the substrate. In some embodiments, the substrate includes silicon, wherein the metal layer directly contacts silicon of the substrate in the second trench. In some embodiments, the method further includes forming an interconnect structure covering and electrically coupled to the pixel, wherein the interconnect structure is on a frontside of the substrate; wherein the third etch is performed into a backside of the substrate, opposite the frontside of the substrate. In some embodiments, the metal layer is absorptive of the incident radiation. In some embodiments, the first trench has a pair of first trench segments between which the photodetector is sandwiched, wherein the second trench has a pair of second trench segments respectively on opposite sides of the photodetector and between which the first trench segments are sandwiched. In some embodiments, the dielectric layer has a higher refractive index than the substrate and directly contacts the substrate in the first trench.

In some embodiments, the present disclosure provides another A method for forming an image sensor, the method including: forming a pixel including a photodetector in a substrate; patterning the substrate to form a first trench surrounding the photodetector with a pair of first-trench segments between which the photodetector is sandwiched; depositing a dielectric layer filling the first trench and covering the pixel; patterning the substrate to form a second trench surrounding the photodetector with a pair of second-trench segments between which the first-trench segments are sandwiched, wherein the patterning to form the second trench is performed into both the dielectric layer and the substrate; depositing a liner layer lining the second trench; and depositing a metal layer filling the second trench over the liner layer and covering the dielectric layer; wherein the first and second trenches extend through the substrate, from top to bottom, wherein the metal layer is more absorptive of incident radiation than the dielectric layer, and wherein a top surface of the liner layer is level with a top surface of the dielectric layer, and is elevated relative to a top surface of the substrate, upon completion of the depositing of the liner layer. In some embodiments, the dielectric layer has a higher refractive index than the substrate and directly contacts the substrate in the first trench. In some embodiments, the method further includes: patterning the substrate to form a diffuser structure overlying the photodetector, wherein the dielectric layer is further deposited covering the diffuser structure; and planarizing the dielectric layer to flatten a surface of the dielectric layer facing away from the substrate. In some embodiments, the method further includes performing a planarization into the metal layer, wherein a top surface of the metal layer is level with the top surface of the dielectric layer, and is elevated relative to the top surface of the substrate, upon completion of the planarization. In some embodiments, the method further includes depositing a second dielectric layer covering and directly contacting the top surface of the dielectric layer, a top surface of the metal layer, and the top surface of the liner layer, wherein the second dielectric layer has a planar profile along an entire width of the pixel. In some embodiments, a height of the dielectric layer is equal to a combined height of the metal layer and the liner layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:
    forming a pixel comprising a photodetector in a substrate;
    patterning the substrate to form an inner trench, wherein the inner trench has a pair of inner trench segments between which the photodetector is sandwiched;
    forming a dielectric layer filling the inner trench;
    patterning the substrate and the dielectric layer to form an outer trench, wherein the outer trench surrounds the photodetector along a boundary of the pixel and has a pair of outer trench segments respectively on opposite sides of the photodetector and between which the inner trench segments are sandwiched;
    depositing a low-transmission layer covering the substrate and filling the outer trench, wherein the low-transmission layer blocks incident radiation regardless of incident angle; and
    performing a planarization into the low-transmission layer, wherein a top surface of the low-transmission layer is level with a top surface of the dielectric layer and is elevated relative to a top surface of the substrate upon completion of the planarization.

2. The method according to claim 1, further comprising:
    depositing a dielectric liner layer lining the outer trench, wherein the low-transmission layer is deposited over the dielectric liner layer.

3. The method according to claim 2, wherein the dielectric liner layer is configured for total internal reflection at a sidewall of the dielectric liner layer in the outer trench.

4. The method according to claim 2, wherein the low-transmission layer has a transmission that is low compared to that of the dielectric liner layer.

5. The method according to claim 2, wherein the planarization is further performed into the dielectric liner layer, and wherein a top surface of the dielectric liner layer is level with the top surface of the dielectric layer and the top surface of the low-transmission layer upon completion of the planarization.

6. The method according to claim 1, further comprising:
    patterning the substrate to form a periodic structure overlying the photodetector, wherein the dielectric layer is further formed covering the substrate and having a bottom surface conforming to the periodic structure, and wherein the dielectric layer has a higher refractive index than the substrate; and
    flattening the top surface of the dielectric layer before the patterning to form the outer trench.

7. The method according to claim 6, wherein the photodetector comprises a first contact region, a pair of second contact regions, and a guard ring in the substrate, wherein the first contact region has a first doping type, wherein the pair of second contact regions have a second doping type opposite the first doping type and are respectively on opposite sides of the first contact region, wherein the guard ring separates the first contact region from the second contact regions, wherein the periodic structure has a width beginning at a first location and ending at a second location, and wherein the first and second locations respectively and directly overlie the second contact regions.

8. A method for forming an image sensor, the method comprising:
    forming a pixel comprising a photodetector in a substrate;
    performing a first etch into the substrate to form a recess with a saw-toothed profile overlying the photodetector;
    performing a second etch into the substrate to form a first trench, wherein the first trench extends in a first closed path to surround the pixel;
    depositing a dielectric layer filling the recess and the first trench;
    performing a third etch into the substrate and the dielectric layer to form a second trench, wherein the second trench extends along a boundary of the pixel in a second closed path to surround the first trench;
    depositing a metal layer covering the substrate and filling the second trench, wherein the metal layer blocks incident radiation; and
    recessing the metal layer to remove portions of the metal layer outside the second trench, wherein the recessing comprises a planarization into the metal layer, and wherein a top surface of the metal layer is level with a top surface of the dielectric layer and is elevated relative to a top surface of the substrate upon completion of the planarization;
    wherein a height of the first trench is substantially equal to a height of the substrate.

9. The method according to claim 8, wherein the height of the first trench is equal to the height of the substrate.

10. The method according to claim 8, wherein the substrate comprises silicon, and wherein the metal layer directly contacts silicon of the substrate in the second trench.

11. The method according to claim 8, further comprising:
    forming an interconnect structure covering and electrically coupled to the pixel, wherein the interconnect structure is on a frontside of the substrate;
    wherein the third etch is performed into a backside of the substrate, opposite the frontside of the substrate.

12. The method according to claim 8, wherein the metal layer is absorptive of the incident radiation.

13. The method according to claim 8, wherein the first trench has a pair of first trench segments between which the photodetector is sandwiched, and wherein the second trench has a pair of second trench segments respectively on opposite sides of the photodetector and between which the first trench segments are sandwiched.

14. The method according to claim 8, wherein the dielectric layer has a higher refractive index than the substrate and directly contacts the substrate in the first trench.

15. A method for forming an image sensor, the method comprising:
    forming a pixel comprising a photodetector in a substrate;
    patterning the substrate to form a first trench surrounding the photodetector with a pair of first-trench segments between which the photodetector is sandwiched;
    depositing a dielectric layer filling the first trench and covering the pixel;
    patterning the substrate to form a second trench surrounding the photodetector with a pair of second-trench segments between which the first-trench segments are sandwiched, wherein the patterning to form the second trench is performed into both the dielectric layer and the substrate;

depositing a liner layer lining the second trench; and depositing a metal layer filling the second trench over the liner layer and covering the dielectric layer;

wherein the first and second trenches extend through the substrate, from top to bottom, wherein the metal layer is more absorptive of incident radiation than the dielectric layer, and wherein a top surface of the liner layer is level with a top surface of the dielectric layer, and is elevated relative to a top surface of the substrate, upon completion of the depositing of the liner layer.

16. The method according to claim 15, wherein the dielectric layer has a higher refractive index than the substrate and directly contacts the substrate in the first trench.

17. The method according to claim 15, further comprising:

patterning the substrate to form a diffuser structure overlying the photodetector, wherein the dielectric layer is further deposited covering the diffuser structure; and planarizing the dielectric layer to flatten a surface of the dielectric layer facing away from the substrate.

18. The method according to claim 15, further comprising:

performing a planarization into the metal layer, wherein a top surface of the metal layer is level with the top surface of the dielectric layer, and is elevated relative to the top surface of the substrate, upon completion of the planarization.

19. The method according to claim 15, further comprising:

depositing a second dielectric layer covering and directly contacting the top surface of the dielectric layer, a top surface of the metal layer, and the top surface of the liner layer, wherein the second dielectric layer has a planar profile along an entire width of the pixel.

20. The method according to claim 15, wherein a height of the dielectric layer is equal to a combined height of the metal layer and the liner layer.

* * * * *